US007396685B2

(12) United States Patent
Szyperski et al.

(10) Patent No.: US 7,396,685 B2
(45) Date of Patent: Jul. 8, 2008

(54) PHASE SENSITIVELY-DETECTED REDUCED DIMENSIONALITY NUCLEAR MAGNETIC RESONANCE SPECTROSCOPY FOR RAPID CHEMICAL SHIFT ASSIGNMENT AND SECONDARY STRUCTURE DETERMINATION OF PROTEINS

(75) Inventors: Thomas A. Szyperski, Amherst, NY (US); Seho Kim, Highland Park, NJ (US)

(73) Assignee: The Research Foundation of State University of New York, Amherst, NY (US)

( * ) Notice: Subject to any disclaimer, the term of this patent is extended or adjusted under 35 U.S.C. 154(b) by 678 days.

(21) Appl. No.: 10/628,818

(22) Filed: Jul. 28, 2003

(65) Prior Publication Data

US 2004/0095140 A1 May 20, 2004

Related U.S. Application Data

(60) Provisional application No. 60/399,332, filed on Jul. 26, 2002.

(51) Int. Cl.
 *G01N 24/00* (2006.01)
(52) U.S. Cl. .................................................. 436/173
(58) Field of Classification Search ........................ None
 See application file for complete search history.

(56) References Cited

OTHER PUBLICATIONS

Fernández et al., "NMR with $^{13}$C, $^{15}$N-Doubly-Labeled DNA: The *Antennapedia* Homeodomain Complex with a 14-mer DNA Duplex," *Journal of Biomolecular NMR* 12:25-37 (1998).

Gehring et al., "H(C)CH-COSY and (H)CCH-COSY Experiments for $^{13}$C-Labeled Proteins in H$_2$O Solution," *Journal of Magnetic Resonance* 135:185-193 (1998).

Yamazaki et al., "Two-Dimensional NMR Experiments for Correlating $^{13}$Cβ and $^1$Hδ/ε Chemical Shifts of Aromatic Residues in $^{13}$C-Labeled Proteins via Scalar Couplings," *J. Am. Chem. Soc.* 115:11054-11055 (1993).

Shirra, "Three Dimensional NMR Spectroscopy," http://www.cryst.bbk.ac.uk/PPS2/projects/schirra/html/3dnmr.htm (1996).

(Continued)

*Primary Examiner*—Yelena G Gakh
(74) *Attorney, Agent, or Firm*—Nixon Peabody LLP

(57) ABSTRACT

The present invention discloses eleven reduced dimensionality (RD) triple resonance nuclear magnetic resonance (NMR) experiments for measuring chemical shift values of certain nuclei in a protein molecule, where the chemical shift values encoded in a peak pair of an NMR spectrum are detected in a phase sensitive manner. The RD 3D H̲A,CA,(CO),N,HN NMR and RD 3D H,C,(C-TOCSY-CO),N̲,H̲N̲ NMR experiments are designed to yield "sequential" connectivities, while the RD 3D H$^{α/β}$,C$^{α/β}$,CO,HA NMR and RD 3D H$^{α/β}$, C$^{α/β}$,N,HN NMR experiments provide "intraresidue" connectivities. The RD 3D H̲,C,C,H-COSY NMR, RD 3D H̲, C,C,H-TOCSY NMR, and RD 2D H̲,C,H-COSY NMR experiments allow one to obtain assignments for aliphatic and aromatic side chain chemical shifts, while the RD 2D HB̲, CB,(CG,CD),HD NMR experiment provide information for the aromatic side chain chemical shifts. In addition, methods of conducting suites of RD triple resonance NMR experiments for high-throughput resonance assignment of proteins and determination of secondary structure elements are disclosed.

40 Claims, 28 Drawing Sheets

OTHER PUBLICATIONS

Pang et al., "High-Resolution Detection of Five Frequencies in a Single 3D Spectrum: HNHCACO—A Bidirectional Coherence Transfer Experiment," *Journal of Biomolecular NMR* 11:185-1990 (1998).

Gardner et al., "The Use of $^2$H, $^{13}$C, $^{15}$N Multidimensional NMR to Study the Structure and Dynamics of Proteins," *Annu. Rev. Biophys. Biomol. Struct.* 27:357-406 (1998).

Sattler et al., "Triple Resonance Pulse Programs for $^{13}$C, $^{15}$N Labeled Proteins," http://www/embl-heidelberg.de/nmr/sattler/PP/pulseprograms.html (2001).

Tugarinov et al., "Four-Dimensional NMR Spectroscopy of a 723-Residue Protein: Chemical Shift Assignments and Secondary Structure of Malate Synthase G," *J. Am. Chem. Soc.* 124:10025-10035 (2002).

Kennedy et al., "Role for NMR in Structural Genomics," *Journal of Structural and Functional Genomics* 2:155-169 (2002).

Szyperski et al., "Reduced Dimensionality in Triple-Resonance NMR Experiments," *J. Am. Chem. Soc.*, 115:9307-9308 (1993).

Szyperski et al., "3D $^{13}$C-$^{15}$N-Heteronuclear Two-Spin Coherence Spectroscopy for Polypeptide Backbone Assignments in $^{13}$C-$^{15}$N-Double-Labeled Proteins," *J. Biomol. NMR*, 3:127-132 (1993).

Szyperski et al., "3D H$^{\alpha/\beta}$C$^{\alpha/\beta}$(CO)NHN, a Projected 4D NMR Experiment for Sequential Correlation of Polypeptide $^1$H$^{\alpha/\beta}$, $^{13}$C$^{\alpha/\beta}$ and Backbone $^{15}$N and $^1$H$^N$ Chemical Shifts," *J. Magn. Reson.*, B105:188-191 (1994).

Szyperski et al., "A Novel Reduced-Dimensionality Triple-Resonance Experiment for Efficient Polypeptide Backbone Assignment, 3D CO HN N CA," *J. Magn. Reson.*, B108:197-203 (1995).

Szyperski et al., "Useful Information from Axial Peak Magnetization in Projected NMR Experiments," *J. Am. Chem. Soc.*, 118:8146-8147 (1996).

Szyperski et al., "Two-Dimensional ct-HC(C)H-COSY for Resonance Assignments of Smaller $^{13}$C-Labeled Biomolecules," *J. Magn. Reson.*, 128:228-232 (1997).

Szyperski et al., "Sequential Resonance Assignment of Medium-Sized $^{15}$N/$^{13}$C-Labeled Proteins with Projected 4D Triple Resonance NMR Experiments," *J. Biomol. NMR*, 11:387-405 (1998).

Liu et al., "NMR Experiments for Resonance Assignments of $^{13}$C, $^{15}$N Doubly-Labeled Flexible Polypeptides: Application to Human Prion Protein hPrP(23-230)," *J. Biomol. NMR*, 16:127-138 (2000).

Yamazaki et al., "Assignments of Backbone $^1$H, $^{13}$C, and $^{15}$N Resonances and Secondary Structure of Ribonuclease H from *Escherichia coli* by Heteronuclear Three-Dimensional NMR Spectroscopy," *Biochemistry*, 30:6036-6047 (1991).

Brutscher et al., "Determination of an Initial Set of NOE-Derived Distance Constraints for the Structure Determination of $^{15}$N/$^{13}$C-Labeled Proteins," *J. Magn. Reson.*, B109:238-242 (1995).

Szyperski et al., "Reduced-Dimensionality NMR Spectroscopy For High-Throughput Protein Resonance Assignment," *PNAS*, 99:8009-8014 (2002).

Joint Evolution of $\Omega_x$ and $\Omega_y$ During a Time Period t

$\cos(\Omega_x t) \cos(\Omega_y t) = \cos[(\Omega_x+\Omega_y)t] + \cos[(\Omega_x-\Omega_y)t]$   Data Set   (1)

$\cos(\Omega_x t) \sin(\Omega_y t) = \sin[(\Omega_x+\Omega_y)t] - \sin[(\Omega_x-\Omega_y)t]$   Data Set   (2)

$\sin(\Omega_x t) \cos(\Omega_y t) = \sin[(\Omega_x+\Omega_y)t] + \sin[(\Omega_x-\Omega_y)t]$   Data Set   (3)

$\sin(\Omega_x t) \sin(\Omega_y t) = -\cos[(\Omega_x+\Omega_y)t] + \cos[(\Omega_x-\Omega_y)t]$   Data Set   (4)

(A) Quadrature detection of peaks forming the in-phase peak pair in cosine-modulated RD NMR $\cos[(\Omega_x+\Omega_y)t] + \cos[(\Omega_x-\Omega_y)t]$   (1)
$\sin[(\Omega_x+\Omega_y)t] + \sin[(\Omega_x-\Omega_y)t]$   (3)

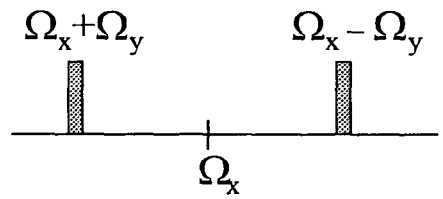

(B) Quadrature detection of peaks forming the anti-phase peak pair in sine-modulated RD NMR $\cos[(\Omega_x+\Omega_y)t] - \cos[(\Omega_x-\Omega_y)t]$   $-$(4)
$\sin[(\Omega_x+\Omega_y)t] - \sin[(\Omega_x-\Omega_y)t]$   (2)

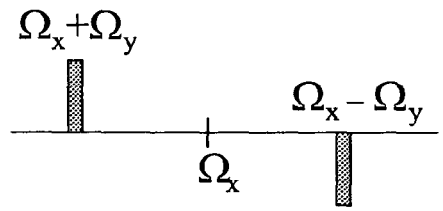

(C) Edited, phase sensitive detection of the peak encoding the sum of the two chemical shifts, $\Omega_x+\Omega_y$ $\cos[(\Omega_x+\Omega_y)t]$   (1) $-$ (4)
$\sin[(\Omega_x+\Omega_y)t]$   (3) $+$ (2)

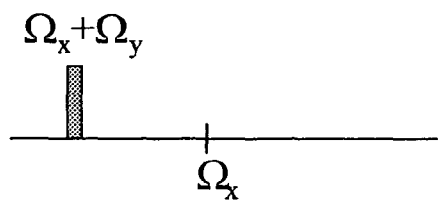

(D) Edited, phase sensitive detection of the peak encoding the difference of the two chemical shifts, $\Omega_x-\Omega_y$ $\cos[(\Omega_x-\Omega_y)t]$   (1) $+$ (4)
$\sin[(\Omega_x-\Omega_y)t]$   (3) $-$ (2)

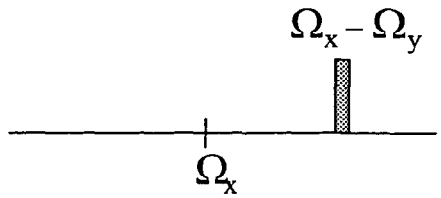

FIGURE 1

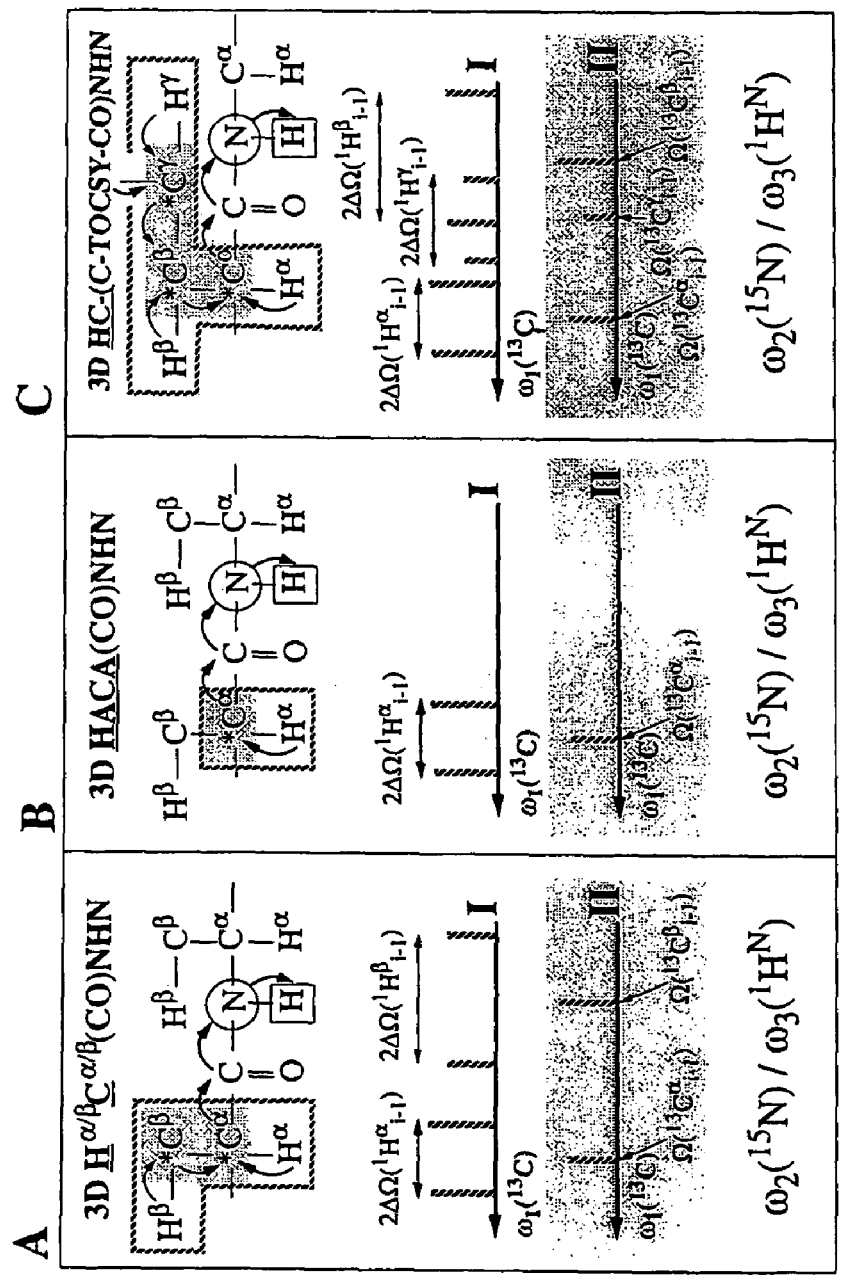
FIGURES 2A-C

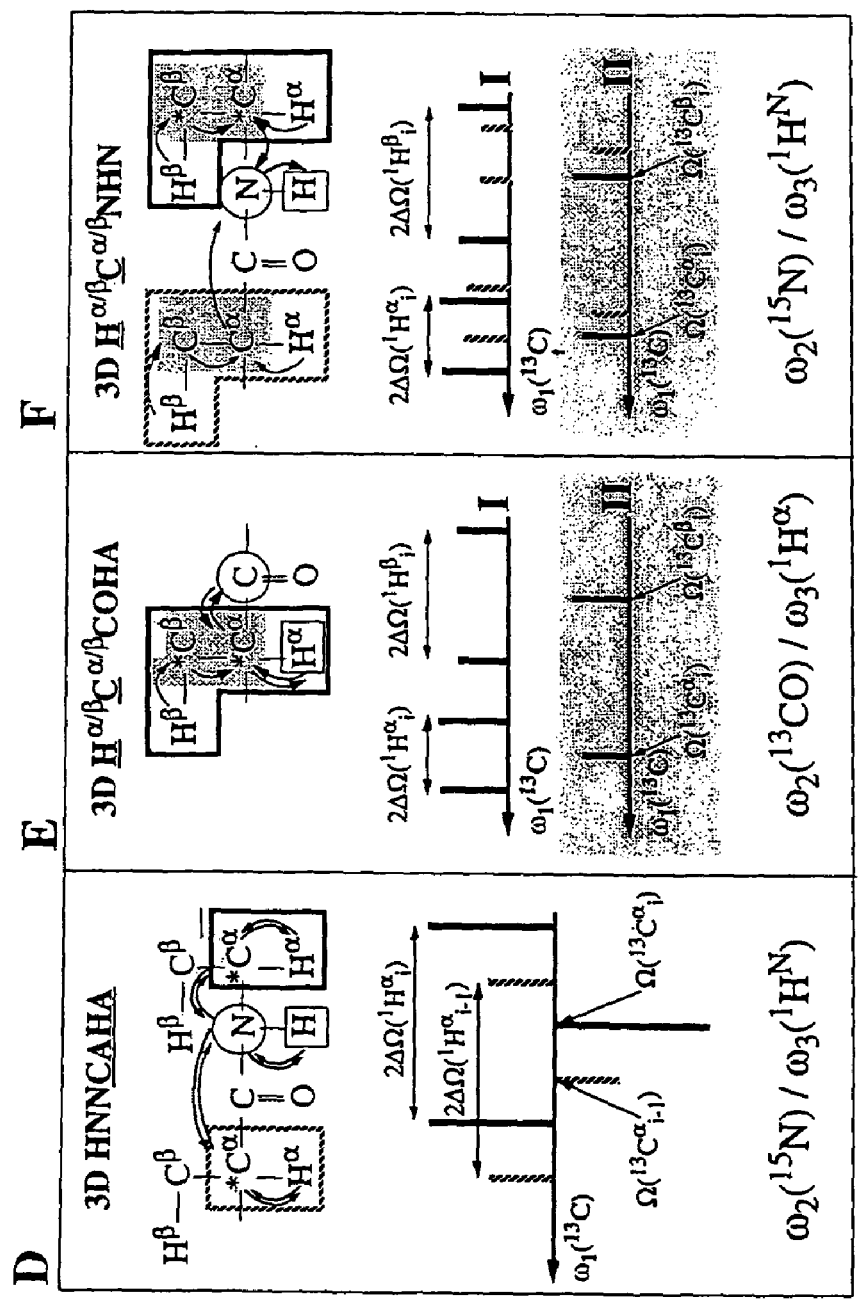
FIGURES 2D-F

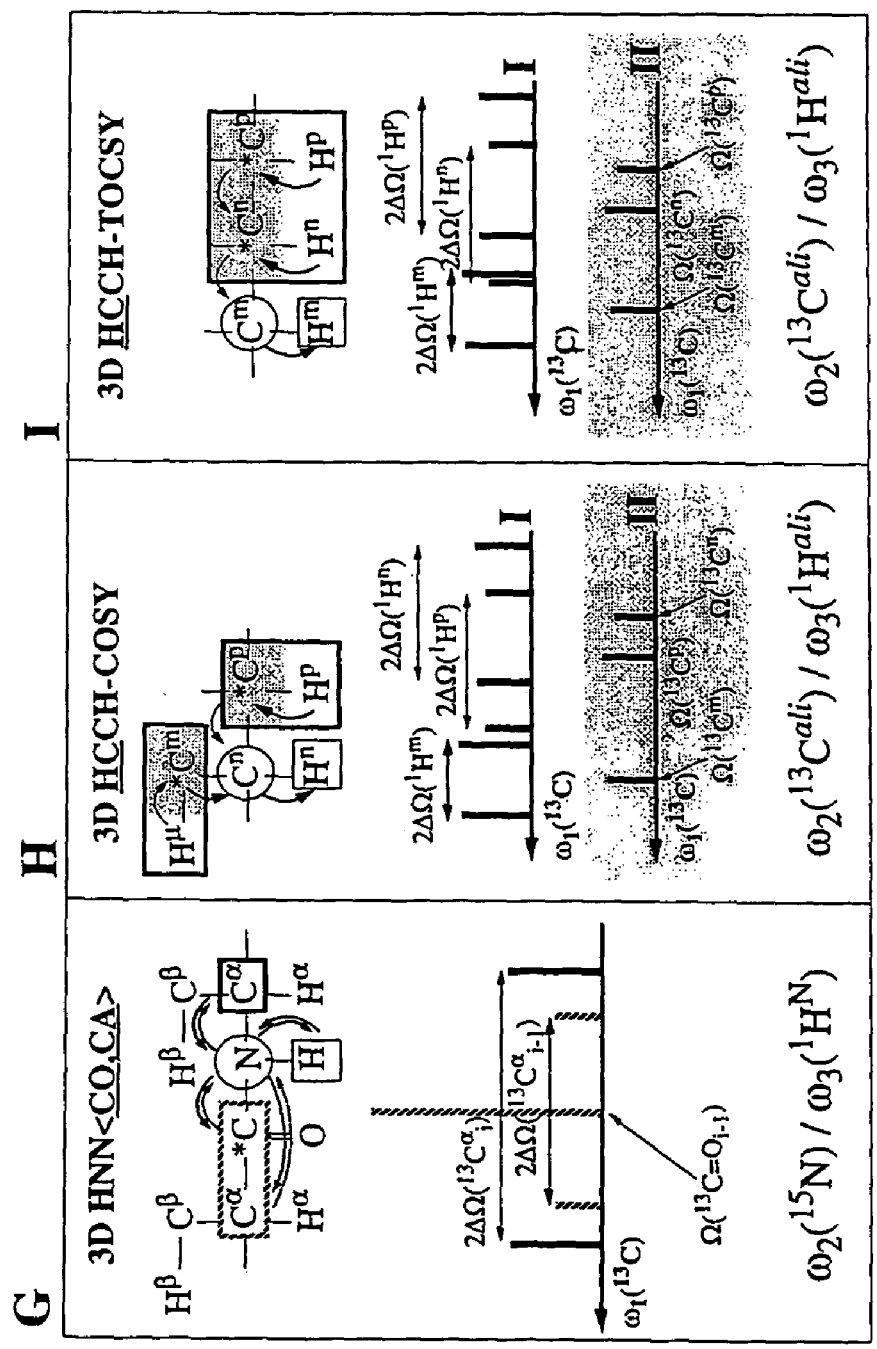
FIGURES 2G-I

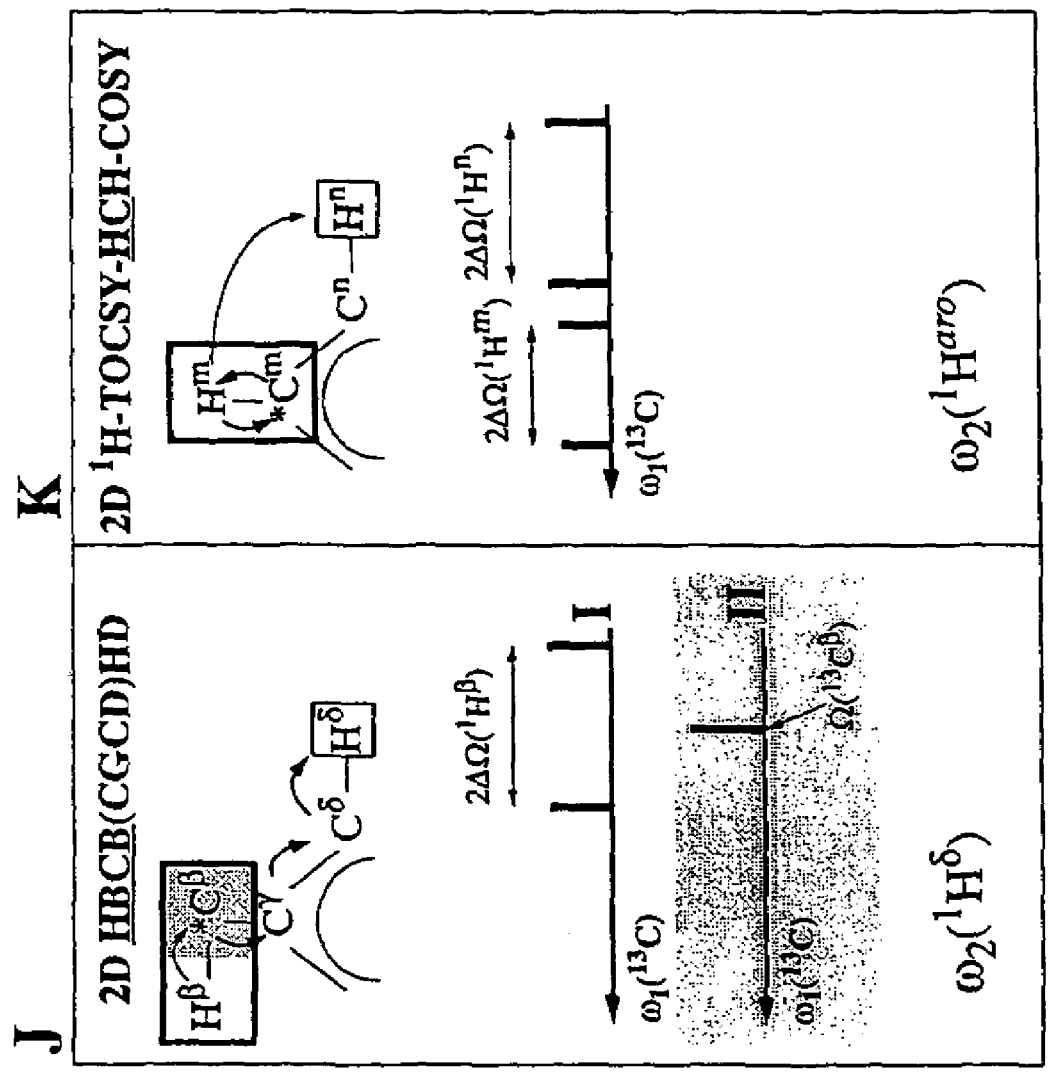
FIGURES 2J-K

PHASE SENSITIVELY-DETECTED REDUCED DIMENSIONALITY NUCLEAR MAGNETIC RESONANCE SPECTROSCOPY FOR RAPID CHEMICAL SHIFT ASSIGNMENT AND SECONDARY STRUCTURE DETERMINATION OF PROTEINS

The present invention claims the benefit of U.S. Provisional Patent Application Ser. No. 60/399,332, filed Jul. 26, 2002, which is hereby incorporated by reference in its entirety.

This invention arose out of research sponsored by the National Science Foundation (Grant No. MCB 0075773) and National Institutes of Health (Grant No. P50 GM62413-01). The U.S. Government may have certain rights in this invention.

FIELD OF THE INVENTION

The present invention relates to methods of using phase sensitively-detected reduced dimensionality nuclear magnetic resonance (NMR) spectroscopy for obtaining chemical shift assignment and for structure determination of proteins.

BACKGROUND OF THE INVENTION

The use of triple resonance (TR) nuclear magnetic resonance (NMR) experiments for the resonance assignment of polypeptide chains via heteronuclear scalar connectivities (Montelione et al., *J. Am Chem. Soc.*, 111:5474-5475 (1989); Montelione et al., *J. Magn. Reson.*, 87:183-188 (1989); Kay et al., *J. Magn. Reson.*, 89:496-514 (1990); Ikura et al., *Biochemistry*, 29:4659-8979 (1990); Edison et al., *Methods Enzymol.*, 239:3-79 (1994)) is a standard approach which neatly complements the assignment protocol based on $^1$H-$^1$H nuclear Overhauser effects (NOE) (Wüthrich, *NMR of Proteins and Nucleic Acids*, Wiley, New York (1986)). In addition, triple resonance NMR spectra are highly amenable to a fast automated analysis (Friedrichs et al., *J. Biomol. NMR*, 4:703-726 (1994); Zimmerman et al., *J. Biomol. NMR*, 4:241-256 (1994); Bartels et al., *J. Biomol. NMR*, 7:207-213 (1996); Morelle et al., *J. Biomol. NMR*, 5:154-160 (1995); Buchler et al., *J. Magn. Reson.*, 125:34-42 (1997); Lukin et al., *J. Biomol. NMR*, 9:151-166 (1997)), yielding the $^{13}C^{\alpha/\beta}$ chemical shifts at an early stage of the assignment procedure. This enables both the identification of regular secondary structure elements without reference to NOEs (Spera et al., *J. Am. Chem. Soc.*, 113: 5490-5491 (1991)) and the derivation of ($\phi,\psi$)-angle constraints which serve to reduce the number of cycles consisting of nuclear Overhauser enhancement spectroscopy (NOESY) peak assignment and structure calculation (Luginbühl et al., *J. Magn. Reson.*, B 109:229-233 (1995)).

NMR assignments are prerequisite for NMR-based structural biology (Wüthrich, *NMR of Proteins and Nucleic Acid*, Wiley:New York (1986)) and, thus, for high-throughput (HTP) structure determination in structural genomics (Rost, *Structure*, 6:259-263 (1998); Montelione et al., *Nature Struct. Biol.*, 6:11-12. (1999); Burley, *Nature Struc Biol.*, 7:932-934 (2000)) and for exploring structure-activity relationships (SAR) by NMR for drug discovery (Shuker et al., *Science*, 274:1531-1534 (1996)). The aims of structural genomics are to (i) explore the naturally occurring "protein fold space" and (ii) contribute to the characterization of function through the assignment of atomic resolution three-dimensional (3D) structures to proteins. It is now generally acknowledged that NMR will play an important role in structural genomics (Montelione et al., *Nature Struc. Biol.*, 7:982-984 (2000)). The resulting demand for HTP structure determination requires fast and automated NMR data collection and analysis protocols (Moseley et al., *Curr. Opin. Struct. Biol.*, 9:635-642 (1999)).

The establishment of a HTP NMR structural genomics pipeline requires two key objectives in data collection. Firstly, the measurement time should be minimized in order to (i) lower the cost per structure and (ii) relax the constraint that NMR samples need to be stable over a long period of measurement time. The recent introduction of commercial cryogenic probes (Styles et al., *J. Magn. Reson.*, 60:397-404 (1984); Flynn et al., *J. Am Chem. Soc.*, 122:4823-4824 (2000)) promises to reduce measurement times by about a factor of ten or more, and will greatly impact the realization of this first objective. Secondly, reliable automated spectral analysis requires recording of a "redundant" set of multidimensional NMR experiments each affording good resolution (which requires appropriately long maximal evolution times in all indirect dimensions). Concomitantly, it is desirable to keep the total number of NMR spectra small in order to minimize "interspectral" variations of chemical shift measurements, which may impede automated spectral analysis. Straightforward consideration of this second objective would suggest increasing the dimensionality of the spectra, preferably by implementing a suite of four- or even higher-dimensional NMR experiments. Importantly, however, the joint realization of the first and second objectives is tightly limited by the rather large lower bounds of higher-dimensional TR NMR measurement times if appropriately long maximal evolution times are chosen.

Hence, "sampling limited" and "sensitivity limited" data collection regimes are distinguished, depending on whether the sampling of the indirect dimensions or the sensitivity of the multidimensional NMR experiments "per se" determines the minimally achievable measurement time. As a matter of fact, the ever increasing performance of NMR spectrometers will soon lead to the situation where, for many protein samples, the sensitivity of the NMR spectrometers do not constitute the prime bottleneck determining minimal measurement times. Instead, the minimal measurement times encountered for recording conventional higher-dimensional NMR schemes will be "sampling limited," particularly as high sensitivity cryoprobes become generally available. As structure determinations of proteins rely on nearly complete assignment of chemical shifts, which are obtained using multidimensional $^{13}$C, $^{15}$N, $^1$H-TR NMR experiments (Montelione et al., *J. Am Chem. Soc.*, 111:5474-5475 (1989); Montelione, et al., *J. Magn. Reson.*, 87:183-188 (1989); Ikura et al., *Biochemistry*, 29:4659-8979 (1990)), the development of TR NMR techniques that avoid the sampling limited regime represents a key challenge for future biomolecular NMR methods development.

Reduced dimensionality (RD) TR NMR experiments (Szyperski et al., *J. Biomol. NMR*, 3:127-132 (1993); Szyperski et al., *J. Am. Chem. Soc.*, 115:9307-9308 (1993); Szyperski et al., *J. Magn. Reson.*, B 105:188-191 (1994); Brutscher et al., *J. Magn. Reson.*, B 105:77-82 (1994); Szyperski et al., *J. Magn. Reson.*, B 108: 197-203 (1995); Brutscher et al., *J. Biomol. NMR*, 5:202-206 (1995); Löhr et al., *J. Biomol. NMR*, 6:189-197 (1995); Szyperski et al., *J. Am. Chem. Soc.*, 118: 8146-8147 (1996); Szyperski et al., *J. Magn. Reson.*, 28:228-232 (1997); Bracken et al., *J. Biomol. NMR*, 9:94-100 (1997); Sklenar et al., *J. Magn. Reson.*, 130:119-124 (1998); Szyperski et al., *J. Biomol. NMR*, 11:387-405 (1998)), designed for simultaneous frequency labeling of two spin types in a single indirect dimension, offer a viable strategy to circumvent recording NMR spectra in a sampling limited fashion. RD NMR is based on a projection technique for reducing the spectral dimensionality of TR experiments: the chemical shifts of the projected dimension give rise to a cosine-modulation of the transfer amplitude, yielding in-phase peak pairs encoding n chemical shifts in a n-1 dimensional spectrum (Szyperski et al., *J. Biomol. NMR*, 3:127-132 (1993); Szyperski et al., *J. Am. Chem. Soc.*, 115:9307-9308 (1993)). As a key result, this allows recording projected four-dimensional (4D) NMR experiments with maximal evolution times typically achieved in the corresponding conventional 3D NMR experiments (Szyperski et al., *J. Biomol. NMR*, 3:127-132 (1993); Szyperski et al., *J. Am. Chem. Soc.*, 115:9307-9308 (1993); Szyperski et al., *J. Mann. Reson.* B 105:188-191 (1994); Szyperski et al., *J. Magn. Reson.*, B 108: 197-203 (1995); Szyperski et al., *J. Am. Chem. Soc.*, 118:8146-8147 (1996); Szyperski et al., *J. Magn. Reson.*, 28:228-232 (1997); Bracken et al., *J. Biomol. NMR*, 9:94-100 (1997); Sklenar et al., *J. Magn. Reson.*, 130:119-124 (1998); Szyperski et al., *J. Biomol. NMR*, 11:387-405 (1998)). Furthermore, axial coherences, arising from either incomplete insensitive nuclei enhanced by polarization transfer (INEPT) or heteronuclear magnetization, can be observed as peaks located at the center of the in-phase peak pairs (Szyperski et al., *J. Am. Chem. Soc.*, 118:8146-8147 (1996)). This allows both the unambiguous assignment of multiple doublets with degenerate chemical shifts in the other dimensions and the identification of peak pairs by symmetrization of spectral strips about the position of the central peak (Szyperski et al., *J. Am. Chem. Soc.*, 118:8146-8147 (1996); Szyperski et al., *J. Biomol. NMR*, 11:387-405 (1998)). Hence, observation of central peaks not only restores the dispersion of the parent, higher-dimensional experiment, but also provides access to reservoir of axial peak magnetization (Szyperski et al., *J. Am. Chem. Soc.*, 118:8146-8147 (1996)). Historically, RD NMR experiments were first designed to simultaneously recruit both $^1$H and heteronuclear magnetization (Szyperski et al., *J. Am. Chem. Soc.*, 118:8146-8147 (1996)) for signal detection, a feature that has also gained interest for improving transverse relaxation-optimized spectroscopy (TROSY) pulse schemes (Pervushin et al., *Proc. Natl. Acad. Sci. USA*, 94:12366-12371 (1997); Salzmann et al., *J. Am. Chem. Soc.*, 121:844-848 (1999); Pervushin et al., *J. Biomol. NMR*, 12:345-348, (1998)). Moreover, RD two-spin coherence NMR spectroscopy (Szyperski et al., *J. Biomol. NMR*, 3:127-132 (1993)) subsequently also called zero-quantum/double-quantum (ZQ/DQ) NMR spectroscopy (Rexroth et al., *J. Am. Chem. Soc.*, 17:10389-10390 (1995)), served as a valuable radio-frequency (r.f.) pulse module for measurement of scalar coupling constants (Rexroth et al., *J. Am. Chem. Soc.*, 17: 10389-10390 (1995)) and cross-correlated heteronuclear relaxation (Reif et al., *Science*, 276:1230-1233 (1997); Yang et al., *J. Am. Chem. Soc.*, 121:3555-3556 (1999); Chiarparin et al., *J. Am. Chem. Soc.*, 122:1758-1761 (2000); Brutscher et al., *J. Magn. Reson.*, 130:346-351 (1998); Brutscher, *Concepts Magn. Reson.*, 122:207-229 (2000)).

Recently, a suite of RD $^{13}$C, $^{15}$N, $^1$H-triple resonance NMR experiments was presented for rapid and complete protein resonance assignment (Szyperski et al., *Proc. Natl. Acad. Sci. USA*, 99:8009-8014 (2002)). Even when using short measurement times, these experiments allow one to retain the high spectral resolution required for efficient automated analysis. "Sampling limited" and "sensitivity limited" data collection regimes were defined, respectively, depending on whether the sampling of the indirect dimensions or the sensitivity of a multidimensional NMR experiments per se determines the minimally required measurement time. It was shown that RD NMR spectroscopy is a powerful approach to avoid the "sampling limited regime", i.e., a standard set of experiments allows one to effectively adapt minimal measurement times to sensitivity requirements. It would be advantageous to implement those RD NMR experiments in a manner that allows frequency discrimination of the projected chemical shifts.

The present invention is directed to achieving these objectives.

SUMMARY OF THE INVENTION

The present invention relates to a method of conducting a reduced dimensionality three-dimensional (3D) HA, CA,(CO),N,HN nuclear magnetic resonance (NMR) experiment by measuring the chemical shift values for the following nuclei of a protein molecule having two consecutive amino acid residues, i-1 and i: (1) an α-proton of amino acid residue i-1, $^1H^\alpha_{i-1}$; (2) an α-carbon of amino acid residue i-1, $^{13}C^\alpha_{i-1}$; (3) a polypeptide backbone amide nitrogen of amino acid residue i, $^{15}N_i$; and (4) a polypeptide backbone amide proton of amino acid residue i, $^1H^N_i$, where the chemical shift values of $^1H^\alpha_{i-1}$ and $^{13}C^\alpha_{i-1}$ which are encoded in a peak pair of a 3D NMR spectrum are detected in a phase sensitive manner. The method involves providing a protein sample and applying radiofrequency pulses to the protein sample which effect a nuclear spin polarization transfer where the chemical shift evolutions of $^1H^\alpha_{i-1}$ and $^{13}C^\alpha_{i-1}$ of amino acid residue i-1 are connected to the chemical shift evolutions of $^{15}N_i$ and $^1H^N_i$ of amino acid residue i, under conditions effective (1) to generate NMR signals encoding the chemical shift values of $^{13}C^\alpha_{i-1}$ and $^{15}N_i$ in a phase sensitive manner in two indirect time domain dimensions, $t_1(^{13}C^\alpha)$ and $t_2(^{15}N)$, respectively, and the chemical shift value of $^1H^N_i$ in a direct time domain dimension, $t_3(^1H^N)$, and (2) to sine modulate the $^{13}C^\alpha_{i-1}$ chemical shift evolution in $t_1(^{13}C^\alpha)$ with the chemical shift evolution of $^1H^\alpha_{i-1}$. Then, the NMR signals are processed to generate a sine-modulated 3D NMR spectrum with an anti-phase peak pair derived from the sine modulating, where (1) the chemical shift values of $^{15}N_i$ and $^1H^N_i$ are measured in two frequency domain dimensions, $\omega_2(^{15}N)$ and $\omega_3(^1H^N)$, respectively, and (2) the chemical shift values of $^1H^\alpha_{i-1}$ and $^{13}C^\alpha_{i-1}$ are measured in a frequency domain dimension, $\omega_1(^{13}C^\alpha)$, by the frequency difference between the two peaks forming the anti-phase peak pair and the frequency at the center of the two peaks, respectively, where the sine-modulated 3D NMR spectrum enables detection of the chemical shift value of $^1H^\alpha_{i-1}$ in a phase sensitive manner.

The present invention also relates to a method of conducting a reduced dimensionality three-dimensional (3D) H, C,(C-TOCSY-CO),N,HN nuclear magnetic resonance (NMR) experiment by measuring the chemical shift values for the following nuclei of a protein molecule having two consecutive amino acid residues, i-1 and i: (1) aliphatic protons of amino acid residue i-1, $^1H^{ali}_{i-1}$; (2) aliphatic carbons of amino acid residue i-1, $^{13}C^{ali}_{i-1}$; (3) a polypeptide backbone amide nitrogen of amino acid residue i, $^{15}N_i$; and (4) a polypeptide backbone amide proton of amino acid residue i, $^1H^N_i$, where the chemical shift values of $^1H^{ali}_{i-1}$ and $^{13}C^{ali}_{i-1}$ which are encoded in peak pairs of a 3D NMR spectrum are detected in a phase sensitive manner. The method involves providing a protein sample and applying radiofrequency pulses to the protein sample which effect a nuclear spin polarization transfer where the chemical shift evolutions of $^1H^{ali}_{i-1}$ and $^{13}C^{ali}_{i-1}$ of amino acid residue i-1 are connected to the chemical shift evolutions of $^{15}N_i$ and $^1H^N_i$ of amino acid residue i, under conditions effective (1) to generate a NMR signal encoding the chemical shifts of $^{13}C^{ali}_{i-1}$ and $^{15}N_i$ in a phase sensitive manner in two indirect time domain dimensions, $t_1(^{13}C^{ali})$ and $t_2(^{15}N)$, respectively, and the chemical shift of $^{1}H^{N}_i$ in a direct time domain dimension, $t_3(^{1}H^{N})$, and (2) to sine modulate the chemical shift evolutions of $^{13}C^{ali}_{i-1}$ in $t_1(^{13}C^{ali})$ with the chemical shift evolutions of $^{1}H^{ali}_{i-1}$. Then, the NMR signals are processed to generate a sine-modulated 3D NMR spectrum with anti-phase peak pairs derived from the sine modulating where (1) the chemical shift values of $^{15}N_i$ and $^{1}H^{N}_i$ are measured in two frequency domain dimensions, $\omega_2(^{15}N)$ and $\omega_3(^{1}H^{N})$, respectively, and (2) the chemical shift values of $^{1}H^{ali}_{i-1}$ and $^{13}C^{ali}_{i-1}$ are measured in a frequency domain dimension, $\omega_1(^{13}C^{ali})$, by the frequency differences between each of the two peaks forming each of the anti-phase peak pairs and the frequencies at the center of the two peaks, respectively, where the sine-modulated 3D NMR spectrum enables detection of the chemical shift value of $^{1}H^{ali}_{i-1}$ in a phase sensitive manner.

Another aspect of the present invention relates to a method of conducting a reduced dimensionality three-dimensional (3D) $\overline{H^{\alpha/\beta},C^{\alpha/\beta},CO,HA}$ nuclear magnetic resonance (NMR) experiment by measuring the chemical shift values for the following nuclei of a protein molecule having an amino acid residue, i: (1) a β-proton of amino acid residue i, $^{1}H^{\beta}_i$; (2) a β-carbon of amino acid residue i, $^{13}C^{\beta}_i$; (3) an α-proton of amino acid residue i, $^{1}H^{\alpha}_i$; (4) an α-carbon of amino acid residue i, $^{13}C^{\alpha}_i$; and (5) a polypeptide backbone carbonyl carbon of amino acid residue i, $^{13}C'_i$, where the chemical shift values of $^{1}H^{\alpha}_i/^{13}C^{\alpha}_i$ and $^{1}H^{\beta}_i/^{13}C^{\beta}_i$ which are encoded in peak pairs of a 3D NMR spectrum are detected in a phase sensitive manner. The method involves providing a protein sample and applying radiofrequency pulses to the protein sample which effect a nuclear spin polarization transfer where the chemical shift evolutions of $^{1}H^{\alpha}_i$, $^{1}H^{\beta}_i$, $^{13}C^{\alpha}_i$, and $^{13}C^{\beta}_i$ are connected to the chemical shift evolution of $^{13}C'_i$, under conditions effective (1) to generate NMR signals encoding the chemical shift values of $^{13}C^{\alpha}_i$, $^{13}C^{\beta}_i$ and $^{13}C'_i$ in a phase sensitive manner in two indirect time domain dimensions, $t_1(^{13}C^{\alpha/\beta})$ and $t_2(^{13}C')$, respectively, and the chemical shift value of $^{1}H^{\alpha}_i$ in a direct time domain dimension, $t_3(^{1}H^{\alpha})$, and (2) to sine modulate the chemical shift evolutions of $^{13}C^{\alpha}_i$ and $^{13}C^{\beta}_i$ in $t_1(^{13}C^{\alpha/\beta})$ with the chemical shift evolutions of $^{1}H^{\alpha}_i$ and $^{1}H^{\beta}_i$, respectively. Then, the NMR signals are processed to generate a sine-modulated 3D NMR spectrum with anti-phase peak pairs derived from the sine modulating where (1) the chemical shift values of $^{13}C'_i$ and $^{1}H^{\alpha}_i$ are measured in two frequency domain dimensions, $\omega_2(^{13}C')$ and $\omega_3(^{1}H^{\alpha})$, respectively, and (2) (i) the chemical shift values of $^{1}H^{\alpha}_i$ and $^{1}H^{\beta}_i$ are measured in a frequency domain dimension, $\omega_1(^{13}C^{\alpha/\beta})$, by the frequency differences between each of the two peaks forming each of the anti-phase peak pairs, and (ii) the chemical shift values of $^{13}C^{\alpha}_i$ and $^{13}C^{\beta}_i$ are measured in a frequency domain dimension, $\omega_1(^{13}C^{\alpha/\beta})$, by the frequencies at the center of the two peaks forming the anti-phase peak pairs, where the sine-modulated 3D NMR spectrum enables detection of the chemical shift values of $^{1}H^{\alpha}_i$ and $^{1}H^{\beta}_i$ in a phase sensitive manner.

A further aspect of the present invention relates to a method of conducting a reduced dimensionality three-dimensional (3D) $\overline{H^{\alpha/\beta},C^{\alpha/\beta},N,HN}$ nuclear magnetic resonance (NMR) experiment by measuring the chemical shift values for the following nuclei of a protein molecule having an amino acid residue, i: (1) a β-proton of amino acid residue i, $^{1}H^{\beta}_i$; (2) a β-carbon of amino acid residue i, $^{13}C^{\beta}_i$; (3) an α-proton of amino acid residue i, $^{1}H^{\alpha}_i$; (4) an α-carbon of amino acid residue i, $^{13}C^{\alpha}_i$; (5) a polypeptide backbone amide nitrogen of amino acid residue i, $^{15}N_i$; and (6) a polypeptide backbone amide proton of amino acid residue i, $^{1}H^{N}_i$, where the chemical shift values of $^{1}H^{\alpha}_i/^{13}C^{\alpha}_i$ and $^{1}H^{\beta}_i/^{13}C^{\beta}_i$ which are encoded in peak pairs of a 3D NMR spectrum are detected in a phase sensitive manner. The method involves providing a protein sample and applying radiofrequency pulses to the protein sample which effect a nuclear spin polarization transfer where the chemical shift evolutions of $^{1}H^{\alpha}_i$, $^{1}H^{\beta}_i$, $^{13}C^{\alpha}_i$, and $^{13}C^{\beta}_i$ are connected to the chemical shift evolutions of $^{15}N_i$ and $^{1}H^{N}_i$, under conditions effective (1) to generate NMR signals encoding the chemical shift values of $^{13}C^{\alpha}_i$, $^{13}C^{\beta}_i$ and $^{15}N_i$ in a phase sensitive manner in two indirect time domain dimensions, $t_1(^{13}C^{\alpha/\beta})$ and $t_2(^{15}N)$, respectively, and the chemical shift value of $^{1}H^{N}_i$ in a direct time domain dimension, $t_3(^{1}H^{N})$, and (2) to sine modulate the chemical shift evolutions of $^{13}C^{\alpha}_i$ and $^{13}C^{\beta}_i$ in $t_1(^{13}C^{\alpha/\beta})$ with the chemical shift evolutions of $^{1}H^{\alpha}_i$ and $^{1}H^{\beta}_i$, respectively. Then, the NMR signals are processed to generate a sine-modulated 3D NMR spectrum with anti-phase peak pairs derived from the sine modulating where (1) the chemical shift values of $^{15}N_i$ and $^{1}H^{N}_i$ are measured in two frequency domain dimensions, $\omega_2(^{15}N)$ and $\omega_3(^{1}H^{N})$, respectively, and (2) (i) the chemical shift values of $^{1}H^{\alpha}_i$ and $^{1}H^{\beta}_i$ are measured in a frequency domain dimension, $\omega_1(^{13}C^{\alpha/\beta})$, by the frequency differences between each of the two peaks forming each of the anti-phase peak pairs, and (ii) the chemical shift values of $^{13}C^{\alpha}_i$ and $^{13}C^{\beta}_i$ are measured in a frequency domain dimension, $\omega_1(^{13}C^{\alpha/\beta})$, by the frequencies at the center of the two peaks forming the anti-phase peak pairs, where the sine-modulated 3D NMR spectrum enables detection of the chemical shift values of $^{1}H^{\alpha}_i$ and $^{1}H^{\beta}_i$ in a phase sensitive manner.

The present invention also relates to a method of conducting a reduced dimensionality three-dimensional (3D) $\overline{H,C,C,H}$-COSY nuclear magnetic resonance (NMR) experiment by measuring the chemical shift values for $^{1}H^{m}$, $^{13}C^{m}$, $^{1}H^{n}$, and $^{13}C^{n}$ of a protein molecule where m and n indicate atom numbers of two CH, $CH_2$ or $CH_3$ groups that are linked by a single covalent carbon-carbon bond in an amino acid residue, where the chemical shift values of $^{1}H^{m}$ and $^{13}C^{m}$ which are encoded in a peak pair of a 3D NMR spectrum are detected in a phase sensitive manner. The method involves providing a protein sample and applying radiofrequency pulses to the protein sample which effects a nuclear spin polarization transfer where the chemical shift evolutions of $^{1}H^{m}$ and $^{13}C^{m}$ are connected to the chemical shift evolutions of $^{1}H^{n}$ and $^{13}C^{n}$, under conditions effective (1) to generate NMR signals encoding the chemical shift values of $^{13}C^{m}$ and $^{13}C^{n}$ in a phase sensitive manner in two indirect time domain dimensions, $t_1(^{13}C^{m})$ and $t_2(^{13}C^{n})$, respectively, and the chemical shift value of $^{1}H^{n}$ in a direct time domain dimension, $t_3(^{1}H^{n})$, and (2) to sine modulate the chemical shift evolution of $^{13}C^{m}$ in $t_1(^{13}C^{m})$ with the chemical shift evolution of $^{1}H^{m}$. Then, the NMR signals are processed to generate a sine-modulated 3D NMR spectrum with anti-phase peak pairs derived from the sine modulating where (1) the chemical shift values of $^{13}C^{n}$ and $^{1}H^{n}$ are measured in two frequency domain dimensions, $\omega_2(^{13}C^{n})$ and $\omega_3(^{1}H^{n})$, respectively, and (2) the chemical shift values of $^{1}H^{m}$ and $^{13}C^{m}$ are measured in a frequency domain dimension, $\omega_1(^{13}C^{m})$, by the frequency differences between each of the two peaks forming each of the anti-phase peak pairs and the frequencies at the center of the two peaks, respectively, where the sine-modulated 3D NMR spectrum enables detection of the chemical shift value of $^{1}H^{m}$ in a phase sensitive manner.

Another aspect of the present invention relates to a method of conducting a reduced dimensionality three-dimensional (3D) $\underline{\overline{H,C,C,H}}$-TOCSY nuclear magnetic resonance (NMR)

experiment by measuring the chemical shift values for $^1H^m$, $^{13}C^m$, $^1H^n$, and $^{13}C^n$ of a protein molecule where m and n indicate atom numbers of two CH, CH$_2$ or CH$_3$ groups that may or may not be directly linked by a single covalent carbon-carbon bond in an amino acid residue, where the chemical shift values of $^1H^m$ and $^{13}C^m$ which are encoded in a peak pair of a 3D NMR spectrum are detected in a phase sensitive manner. The method involves providing a protein sample and applying radiofrequency pulses to the protein sample which effect a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, and the chemical shift value of $^1H^n$ in a direct time domain dimension, $t_3(^1H^n)$, and (2) to sine modulate the chemical shift evolution of $^{13}C^m$ in $t_1(^{13}C^m)$ with the chemical shift evolution of $^1H^m$. Then, the NMR signals are processed to generate a sine-modulated 3D NMR spectrum with anti-phase peak pairs derived from the sine modulating where (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between each of the two peaks forming each of the anti-phase peak pairs and the frequencies at the center of the two peaks, respectively, where the sine-modulated 3D NMR spectrum enables detection of the chemical shift value of $^1H^m$ in a phase sensitive manner.

A further aspect of the present invention relates to a method of conducting a reduced dimensionality two-dimensional (2D) HB,CB,(CG,CD),HD nuclear magnetic resonance (NMR) experiment by measuring the chemical shift values for the following nuclei of a protein molecule: (1) a β-proton of an amino acid residue with an aromatic side chain, $^1H^β$; (2) a β-carbon of an amino acid residue with an aromatic side chain, $^{13}C^β$; and (3) a δ-proton of an amino acid residue with an aromatic side chain, $^1H^δ$, where the chemical shift values of $^1H^β$ and $^{13}C^β$ which are encoded in a peak pair of a 2D NMR spectrum are detected in a phase sensitive manner. The method involves providing a protein sample and applying radiofrequency pulses to the protein sample which effect a nuclear spin polarization transfer where the chemical shift evolutions of $^1H^β$ and $^{13}C^β$ are connected to the chemical shift evolution of $^1H^δ$, under conditions effective (1) to generate NMR signals encoding the chemical shift value of $^{13}C^β$ in a phase sensitive manner in an indirect time domain dimension, $t_1(^{13}C^β)$, and the chemical shift value of $^1H^δ$ in a direct time domain dimension, $t_2(^1H^δ)$, and (2) to sine modulate the chemical shift evolution of $^{13}C^β$ in $t_1(^{13}C^β)$ with the chemical shift evolution of $^1H^β$. Then, the NMR signals are processed to generate a sine-modulated 2D NMR spectrum with an anti-phase peak pair derived from the sine modulating where (1) the chemical shift value of $^1H^δ$ is measured in a frequency domain dimension, $\omega_2(^1H^δ)$, and (2) the chemical shift values of $^1H^β$ and $^{13}C^β$ are measured in a frequency domain dimension, $\omega_1(^{13}C^β)$, by the frequency difference between the two peaks forming the anti-phase peak pair and the frequency at the center of the two peaks, respectively, where the sine-modulated 2D NMR spectrum enables detection of the chemical shift value of $^1H^β$ in a phase sensitive manner.

The present invention also relates to a method of conducting a reduced dimensionality two-dimensional (2D) H,C,H-COSY nuclear magnetic resonance (NMR) experiment by measuring the chemical shift values for $^1H^m$, $^{13}C^m$, and $^1H^n$ of a protein molecule where m and n indicate atom numbers of two CH, CH$_2$ or CH$_3$ groups in an amino acid residue, where the chemical shift values of $^1H^m$ and $^{13}C^m$ which are encoded in a peak pair of a 2D NMR spectrum are detected in a phase sensitive manner. The method involves providing a protein sample and applying radiofrequency pulses to the protein sample which effect a nuclear spin polarization transfer where the chemical shift evolutions of $^1H^m$ and $^{13}C^m$ are connected to the chemical shift evolution of $^1H^n$, under conditions effective (1) to generate NMR signals encoding the chemical shift value of $^{13}C^m$ in a phase sensitive manner in an indirect time domain dimension, $t_1(^{13}C^m)$, and the chemical shift value of $^1H^n$ in a direct time domain dimension, $t_2(^1H^n)$, and (2) to sine modulate the chemical shift evolution of $^{13}C^m$ in $t_1(^{13}C^m)$ with the chemical shift evolution of $^1H^m$. Then, the NMR signals are processed to generate a sine-modulated 2D NMR spectrum with anti-phase peak pairs derived from the sine modulating where (1) the chemical shift value of $^1H^n$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between each of the two peaks forming each of the anti-phase peak pairs and the frequencies at the center of the two peaks, respectively, where the sine-modulated 2D NMR spectrum enables detection of the chemical shift value of $^1H^m$ in a phase sensitive manner.

Another aspect of the present invention relates to a method for sequentially assigning chemical shift values of an α-proton, $^1H^α$, an α-carbon, $^{13}C^α$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample, where the chemical shift values of $^1H^α$ and $^{13}C^α$ which are encoded in a peak pair of a 3D NMR spectrum are detected in a phase sensitive manner, including: (1) a RD three-dimensional (3D) HA,CA,(CO),N,HN NMR experiment to measure and connect chemical shift values of the α-proton of amino acid residue i−1, $^1H^α_{i-1}$, the α-carbon of amino acid residue i−1, $^{13}C^α_{i-1}$, the polypeptide backbone amide nitrogen of amino acid residue i, $^{15}N_i$, and the polypeptide backbone amide proton of amino acid residue i, $^1H^N_i$ and (2) a RD 3D HNNCAHA NMR experiment to measure and connect the chemical shift values of the α-proton of amino acid residue i, $^1H^α_i$, the α-carbon of amino acid residue i, $^{13}C^α_i$, $^{15}N_i$, and $^1H^N_i$. Then, sequential assignments of the chemical shift values of $^1H^α$, $^{13}C^α$, $^{15}N$, and $^1H^N$ are obtained by (i) matching the chemical shift values of $^1H^α_{i-1}$ and $^{13}C^α_{i-1}$ with the chemical shift values of $^1H^α_i$ and $^{13}C^α_i$, (ii) using the chemical shift values of $^1H^α_{i-1}$ and $^{13}C^α_{i-1}$ to identify the type of amino acid residue i−1, and (iii) mapping sets of sequentially connected chemical shift values to the amino acid sequence of the polypeptide chain and using the chemical shift values to locate secondary structure elements within the polypeptide chain.

Yet another aspect of the present invention relates to a method for sequentially assigning chemical shift values of a β-proton, $^1H^β$, a β-carbon, $^{13}C^β$, an α-proton, $^1H^α$, an α-carbon, $^{13}C^α$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample, where the chemical shift values of $^1H^{α/β}$ and $^{13}C^{α/β}$ which are encoded in peak pairs of a 3D NMR spectrum are detected in a phase sensitive manner, including: (1) a RD 3D $H^{α/β}C^{α/β}(CO)NHN$ NMR experiment to measure and connect the chemical shift values of the β-proton of amino acid residue i−1, $^1H^\beta_{i-1}$, the β-carbon of amino acid residue i−1, $^{13}C^\beta_{i-1}$, the α-proton of amino acid residue i−1, $^1H^\alpha_{i-1}$, the α-carbon of amino acid residue i−1, $^{13}C^\alpha_{i-1}$, the polypeptide backbone amide nitrogen of amino acid residue i, $^{15}N_i$, and the polypeptide backbone amide proton of amino acid residue i, $^1H^N_i$, and (2) a RD 3D $\underline{H^{\alpha/\beta},C^{\alpha/\beta}}$,N,HN NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^\beta$, $^{13}C^\beta$, $^1H^\alpha$, $^{13}C^\alpha$, $^{15}N$, and $^1H^N$ are obtained by (i) matching the chemical shift values of the α- and β-protons of amino acid residue i−1, $^1H^{\alpha/\beta}_{i-1}$, and the α- and β-carbons of amino acid residue i−1, $^{13}C^{\alpha/\beta}_{i-1}$, with the chemical shift values of $^1H^{\alpha/\beta}_i$ and $^{13}C^{\alpha/\beta}_i$, (ii) using the chemical shift values of $^1H^{\alpha/\beta}_{i-1}$ and $^{13}C^{\alpha/\beta}_{i-1}$ to identify the type of amino acid residue i−1, and (iii) mapping sets of sequentially connected chemical shift values to the amino acid sequence of the polypeptide chain and using the chemical shift values to locate secondary structure elements within the polypeptide chain.

A further aspect of the present invention involves a method for sequentially assigning chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample, where the chemical shift values of $^1H^{ali}$ and $^{13}C^{ali}$ which are encoded in peak pairs of a 3D NMR spectrum are detected in a phase sensitive manner, including: (1) a RD 3D $\underline{H,C}$,(C-TOCSY-CO),N,HN NMR experiment to measure and connect the chemical shift values of the aliphatic protons of amino acid residue i−1, $^1H^{ali}_{i-1}$, the aliphatic carbons of amino acid residue i−1, $^{13}C^{ali}_{i-1}$, the polypeptide backbone amide nitrogen of amino acid residue i, $^{15}N_i$, and the polypeptide backbone amide proton of amino acid residue i, $^1H^N_i$, and (2) a RD 3D $\underline{H^{\alpha/\beta},C^{\alpha/\beta}}$,N,HN NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α- and β-protons of amino acid residue i−1, $^1H^{\alpha/\beta}_{i-1}$, and the α- and β-carbons of amino acid residue i−1, $^{13}C^{\alpha/\beta}_{i-1}$, with the chemical shift values of $^1H^{\alpha/\beta}_i$ and $^{13}C^{\alpha/\beta}_i$ of amino acid residue i, (ii) using the chemical shift values of $^1H^{ali}_{i-1}$ and $^{13}C^{ali}_{i-1}$ to identify the type of amino acid residue i−1, and (iii) mapping sets of sequentially connected chemical shift values to the amino acid sequence of the polypeptide chain and using the chemical shift values to locate secondary structure elements within the polypeptide chain.

The present invention also relates to a method for sequentially assigning chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample, where the chemical shift values of $^1H^{ali}$ and $^{13}C^{ali}$ which are encoded in peak pairs of a 3D NMR spectrum are detected in a phase sensitive manner, including: (1) a RD 3D $\underline{H,C}$,(C-TOCSY-CO),N,HN NMR experiment to measure and connect the chemical shift values of the aliphatic protons of amino acid residue i−1, $^1H^{ali}_{i-1}$, the aliphatic carbons of amino acid residue i−1, $^{13}C^{ali}_{i-1}$, the polypeptide backbone amide nitrogen of amino acid residue i, $^{15}N_i$, and the polypeptide backbone amide proton of amino acid residue i, $^1H^N_i$, and (2) a RD 3D HNNCAHA NMR experiment to measure and connect the chemical shift values of the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α-proton of amino acid residue i−1, $^1H^\alpha_{i-1}$, and the α-carbon of amino acid residue i−1, $^{13}C^\alpha_{i-1}$, with the chemical shift values of $^1H^\alpha_i$ and $^{13}C^\alpha_i$, (ii) using the chemical shift values of $^1H^{ali}_{i-1}$ and $^{13}C^{ali}_{i-1}$ to identify the type of amino acid residue i−1, and (iii) mapping sets of sequentially connected chemical shift values to the amino acid sequence of the polypeptide chain and using the chemical shift values to locate secondary structure elements within the polypeptide chain.

Another aspect of the present invention involves a method for obtaining assignments of chemical shift values of $^1H$, $^{13}C$ and $^{15}N$ of a protein molecule. The method involves providing a protein sample and conducting four reduced dimensionality (RD) nuclear magnetic resonance (NMR) experiments on the protein sample, where the chemical shift values of $^1H$ and $^{13}C$ which are encoded in peak pairs of a 3D NMR spectrum are detected in a phase sensitive manner and (1) a first experiment is selected from a RD 3D $H^{\alpha/\beta}C^{\alpha/\beta}$(CO)NHN NMR experiment, a RD 3D HA,CA,$\overline{\text{(CO)}}$,N,HN NMR experiment, or a RD 3D $\underline{H,C}$,(C-TOCSY-CO),N,HN NMR experiment for obtaining sequential correlations of chemical shift values; (2) a second experiment is selected from a RD 3D HNNCAHA NMR experiment, a RD 3D $\underline{H^{\alpha/\beta},C^{\alpha/\beta}}$,N,HN NMR experiment, or a RD 3D HNN<CO,$\overline{\text{CA}}$> NMR experiment for obtaining intraresidue correlations of chemical shift values; (3) a third experiment is a RD 3D H,C,C,H-COSY NMR experiment for obtaining assignments of sidechain chemical shift values; and (4) a fourth experiment is a RD 2D HB,CB,(CG,CD),HD NMR experiment for obtaining assignments of aromatic sidechain chemical shift values.

The present invention enables one to record an entire suite of RD NMR experiments used for obtaining chemical shift assignments and secondary structure determination of a protein molecule in a manner that enables frequency discrimination for the projected chemical shift and allows one to place the two peaks forming a peak pair into separate spectra. The frequency discrimination allows one to place the radiofrequency carrier in the center of the projected chemical shift range.

BRIEF DESCRIPTION OF THE DRAWINGS

FIG. 1 is a schematic presentation describing cosine-modulated and sine-modulated RD NMR data acquisition and processing, as well as the editing of the peaks forming RD NMR peak pairs into separate spectra. Data sets (1) and (2) correspond to real part and imaginary part, respectively, of a cosine-modulated RD NMR experiment, in which $\Omega_y$ is detected in a phase sensitive manner and the evolution of the chemical shift $\Omega_x$ effects a cosine modulation. Data sets (3) and (4) correspond to real part and imaginary part, respectively, of a sine-modulated RD NMR experiment, in which $\Omega_y$ is detected in a phase sensitive manner and the evolution of $\Omega_x$ effects a sine modulation, further enabling the phase sensitive detection of $\Omega_x$. The two data sets as well as the corresponding cosine and sine functions for the cosine-modulated RD NMR and sine-modulated RD NMR are shown in (A) and (B), respectively. Forming the sum and the difference of the cosine-modulated and sine-modulated RD NMR spectra allows one to edit the two peaks forming the peak pairs into separate spectra. The data sets that need to be linearly combined in the time domain to achieve such editing are shown in (C) and (D).

FIGS. 2A-K show the polarization transfer pathways (top) and stick diagrams of the in-phase peak pattern observed along $\omega_1(^{13}C)$ (bottom) for the cosine-modulated RD NMR experiments implemented for the present invention (the 3D $\overline{H^{\alpha/\beta}C^{\alpha/\beta}}$(CO)NHN experiment, the 3D $\overline{HACA}$(CO)NHN experiment, the 3D $\overline{HC}$(C-TOCSY-CO)$\overline{NHN}$ experiment, the 3D HNNCAHA experiment, the 3D $\overline{H^{\alpha/\beta}C^{\alpha/\beta}}$COHA experiment, the $\overline{3D\ H^{\alpha/\beta}C^{\alpha/\beta}}$NHN experiment, the 3D HNN<CO, CA> experiment, the 3D HCCH-COSY experiment, the $\overline{3D}$ $\overline{HCCH}$-TOCSY experiment, the 2D HBCB(CGCD)HD experiment, and the 2D $^1$H-TOCSY-relayed-HCH-COSY experiment, respectively). For the sine-modulated RD NMR experiments, anti-phase peak pairs are observed (see FIG. 1) instead of the in-phase peak pattern for the cosine-modulated RD NMR experiments. The boxes comprise nuclei whose chemical shifts are measured in the common dimension $\omega_1$, and the nuclei which are detected in quadrature in $t_1$ are marked with an asterisk. Bold solid and hatched boxes indicate intraresidue and sequential connectivities, respectively, and the resulting signals sketched in the stick diagrams are represented accordingly. Those $^{13}$C nuclei whose magnetization is used to detect central peaks (Szyperski et al., J. Am. Chem. Soc., 118:8146-8147 (1996), which is hereby incorporated by reference in its entirety), as well as the resulting subspectrum II shown at the bottom, are highlighted in grey. The magnetization is frequency labeled with single-quantum coherence of the encircled nuclei during $t_2$ and detected on the boxed protons. Except for FIG. 2G, the in-phase splittings $2\Delta\Omega(^1H)$ are equal to $2\kappa\cdot\delta\Omega(^1H)[\gamma(^1H)/\gamma(^{13}C)]$, where $\kappa$, $\delta\Omega(^1H)$ and $\gamma(X)$ denote the scaling factor applied for $^1$H chemical shift evolution (set to 1.0 for the present study), the chemical shift difference with respect to the apparent $^1$H carrier position, and the gyromagnetic ratio of nucleus X, respectively. In FIG. 2G, the in-phase splittings $2\Delta\Omega(^{13}C^\alpha)$ are equal to $2\kappa\cdot\delta\Omega(^{13}C^\alpha)$, where $\kappa$ and $\delta\Omega(^{13}C^\alpha)$ are the scaling factor applied for $^{13}C^\alpha$ chemical shift evolution$^{13}$ (set to 0.5 for the present study) and the chemical shift difference with respect to the apparent $^{13}C^\alpha$ carrier position, respectively.

*Spectroscopy*, Academic Press, San Diego, (1996), which is hereby incorporated by reference in its entirety).

Figure 3A:
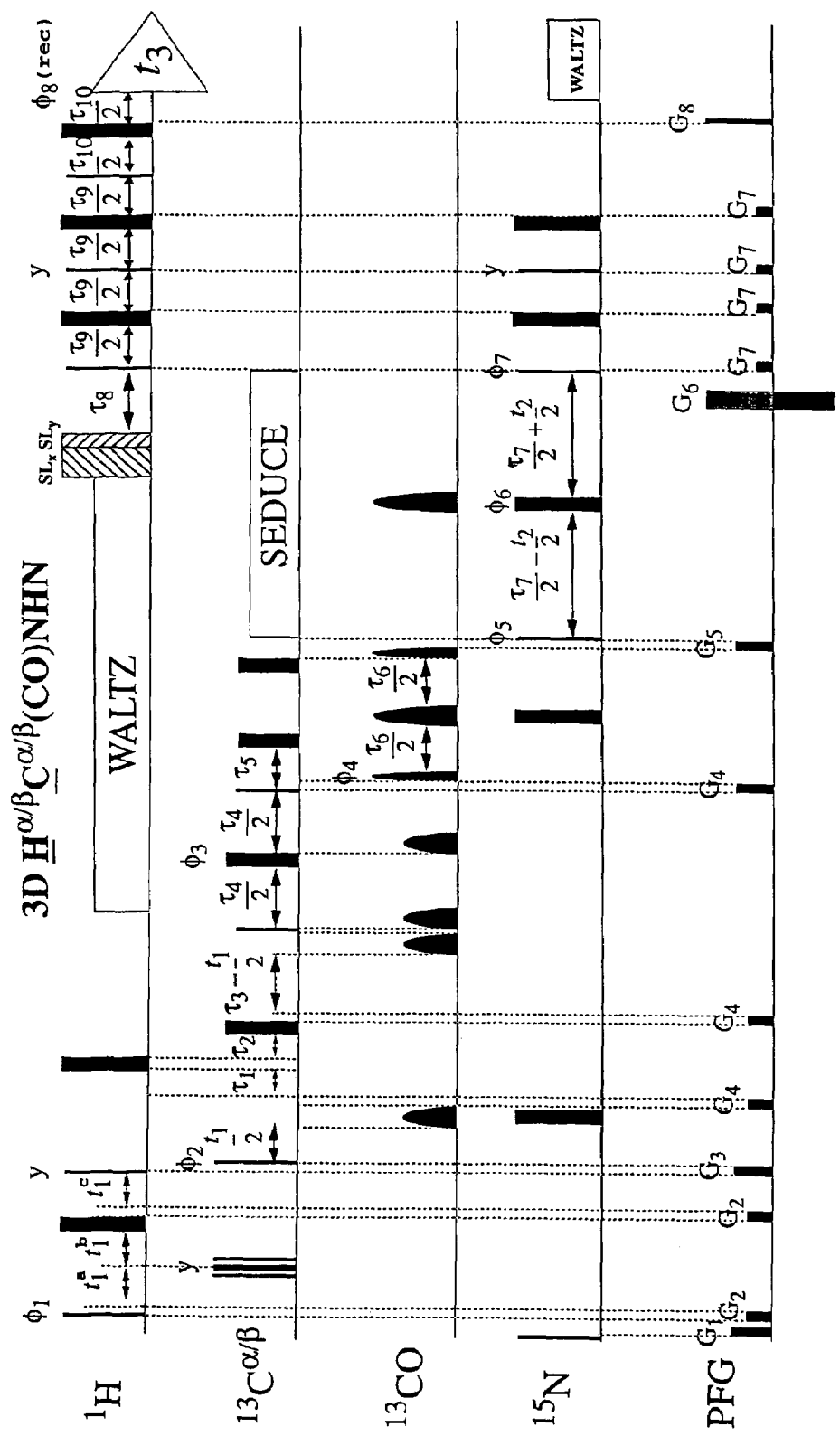
FIG. 3A illustrates the experimental scheme for the 3D $\overline{H^{\alpha/\beta}C^{\alpha/\beta}}$(CO)NHN experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor $\kappa$ for $^1$H chemical shift evolution during $t_1$ is set to 1.0. The high-power 90° pulse lengths were: 5.9 μs for $^1$H, 15.4 μs for $^{13}$C, and 38 μs for $^{15}$N. Pulses on $^{13}$C prior to $t_1(^{13}C)$ are applied at high power, and $^{13}$C decoupling during $t_1(^1H)$ is achieved using a $(90_x$-$180_y$-$90_x)$ composite pulse. Subsequently, the 90° and 180° pulse lengths applied for $^{13}C^{\alpha/\beta}$ are adjusted to 47.5 μs and 42.5 μs, respectively, to minimize perturbation of $^{13}$CO spins. The width of the 90° pulse applied on $^{13}$CO pulse is 52 μs and the corresponding 180° pulses are applied with same power. A SEDUCE 180° pulse with a length of 200 μs is used to decouple $^{13}$CO during $t_1$ and $\tau_4$. The length of the spin-lock purge pulses $SL_x$ and $SL_y$ are 1.2 ms and 0.6 ms, respectively. WALTZ16 is employed to decouple $^1$H (r.f. field strength=9.2 kHz) during the heteronuclear magnetization transfers as well as to decouple $^{15}$N during acquisition (r.f.=1.78 kHz). The SEDUCE sequence is used for decoupling of $^{13}C^\alpha$ during $^{15}$N evolution period (r.f.=1.0 kHz). The $^1$H r.f. carrier is placed at 0 ppm before the start of the semi constant time $^1$H chemical shift evolution period, and then switched to the water line at 4.78 ppm after the second 90° $^1$H pulse. Initially, the $^{13}$C and $^{15}$N r.f. carriers are set to 43 ppm and 120.9 ppm, respectively. The $^{13}$C carrier is set to 56 ppm during the second $\tau_4/2$ delay. The duration and strengths of the pulsed z-field gradients (PFGs) are: G1 (1 ms, 24 G/cm); G2 (100 μs, 16 G/cm); G3 (250 μs, 29.5 G/cm); G4 (250 μs, 30 G/cm); G5 (1.5 ms, 20 G/cm); G6 (1.25 ms, 30 G/cm); G7 (500 μs, 8 G/cm); G8 (125 μs, 29.5 G/cm). All PFG pulses are of rectangular shape. A recovery delay of at least 100 μs duration is inserted between a PFG pulse and an r.f. pulse. The delays are: $\tau_1$=800 μs, $\tau_2$=3.1 ms, $\tau_3$=3.6 ms, $\tau_4$=7.2 ms, $\tau_5$=4.4 ms, $\tau_6$=24.8 ms, $\tau_7$=24.8 ms, $\tau_8$=5.5 ms, $\tau_9$=4.6 ms, $\tau_{10}$=1.0 ms. $^1$H-frequency labeling is achieved in a semi constant-time fashion with $t_1{}^a(0)$=1.7 ms, $t_1{}^b(0)$=1 μs, $t_1{}^c(0)$=1.701 ms, $\Delta t_1{}^a$=33.3 μs, $\Delta t_1{}^b$=19.3 μs, $\Delta t_1{}^c$=−14 μs. Hence, the fractional increase of the semi constant-time period with $t_1$ equals to $\lambda$=1+$\Delta t_1{}^c/\Delta t_1{}^a$=0.58. Phase cycling: $\phi_1$=x; $\phi_2$=x, x, −x, −x; $\phi_3$=x, −x; $\phi_4$=x, −x; $\phi_5$=x; $\phi_6$=x, x, −x, −x; $\phi_7$=x; $\phi_8$ (receiver)=x, −x, −x, x. The sensitivity enhancement scheme of Kay (Cavanagh et al., Protein NMR Spectroscopy, Academic Press, San Diego, (1996), which is hereby incorporated by reference in its entirety) is employed, i.e., the sign of $G_6$ is inverted in concert with a 180° shift of $\phi_7$. Quadrature detection in $t_1(^{13}C)$ and $t_2(^{15}N)$ is accomplished by altering the phases $\phi_2$ and $\phi_5$, respectively, according to States-TPPI (Cavanagh et al., Protein NMR Spectroscopy, Academic Press, San Diego, (1996), which is hereby incorporated by reference in its entirety). For acquisition of central peaks derived from $^{13}$C steady state magnetization, a second data set with $\phi_1$=−x is collected. The sum and the difference of the two resulting data sets generate subspectra II and I, respectively, containing the central peaks and peak pairs.
Figure 3B:
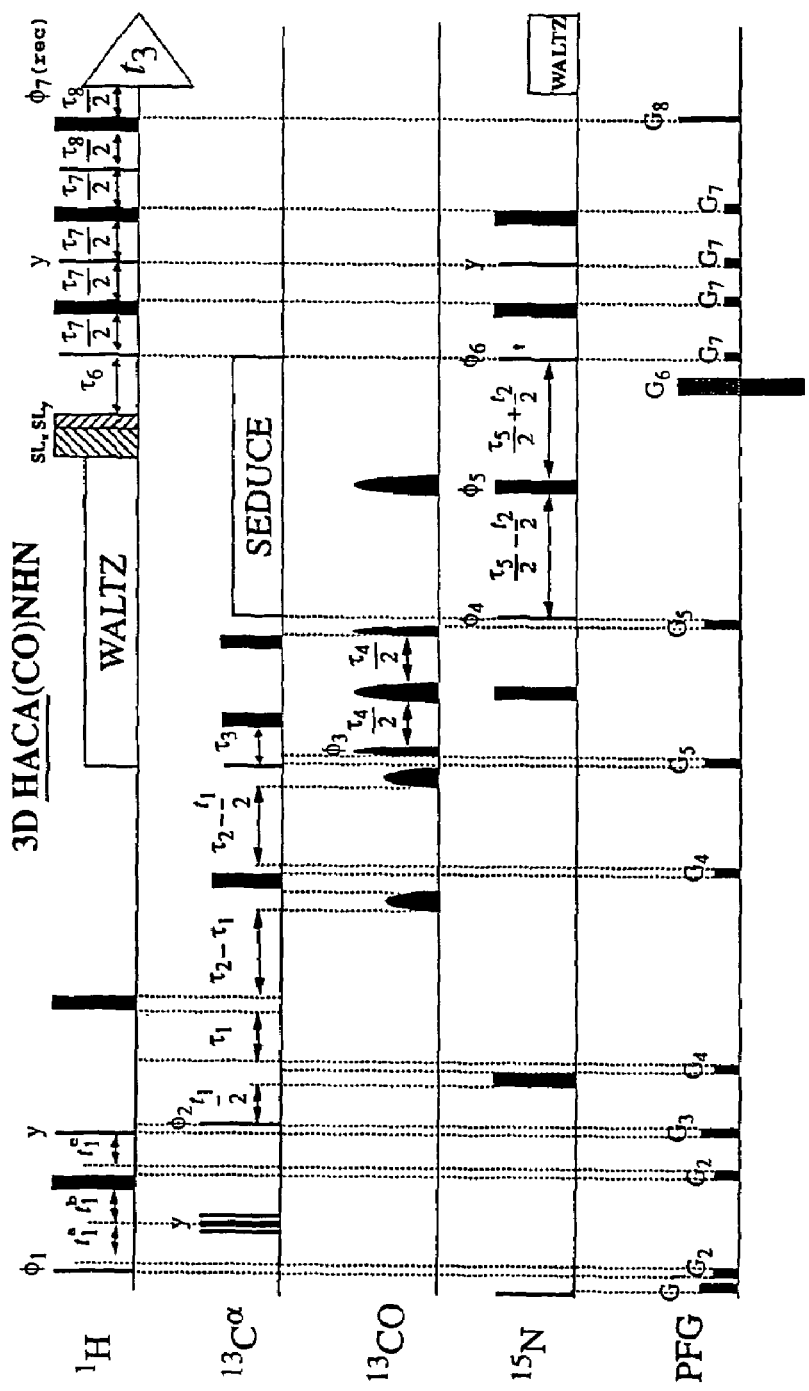
FIG. 3B illustrates the experimental scheme for the 3D $\overline{HACA}$(CO)NHN experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor $\kappa$ for $^1$H chemical shift evolution during $t_1$ is set to 1.0. The high power 90° pulse lengths were: 5.8 μs for $^1$H and 15.4 μs for $^{13}$C, and 38 μs for $^{15}$N. Pulses on $^{13}$C prior to $t_1(^{13}C)$ are applied at high power, and $^{13}$C decoupling during $t_1(^1H)$ is achieved using a $(90_x$-$180_y$-$90_x)$ composite pulse. Subsequently, the 90° and 180° pulse lengths of $^{13}C^\alpha$ are adjusted to 51.5 μs and 46 μs, respectively, to minimize perturbation of the $^{13}$CO spins. The width of the 90° pulses applied to $^{13}$CO pulse is 52 μs and the corresponding 180° pulses are applied with same power. A SEDUCE 180° pulse with a length 252 μs is used to decouple $^{13}$CO during $t_1$. The length of the spin-lock purge pulses $SL_x$ and $SL_y$ are 2.5 ms and 1 ms, respectively. WALTZ16 is employed to decouple $^1$H (r.f. field strength=9.2 kHz) during the heteronuclear magnetization transfers as well as to decouple $^{15}$N during acquisition (r.f.=1.78 kHz). The SEDUCE sequence is used for decoupling of $^{13}C^\alpha$ during the $^{15}$N chemical shift evolution period (r.f.=1.0 kHz). The $^1$H r.f. carrier is placed at 0 ppm before the start of the semi constant time $^1$H evolution period, and then switched to the water line at 4.78 ppm after the second 90° $^1$H pulse. The $^{13}C^\alpha$ and $^{15}$N r.f. carriers are set to 56.1 ppm and 120.9 ppm, respectively. The duration and strengths of the pulsed z-field gradients (PFGs) are: G1 (1 ms, 24 G/cm); G2 (100 μs, 16 G/cm); G3 (1 ms, 24 G/cm); G4 (250 μs, 30 G/cm); G5 (1.5 ms, 20 G/cm); G6 (1.25 ms, 30 G/cm); G7 (500 μs, 8 G/cm); G8 (125 μs, 29.5 G/cm). All PFG pulses are of rectangular shape. A recovery delay of at least 100 µs duration is inserted between a PFG pulse and an r.f. pulse. The delays are: $\tau_1$=1.6 ms, $\tau_2$=3.6 ms, $\tau_3$=4.4 ms, $\tau_4$=$\tau_5$=24.8 ms, $\tau_6$=5.5 ms, $\tau_7$=4.6 ms, $\tau_8$=1 ms. $^1$H-frequency labeling is achieved in a semi constant-time fashion with $t_1^a$ (0)=1.7 ms, $t_1^b$ (0)=1 µs, $t_1^c$ (0)=1.701 ms, $\Delta t_1^a$=60 µs, $\Delta t_1^b$=35.4 µs, $\Delta t_1^c$=−24.6 µs. Hence, the fractional increase of the semi constant-time period with $t_1$ equals to $\lambda=1+\Delta t_1^c/\Delta t_1^a$=0.58. Phase cycling: $\phi_1$=x; $\phi_2$=x, x, −x, −x; $\phi_3$=x, −x; $\phi_4$=x; $\phi_5$=x, x, −x, −x; $\phi_6$=x; $\phi_7$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed., i.e., the sign of G6 is inverted in concert with a 180° shift of $\phi_6$. Quadrature detection in $t_1$($^{13}$C) and $t_2$($^{15}$N) is accomplished by altering the phases $\phi_2$ and $\phi_4$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}$C steady state magnetization, a second data set with $\phi_1$=−x is collected. The sum and the difference of the two resulting data sets generate subspectra II and I, respectively, containing the central peaks and peak pairs.
Figure 3C:
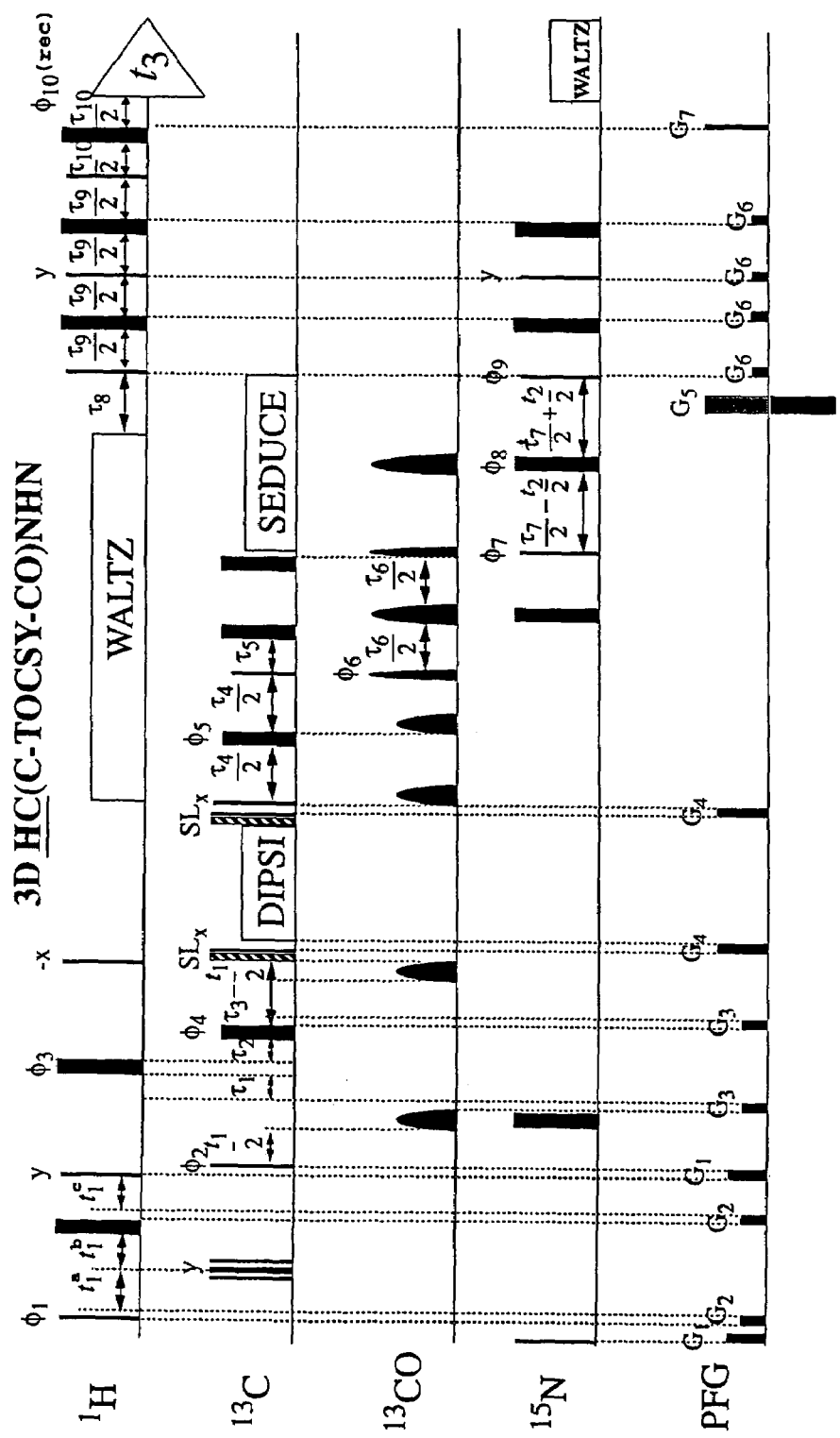
FIG. 3C illustrates the experimental scheme for the 3D HC(C-TOCSY-CO)NHN experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor κ for $^1$H chemical shift evolution during $t_1$ is set to 1.0. The high power 90° pulse lengths were: 5.8 µs for $^1$H and 15.5 µs for $^{13}$C, and 38 µs for $^{15}$N. Pulses on $^{13}$C prior to $t_1$($^{13}$C) are applied at high power, and $^{13}$C decoupling during $t_1$($^1$H) is achieved using a (90$_x$-180$_y$-90$_x$) composite pulse. Subsequently, the 90° and 180° pulse lengths applied for $^{13}$C are adjusted to 47.0 µs and 42.5 µs, respectively, to minimize perturbation of $^{13}$CO spins. The width of the 90° pulses applied to $^{13}$CO pulse is 52 µs and the corresponding 180° pulses are applied with same power. A SEDUCE 180° pulse with a length 200 µs is used to decouple $^{13}$CO during $t_1$ and $\tau_4$ period. WALTZ16 is employed to decouple $^1$H (r.f. field strength=9.2 kHz) during the heteronuclear magnetization transfers as well as to decouple $^{15}$N during acquisition (r.f.=1.78 kHz). The SEDUCE sequence is used for decoupling of $^{13}$C$^\alpha$ during the $^{15}$N chemical shift evolution period (r.f.=1.0 kHz). The $^1$H r.f. carrier is placed at 0 ppm before the start of the semi constant time $^1$H evolution period, and then switched to the water line at 4.78 ppm after the second 90° $^1$H pulse. The $^{13}$C and $^{15}$N r.f. carriers are set to 43 ppm and 120.9 ppm, respectively. The lengths of the $^{13}$C spin-lock purge pulses, SL$_x$, are 2.5 ms and 1.25 ms, respectively, before and after the carbon-carbon total correlation spectroscopy (TOCSY) relay. $^{13}$C isotropic mixing is accomplished using DIPSI-2 scheme with a r.f. field strength of 8.5 kHz. The duration and strengths of the pulsed z-field gradients (PFGs) are: G1 (2 ms, 30 G/cm); G2 (100 µs, 8 G/cm); G3 (200 µs, 4 G/cm); G4 (2 ms, 30 G/cm); G5 (1.25 ms, 30 G/cm); G6 (500 µs, 5 G/cm); G7 (125 µs, 29.5 G/cm). All PFG pulses are of rectangular shape. A recovery delay of at least 100 µs duration is inserted between a PFG pulse and an r.f. pulse. The delays are: $\tau_1$=950 µs, $\tau_2$=3.1 ms, $\tau_3$=3.6 ms, $\tau_4$=7.2 ms, $\tau_5$=4.45 ms, $\tau_6$=24.8 ms, $\tau_7$=24.8 ms, $\tau_8$=5.5 ms, $\tau_9$=4.8 ms, $\tau_{10}$=1 ms. $^1$H-frequency labeling is achieved in a semi constant-time fashion with $t_1^a$ (0)=1.7 ms, $t_1^b$ (0)=1 µs, $t_1^c$ (0)=1.701 ms, $\Delta t_1^a$=33.3 µs, $\Delta t_1^b$=19.3 µs, $\Delta t_1^c$=−14 µs. Hence, the fractional increase of the semi constant-time period with $t_1$ equals to $\lambda=1+\Delta t_1^c/\Delta t_1^a$=0.58. Phase cycling: $\phi_1$=x; $\phi_2$=x, −x; $\phi_3$=x, x, −x, −x; $\phi_4$=x, −x; $\omega_5$=x, x, −x, −x; $\phi_6$=x, x, −x, −x; $\phi_7$=x; $\phi_8$=4x, 4(−x); $\phi_9$=x; $\phi_{10}$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_9$. Quadrature detection in $t_1$($^{13}$C) and $t_2$($^{15}$N) is accomplished by altering the phases $\phi_2$ and $\phi_7$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}$C steady state magnetization, a second data set with $\phi_1$=−x is collected. The sum and the difference of the two resulting data sets generate subspectra II and I, respectively, containing the central peaks and peak pairs.
Figure 3D:
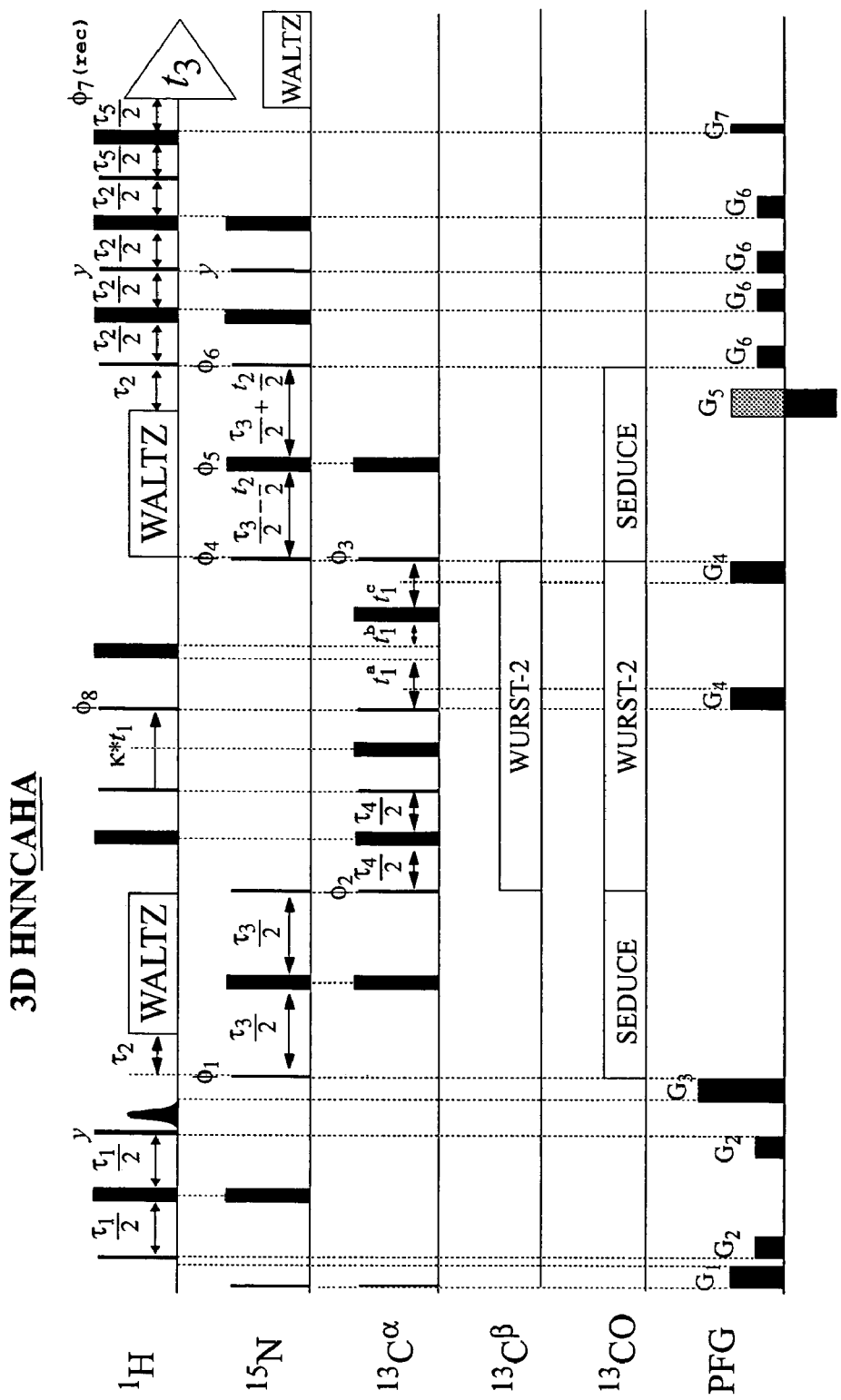
FIG. 3D illustrates the experimental scheme for the 3D HNNCAHA experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_8$=y. The scaling factor κ for $^1$H chemical shift evolution during $t_1$ is set to 1.0. The 90° pulse lengths were: 5.8 µs for $^1$H and 21.6 µs for $^{13}$C$^\alpha$, and 38 µs for $^{15}$N, where the 90° pulse width for $^{13}$C$^\alpha$ is adjusted to generate a null of excitation in the center of the CO chemical shift range. The selective 90° $^1$H pulse used to flip back the water magnetization is applied for the 1.8 ms with the SEDUCE-1 profile. WALTZ16 is employed to decouple $^1$H (r.f. field strength=9.2 kHz) during the heteronuclear magnetization transfers as well as to decouple of $^{15}$N (r.f.=1.78 kHz) during acquisition. SEDUCE is used for decoupling of $^{13}$CO (max. r.f.=3.0 kHz). WURST-2 is used for simultaneous band selective decoupling of $^{13}$CO and $^{13}$C$^\beta$ during $\tau_4$ and the $^1$H and $^{13}$C chemical shift evolution during $t_1$. 3.0 kHz sweeps at 176 ppm and 30 ppm, respectively, are used for decoupling of $^{13}$CO and $^{13}$C$^\beta$ (except for Ser, Thr, Ala). A sweep of 600 Hz is used at 14 ppm to decouple $^{13}$C$^\beta$ of Ala. The $^1$H r.f. carrier is placed at the position of the solvent line at 4.78 ppm for the first three $^1$H pulses and the first WALTZ period, then switched to 0 ppm during the first delay $\tau_4$/2, and subsequently switched back to the water line at 4.78 ppm during $t_1^c$. The $^{13}$C$^\alpha$ and $^{15}$N carriers are set to 56.1 ppm and 120.9 ppm, respectively. The duration and strengths of the pulsed z-field gradients (PFGs) are: G1 (500 µs, 8 G/cm); G2 (500 µs, 4 G/cm); G3 (1 ms, 30 G/cm); G4 (150 µs, 25 G/cm); G5 (1.25 ms, 30 G/cm); G6 (500 µs, 8 G/cm); G7 (125 µs, 29.57 G/cm). All PFG pulses are of rectangular shape. A recovery delay of at least 100 µs duration is inserted between a PFG pulse and an r.f. pulse. The delays have the following values: $\tau_1$=4.6 ms, $\tau_2$=5.5 ms, $\tau_3$=24 ms, $\tau_4$=2.0 ms, $\tau_5$=500 µs labeling is achieved in a semi constant-time fashion with $t_1^a$ (0)=1.065 ms, $t_1^b$ (0) 49 µs, $t_1^a$ (0)=984 µs, $\Delta t_1^a$=65 µs, $\Delta t_1^b$=49 µs, $\Delta t_1^c$=−16 µs. Hence, the fractional increase of the semi constant-time period with $t_1$ equals to $\lambda=1+\Delta t_1^c/\Delta t_1^a$=0.76. Note that the acquisition starts with the second complex point in $t_1$, while the first one is obtained by linear prediction. This ensures that a zero first-order phase correction is achieved along $\omega_1$. Phase cycling: $\phi_1$=x, −x; $\phi_2$=x, x, −x, −x; $\phi_3$=x, −x, −x, x; $\phi_4$=x; $\phi_5$=4(x), 4(−x); $\phi_6$=x; $\phi_7$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_6$. Quadrature detection in $t_1$($^{13}$C) and $t_2$($^{15}$N) is accomplished by altering the phases $\phi_2$ and $\phi_4$ according to States-TPPI (Cavanagh et al., *Protein NMR*
Figure 3E:
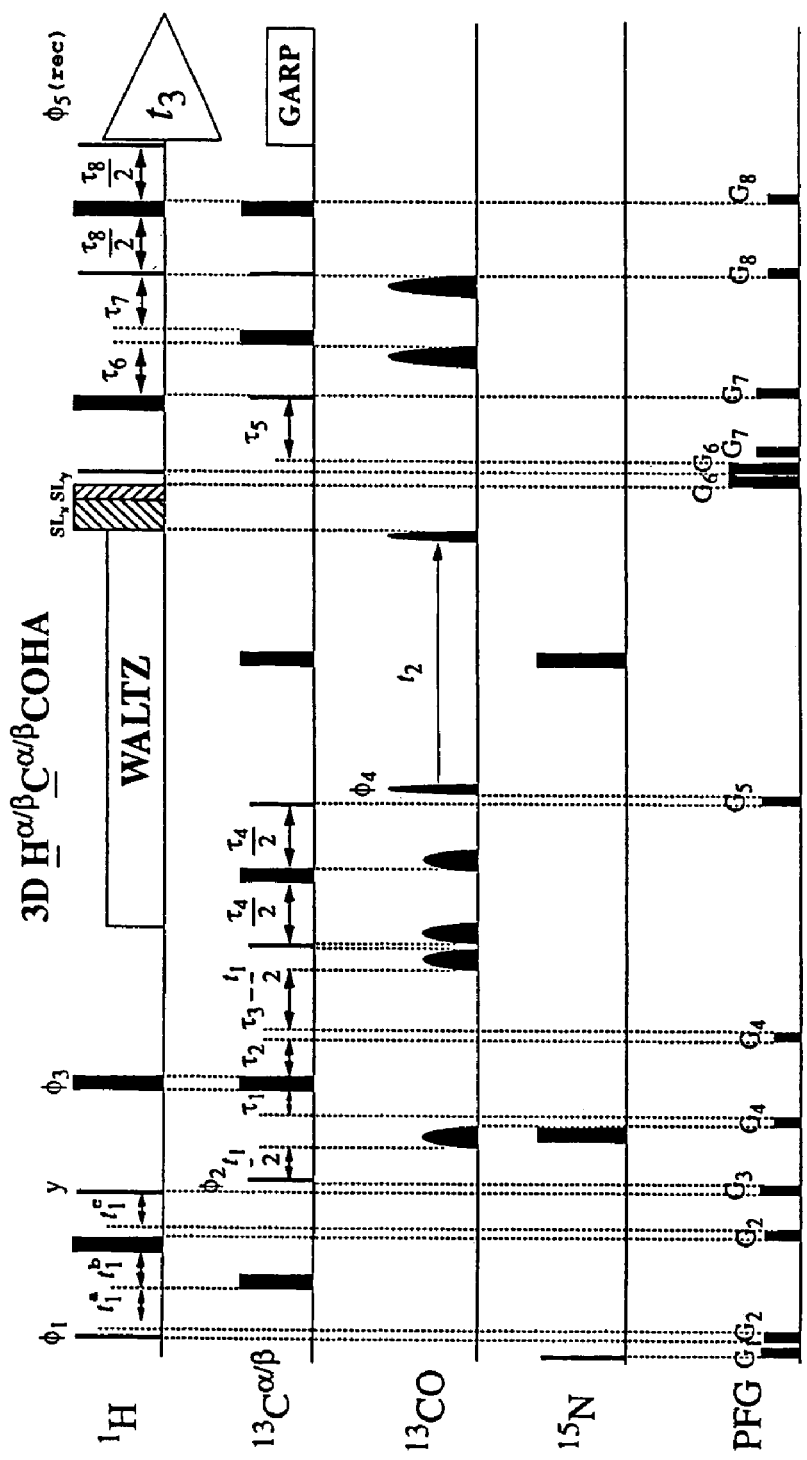

FIG. 3E illustrates the experimental scheme for the 3D H$^{\alpha/\beta}$C$^{\alpha/\beta}$COHA experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor κ for the $^1$H chemical shift evolution during t$_1$ is set to 1.0. The high power 90° pulse lengths were: 5.9 μs for $^1$H, 15.4 μs for $^{13}$C, and 38.2 μs for $^{15}$N. The 90° and 180° pulse lengths of $^{13}$C$^{\alpha/\beta}$ were adjusted to 47.4 μs and 42.4 μs, respectively, to minimize perturbation of $^{13}$CO spins. A 200 μs 180° pulse with SEDUCE profile is used to selectively invert $^{13}$CO magnetization prior to the start of t$_1$. The 90° and 180° pulses employed for excitation of $^{13}$CO and subsequent magnetization transfer back to $^{13}$C$^\alpha$ are of rectangular shape and 52 μs and 103 μs duration, respectively. The length of the spin-lock purge pulses SL$_x$ and SL$_y$ are 2.5 ms and 1 ms, respectively. WALTZ16 is employed to decouple $^1$H (r.f. field strength=9.2 kHz) during the heteronuclear magnetization transfers, and for decoupling of $^{15}$N (r.f.=1.78 kHz) during acquisition. GARP is used for decoupling of $^{13}$C$^\alpha$ (r.f.=2.5 kHz). The $^1$H r.f. carrier is placed at the position of the solvent line at 0 ppm before the start of the first semi constant time $^1$H evolution period and then switched to the water line at 4.78 ppm after the second 90° $^1$H pulse. Initially, the $^{13}$C and $^{15}$N r.f. carriers are set to 43 ppm and 120.9 ppm, respectively. The duration and strengths of the pulsed z-field gradients (PFGs) are: G1=G2 (100 μs, 15 G/cm); G3 (2 ms, 25 G/cm); G4 (100 μs, 10 G/cm); G5 (1 ms, 27 G/cm); G6 (3 ms, 30 G/cm); G7 (1.3 ms, 20 G/cm); G8 (130 μs, 14 G/cm). All PFG pulses are of rectangular shape. A recovery delay of at least 100 μs duration is inserted between a PFG pulse and an r.f. pulse. The delays are: $\tau_1$=800 μs, $\tau_2$=2.8 ms, $\tau_3$=3.6 ms, $\tau_4$=6.5 ms, $\tau_5$=1.8 ms, $\tau_6$=1 ms, $\tau_7$=2.8 ms, $\tau_8$=3.6 ms. $^1$H-frequency labeling is achieved in a semi constant-time fashion with t$_1^a$ (0)=1.7 ms, t$_1^b$ (0)=1 μs, t$_1^c$ (0)=1.701 ms, $\Delta t_1^a$=33.3 μs, $\Delta t_1^b$=19.3 μs, $\Delta t_1^c$=−14 μs. Hence, the fractional increase of the semi constant-time period with t$_1$ equals to λ=1+$\Delta t_1^c$/$\Delta t_1^a$=0.58. Phase cycling: $\phi_1$=x; $\phi_x$=x, −x; $\phi_3$=x, −x, x, −x; $\phi_4$=x; $\phi_5$(receiver)=x, −x. Quadrature detection in t$_1$($^{13}$C) and t$_2$($^{15}$N) is accomplished by altering the phases $\phi_2$ and $\phi_4$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}$C steady state magnetization, a second data set with $\phi_1$=−x is collected. The sum and the difference of the two resulting data sets generate subspectra II and I, respectively, containing the central peaks and peak pairs (Szyperski et al., *J. Am. Chem. Soc.*, 118:8146-8147 (1996), which is hereby incorporated by reference in its entirety).

Figure 3F:
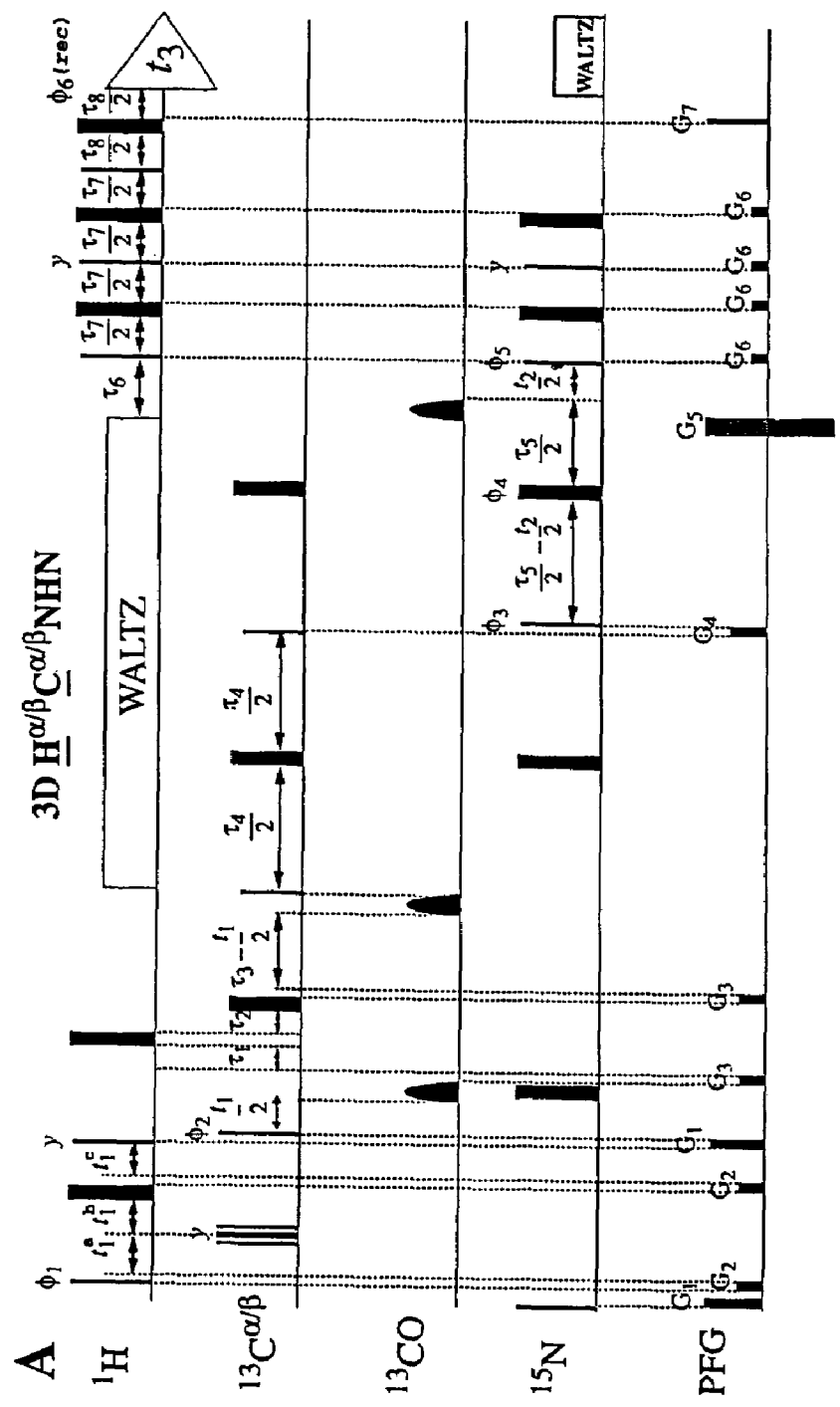

FIG. 3F illustrates the experimental scheme for the 3D H$^{\alpha/\beta}$C$^{\alpha/\beta}$NHN experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor κ for the $^1$H chemical shift evolution during t$_1$ is set to 1.0. The high power 90° pulse lengths were: 5.9 μs for $^1$H and 15.4 μs for $^{13}$C, and 38 μs for $^{15}$N. Pulses on $^{13}$C prior to t$_1$($^{13}$C) are applied at high power, and $^{13}$C decoupling during t$_1$($^1$H) is achieved using a (90$_x$-180$_y$-90$_x$) composite pulse. Subsequently, the 90° and 180° pulse lengths of $^{13}$C$^{\alpha/\beta}$ are adjusted to 49 μs and 43.8 μs to minimize perturbation of $^{13}$CO spins. SEDUCE 180° pulses of 200 μs pulse length are used to decouple $^{13}$CO. WALTZ16 is employed to decouple $^1$H (r.f. field strength=9.2 kHz) during the heteronuclear magnetization transfers, as well as to decouple $^{15}$N (r.f.=1.78 kHz). The $^1$H carrier is placed at the position of the solvent line at 0 ppm during the first semi constant time $^1$H evolution period, and then switched to the water line 4.78 ppm after the second 90° $^1$H pulse. The $^{13}$C and $^{15}$N r.f. carriers are set to 43 ppm and 120.9 ppm, respectively. The duration and strengths of the pulsed z-field gradients (PFGs) are: G1 (1 ms, 24 G/cm); G2 (500 μs, 8 G/cm); G3 (250 μs, 15 G/cm); G4 (1 ms, 11 G/cm); G5 (500 μs, 20 G/cm); G6 (500 μs, 4 G/cm); G7 (125 μs, 29.5 G/cm). All PFG pulses are of rectangular shape. The delays are: $\tau_1$=800 μs, $\tau_2$=2.8 ms, $\tau_3$=3.3 ms, $\tau_4$=7.2 ms, $\tau_5$=24 ms, $\tau_6$=5.4 ms, $\tau_7$=4.8 ms, $\tau_8$=1 ms. $^1$H-frequency labeling is achieved in a semi constant-time fashion with t$_1^a$ (0)=1.7 ms, t$_1^b$ (0)=1 μs, t$_1^c$ (0)=1.701 ms, $\Delta t_1^a$=33.3 μs, $\Delta t_1^b$=19.3 μs, $\Delta t_1^c$=−14 μs. Hence, the fractional increase of the semi constant-time period with t$_1$ equals to λ=1+$\Delta t_1^c$/$\Delta t_1^a$=0.58. Phase cycling: $\phi_1$=x; $\phi_2$=x; $\phi_3$=x, −x; $\phi_4$=x, x, −x, −x; $\phi_5$=x; $\phi_6$(receiver)=x, −x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_5$. Quadrature detection in t$_1$($^{13}$C) and t$_2$($^{15}$N) is accomplished by altering the phases $\phi_2$ and $\phi_3$, respectively, according to States-TPPI. For acquisition of central peaks derived from $^{13}$C steady state magnetization, a second data set with $\phi_1$=−x is collected. The sum and the difference of the two resulting data sets generate subspectra II and I, respectively, containing the central peaks and peak pairs.

Figure 3G:
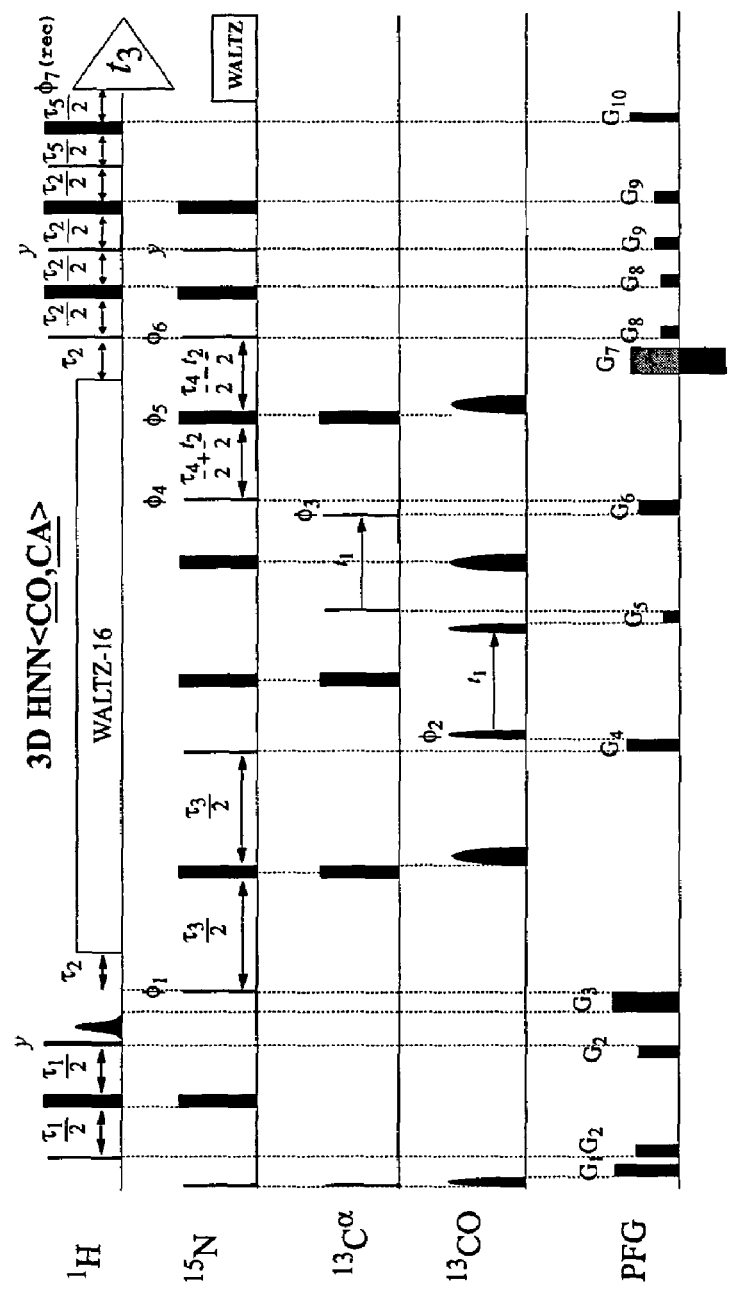

FIG. 3G illustrates the experimental scheme for the 3D HNN<CO,CA> experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_3$=y. The scaling factor κ for $^{13}$C$^\alpha$ chemical shift evolution during t$_2$ is set to 0.5. The high power 90° pulse lengths were: 5.8 μs for $^1$H and 38.5 μs for $^{15}$N. The 90° and 180° pulse lengths of $^{13}$C$^\alpha$ were adjusted 54 μs and 48.8 μs to minimize perturbation of $^{13}$Co spins. The length of the 90° pulses applied on $^{13}$CO are 102 μs, and they possess the shape of a sinc center lobe. The corresponding 180° pulses are applied with same power and shape. The selective $^1$H 90° pulse used for flip-back of water magnetization is applied for 1.8 ms with the SEDUCE-i profile. WALTZ16 is employed to decouple $^1$H (r.f. field strength=9.2 kHz) during the heteronuclear magnetization transfers as well as to decouple $^{15}$N during acquisition (r.f.=1.78 kHz). The SEDUCE sequence is used for decoupling of $^{13}$C' during $^{15}$N evolution period (r.f. 0.9 kHz). The $^{13}$C$^\alpha$ and $^{15}$N r.f. carriers are set to 176.5 ppm and 120.9 ppm, respectively. The duration and strengths of the pulsed z-field gradients (PFGs) are: G1 (500 μs, 30 G/cm); G2 (500 μs, 5 G/cm); G3 (2 ms, 13 G/cm); G4 (750 μs, 20 G/cm); G5 (200 μs, 5 G/cm); G6 (100 μs, 12 G/cm); G7 (1.25 ms, 30 G/cm); G8 (300 μs, 5 G/cm); G9 (200 μs, 10 G/cm); G10 (125 μs, 29.5 G/cm). All PFG pulses are of rectangular shape. A recovery delay of at least 100 μs duration is inserted between a PFG pulse and an r.f. pulse. The delays are: $\tau_1$=4.6 ms, $\tau_2$=5.5 ms, $\tau_3$=$\tau_4$=28 ms, $\tau_5$=1 ms. Phase cycling: $\phi_1$=x, x, −x, −x; $\phi_2$=x, −x, $\phi_3$=x; $\phi_4$=x; $\phi_5$=4(x), 4(−x); $\phi_6$=x; $\phi_7$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_6$. Quadrature detection in t$_1$($^{13}$C) and $t_2(^{15}N)$ is accomplished by altering the phases $\phi_2$ and $\phi_4$, respectively, according to States-TPPI (Cavanagh et al., *Protein NMR Spectroscopy*, Academic Press, San Diego, (1996), which is hereby incorporated by reference in its entirety). To shift the apparent $^{13}C^{\alpha}$ carrier position to 82.65 ppm, i.e., downfield to all $^{13}C^{\alpha}$ resonances, $\phi_3$ is incremented in 60° steps according to TPPI. Note, that the acquisition was started with the ninth complex point and the first eight complex points along $\omega_1(^{13}CO)$ were obtained by linear prediction. This ensures that a zero first-order phase correction is achieved along $\omega_1$ (Szyperski et al., *J. Magn. Reson.*, B 108: 197-203 (1995), which is hereby incorporated by reference in its entirety).

Figure 3H:
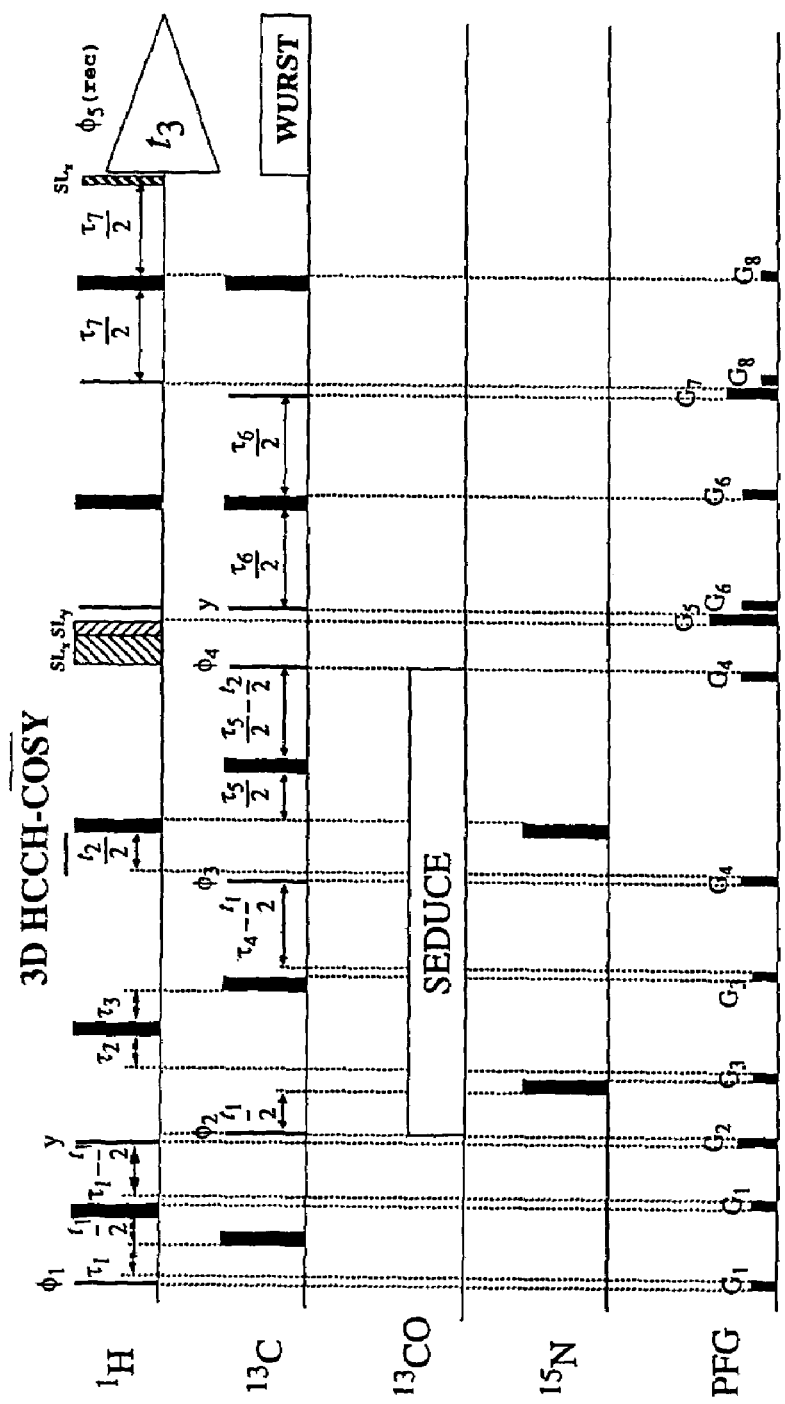

FIG. 3H illustrates the experimental scheme for the 3D HCCH-COSY experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor $\kappa$ for $^1H$ chemical shift evolution during $t_1$ is set to 1.0. The high power 90° pulse lengths were: 5.8 μs for $^1H$ and 15.4 μs for $^{13}C$, and 38 μs for $^{15}N$. The lengths of the $^1H$ spin-lock purge pulses are: first $SL_x$, 2.8 ms; second $SL_x$, 1.7 ms; $SL_y$: 4.9 ms. SEDUCE is used for decoupling of $^{13}CO$ during $t_1$ and $t_2$(r.f. field strength=1 kHz). WURST is used for decoupling of $^{13}C$ during acquisition. The $^1H$ carrier is placed at the position of the solvent line at 0 ppm before the start of the first semi constant time $^1H$ evolution period, and then switched to the water line at 4.78 ppm after the second 90° $^1H$ pulse. The $^{13}C$ and $^{15}N$ r.f. carriers are set to 38 ppm and 120.9 ppm, respectively. The duration and strengths of the pulsed z-field gradients (PFGs) are: G1 (500 μs, 6 G/cm); G2 (500 μs, 7 G/cm); G3 (100 μs, 12 G/cm); G4 (100 μs, 12.5 G/cm); G5 (2 ms, 9 G/cm); G6 (500 μs, 5 G/cm); G7 (1.5 ms, 8 G/cm); G8 (400 μs, 6 G/cm). All gradients are applied along z-axis and are of rectangular shape. All PFG pulses are of rectangular shape. A recovery delay of at least 100 μs duration is inserted between a PFG pulse and an r.f. pulse. The delays are: $\tau_1$=1.6 ms, $\tau_2$=850 μs, $\tau_3$=2.65 ms, $\tau_4$=3.5 ms, $\tau_5$=7 ms, $\tau_6$=1.6 ms, $\tau_7$=3.2 ms. Phase cycling: $\phi_1$=x; $\phi_2$=x, -x; $\phi_3$=x, -x; $\phi_4$=x; $\phi_5$(receiver)=x, -x. Quadrature detection in $t_1(^{13}C)$ and $t_2(^{13}C)$ is accomplished by altering the phases $\phi_1$ and $\phi_3$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1$=-x is collected. The sum and the difference of the two resulting data sets generate subspectra II and I, respectively, containing the central peaks and peak pairs.

Figure 3I:
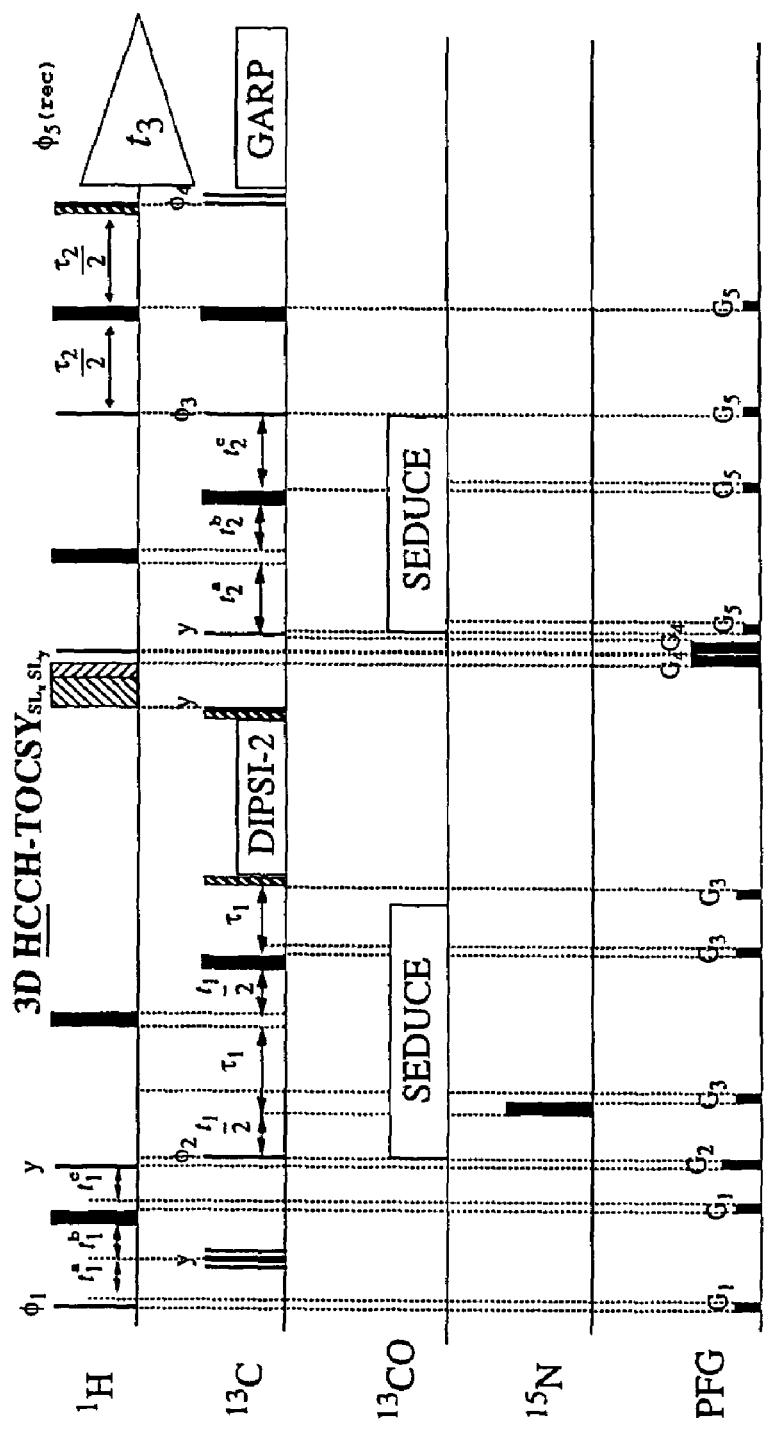

FIG. 3I illustrates the experimental scheme for the 3D HCCH-TOCSY experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_1$=y. The scaling factor $\kappa$ for $^1H$ chemical shift evolution during $t_1$ is set to 1.0. The high power 90° pulse lengths were: 5.8 μs for $^1H$ and 15.4 μs for $^{13}C$, and 38 μs for $^{15}N$. $^{13}C$ decoupling during $t_1(^1H)$ is achieved using a $(90_x-180_y-90_x)$ composite pulse. The lengths of the $^1H$ spin-lock purge pulses are: first $SL_x$, 5.7 ms; second $SL_x$, 0.9 ms; $SL_y$, 4.3 ms. SEDUCE is used for decoupling of $^{13}CO$ during $t_1$ and $t_2$(r.f. field strength=1 kHz), and GARP is employed for decoupling of $^{13}C$ during acquisition (r.f.=2.5 kHz). The $^1H$ r.f. carrier is placed at the position of the solvent line at 0 ppm before the start of the first semi constant time $^1H$ evolution period, and then switched to the water line at 4.78 ppm after the second 90° $^1H$ pulse. The $^{13}C^{\alpha}$ and $^{15}N$ r.f. carriers are set to 38 ppm and 120.9 ppm, respectively. The length of $^{13}C$ spin-lock purge pulses denoted $SL_x$ are of 2 ms duration. $^{13}C$ isotropic mixing is accomplished using the DIPSI-2 scheme (r.f.=8.5 kHz). The duration and strengths of the pulsed z-field gradients (PFGs) are: G1 (100 μs, 16 G/cm); G2 (2 ms, 15 G/cm); G3 (300 μs, 8 G/cm); G4 (500 μs, 30 G/cm); G5 (100 μs, 16 G/cm). All PFG pulses are of rectangular shape. A recovery delay of at least 100 μs duration is inserted between a PFG pulse and an r.f. pulse. The delays are: $\tau_1$=850 μs, $\tau_2$=3.2 ms. $^1H$-frequency labeling in $t_1$ is achieved in a semi constant-time fashion with $t_1^a(0)$=1.7 ms, $t_1^b(0)$=1 μs, $t_1^c(0)$=1.701 ms, $\Delta t_1^a$=33.3 μs, $\Delta t_1^b$=19.3 μs, $\Delta t_1^c$=-14 μs. $^{13}C$-frequency labeling in $t_2$ is achieved in a semi constant-time fashion with $t_2^a(0)$=1120 μs, $t_2^b(0)$=62.5 μs, $t_2^c(0)$=995 μs, $\Delta t_2^b$=125 μs, $\Delta t_2^c$=-35 μs. These delays ensure that a 90° first-order phase correction is obtained along $\omega_2(^{13}C)$. The fractional increases of the semi constant-time period in $t_1$ equals to $\lambda$=1+$\Delta t_2^c/\Delta t_2^a$=0.58, and in $t_2$ equals to $\lambda$=1+$\Delta t_2^c/\Delta t_2^a$=0.78. Phase cycling: $\phi_{1=x}$; $\phi_2$=x, -x; $\phi_3$=x; $\phi_4$=2(x), 2(-x); $\phi_5$ (receiver)=x,-x. Quadrature detection in $t_1(^{13}C)$ and $t_2(^{13}C)$ is accomplished by altering the phases $\phi_2$ and $\phi_3$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1$=-x is collected. The sum and the difference of the two resulting data sets generate subspectra II and I, respectively, containing the central peaks and peak pairs.

Figure 3J:
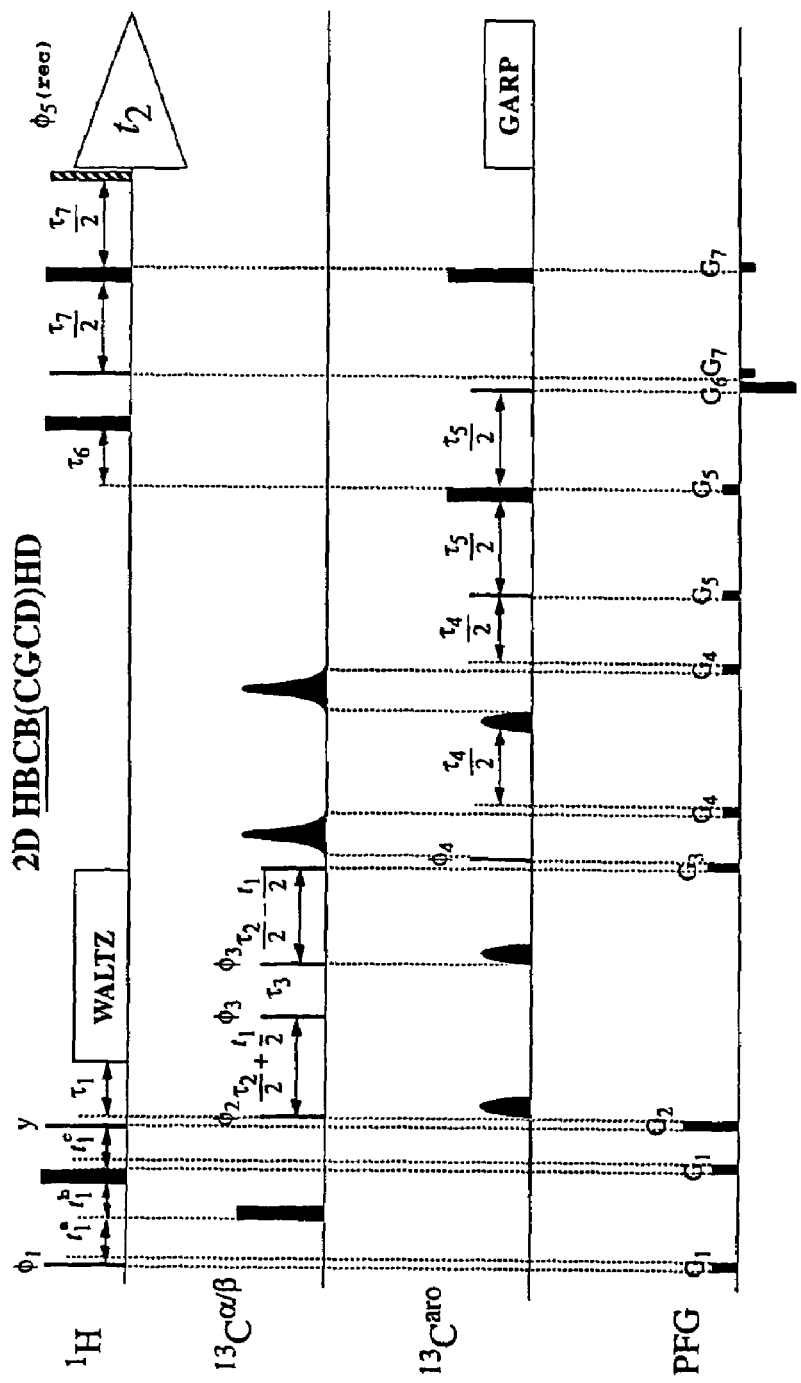

FIG. 3J illustrates the experimental scheme for the 2D HBCB(CGCD)HD experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, 4)=y. The scaling factor $\kappa$ for $^1H$ chemical shift evolution during $t_1$ is set to 1.0. The high power 90° pulse lengths were: 5.8 μs for $^1H$ and 15.4 μs for $^{13}C$. The first 180° pulse on $^{13}C$ prior to $t_1(^{13}C)$ is applied at high power. Subsequently, the 90° pulse lengths of $^{13}C^{\beta}$ is adjusted to 66 μs. The 180° $^{13}C^{\beta}$ and $^{13}C^{aro}$ pulses are of gaussian-3 shape and 375 μs duration. WALTZ16 is used for decoupling of $^1H$ (r.f. field strength=4.5 kHz) during the magnetization transfer from $^{13}C^{\alpha}$ to $^{13}C^{aro}$, and GARP is employed to decouple $^{13}C^{aro}$ (r.f.=2.5 kHz) during acquisition. The $^1H$ r.f. carrier is placed at 0 ppm before the start of the semi constant time $^1H$ evolution period, and then switched to the water line at 4.78 ppm after the second 90° $^1H$ pulse. The $^{13}C$ r.f. carrier is set to 38 ppm during $\omega_1(^{13}C^{\beta})$ and then switched to 131 ppm before the first 90° pulse on $^{13}C^{aro}$ (pulse labeled with $\phi_4$). The duration and strengths of the pulsed z-field gradients (PFGs) are: G1 (500 μs, 2 G/cm); G2 (1 ms, 22 G/cm); G3 (2 ms, 10 G/cm); G4 (1 ms, 5 G/cm); G5 (500 μs, 4 G/cm); G6 (1 ms, -14 G/cm); G7 (500 μs, -2 G/cm). All PFG pulses are of rectangular shape. A recovery delay of at least 100 μs duration is inserted between a PFG pulse and an r.f. pulse. The delays are: $\tau_1$=1.8 ms, $\tau_2$=8.8 ms, $\tau_3$=71 μs, $\tau_4$=5.4 ms, $\tau_5$=4.2 ms, $\tau_6$=710 μs, $\tau_7$=2.5 ms. $^1H$-frequency labeling is achieved in a semi constant-time fashion with $t_1^a(0)$=1.7 ms, $t_1^b(0)$=1 μs, $t_1^c(0)$=1.701 ms, $\Delta t_1^a$=33.3 μs, $\Delta t_1^b$=19.3 μs, $\Delta t_1^c$=-14 μs. Hence, the fractional increase of the semi constant-time period with $t_1$ equals to $\lambda$=1+$\Delta t_1^c/\Delta t_1^a$=0.58. Phase cycling: $\phi_1$=x; $\phi_2$=x; $\phi_3$=x, y, -x, -y; $\phi_4$=4(x), 4(-x); $\phi_5$ (receiver)=x, -x, x, -x, -x, x, -x, x. Quadrature detection in $t_1(^{13}C)$ is accomplished by altering the phases $\phi_2$ respectively, according to States-TPPI. For acquisition of central peaks derived from $^{13}C$ steady state magnetization, a second data set with $\phi_1=-x$ is collected. The sum and the difference of the two resulting data sets generate subspectra II and I, respectively, containing the central peaks and peak pairs.

Figure 3K:
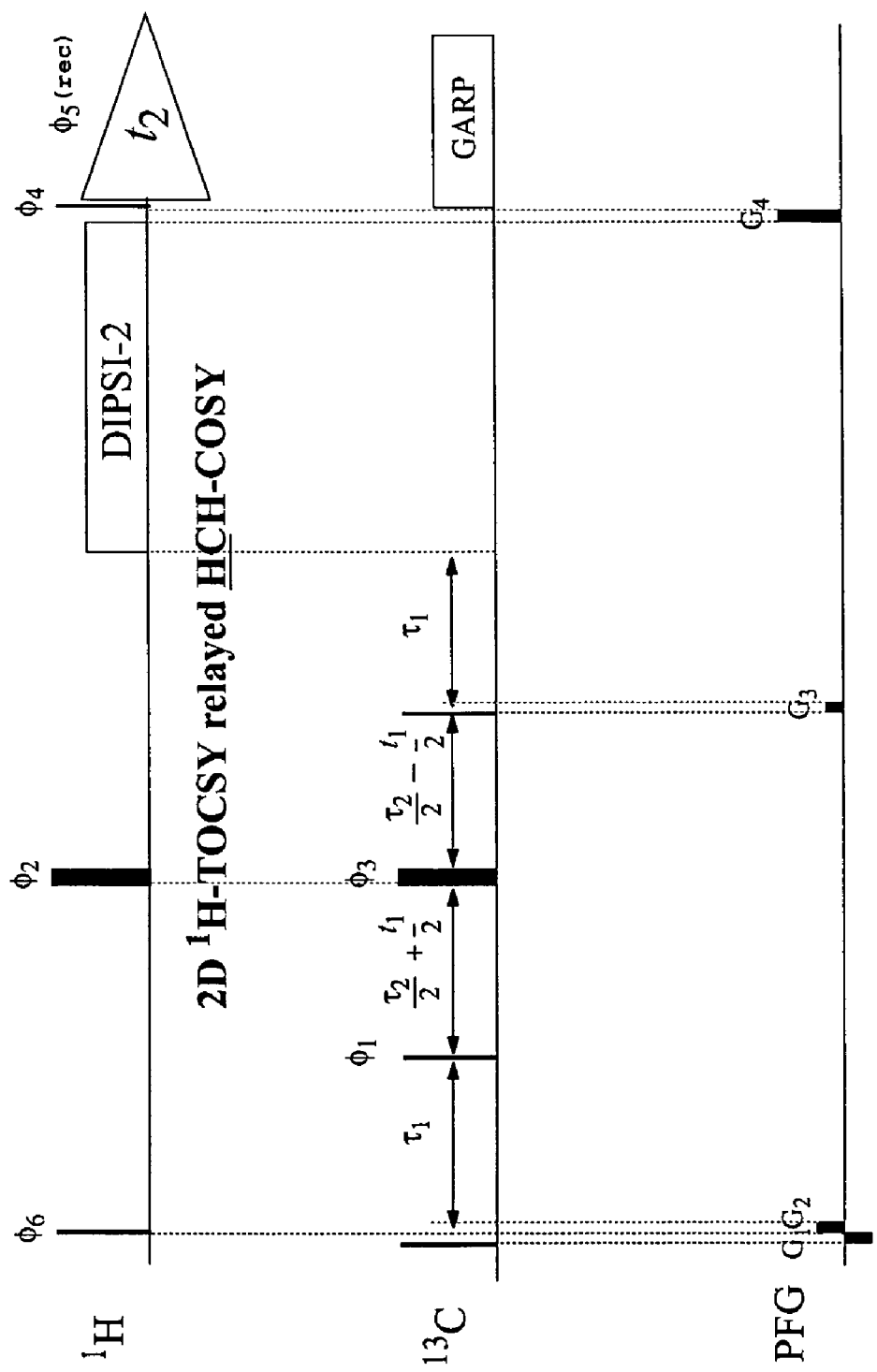

FIG. 3K illustrates the experimental scheme for the 2D $^1$H-TOCSY-relayed-HCH-COSY experiment. Rectangular 90° and 180° pulses are indicated by thin and thick vertical bars, respectively, and phases are indicated above the pulses. Where no radio-frequency (r.f.) phase is marked, the pulse is applied along x. In order to accomplish sine modulation, $\phi_6=y$. The high-power 90° pulse lengths were: 5.9 μs for $^1$H and 15.4 μs for $^{13}$C. The $^1$H r.f. carrier is placed at the position of the solvent line at 4.78 ppm, and the $^{13}$C carrier is set to 131 ppm. GARP is used for $^{13}$C decoupling during acquisition (r.f. field strength=2.5 kHz), and $^1$H isotropic mixing is accomplished using the DIPSI-2 scheme (r.f.=16 kHz). The duration and strengths of the pulsed z-field gradients (PFGs) are: G1 (1 ms, −10 G/cm); G2 (500 μs, 6 G/cm); G3 (500 μs, 7.5 G/cm); G4 (1 ms, 22 G/cm). All PFG pulses are of rectangular shape. A recovery delay of at least 100 μs duration is inserted between a PFG pulse and an r.f. pulse. The delays are: $\tau_1=3.0$ ms, $\tau_2=15.38$ ms. Phase cycling: $\phi_1=x, -x$; $\phi_2=x, x, y, y, -x, -x, -y, -y$; $\phi_3=4(x), 4(y), 4(-x), 4(-y)$; $\phi_4=x, x, -x, -x$; $\phi_5$(receiver)=x, -x, x, -x, -x, x, -x, x. Quadrature detection in $t_1(^{13}C)$ is accomplished by altering the phase $\phi_1$ according to States-TPPI.

Figure 4:
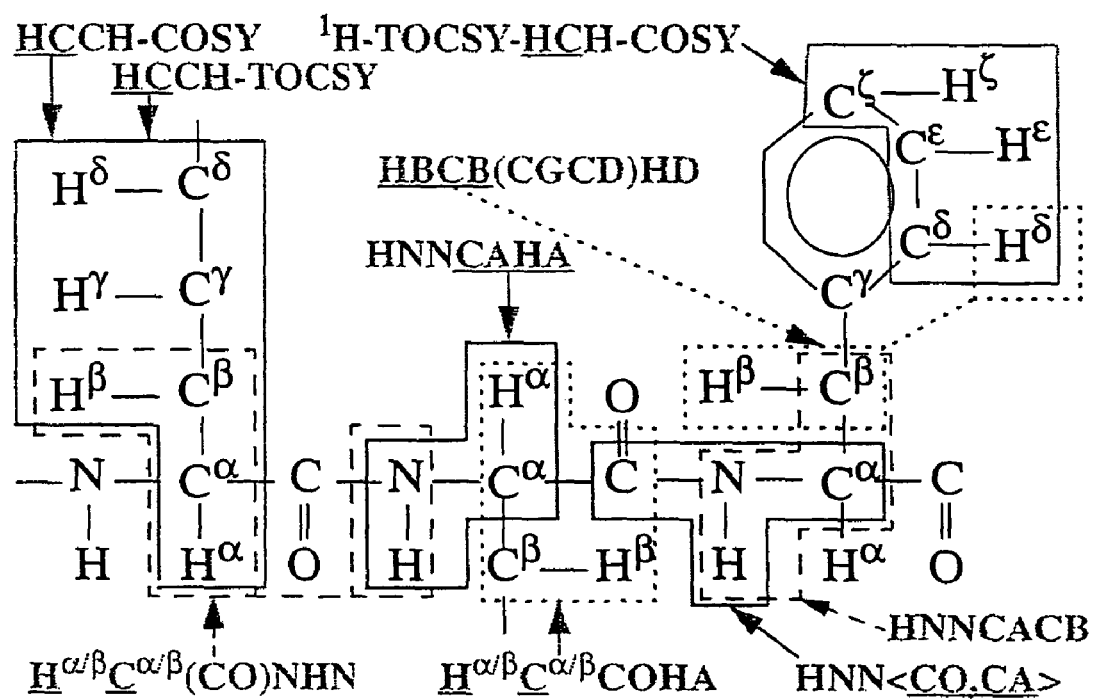

FIG. 4 illustrates the polypeptide chemical shifts correlated by the various spectra constituting the TR NMR experiments identified for efficient HTP resonance assignment of proteins. The nuclei for which the chemical shifts are obtained from a given experiment are boxed and labeled accordingly.

Figure 5:
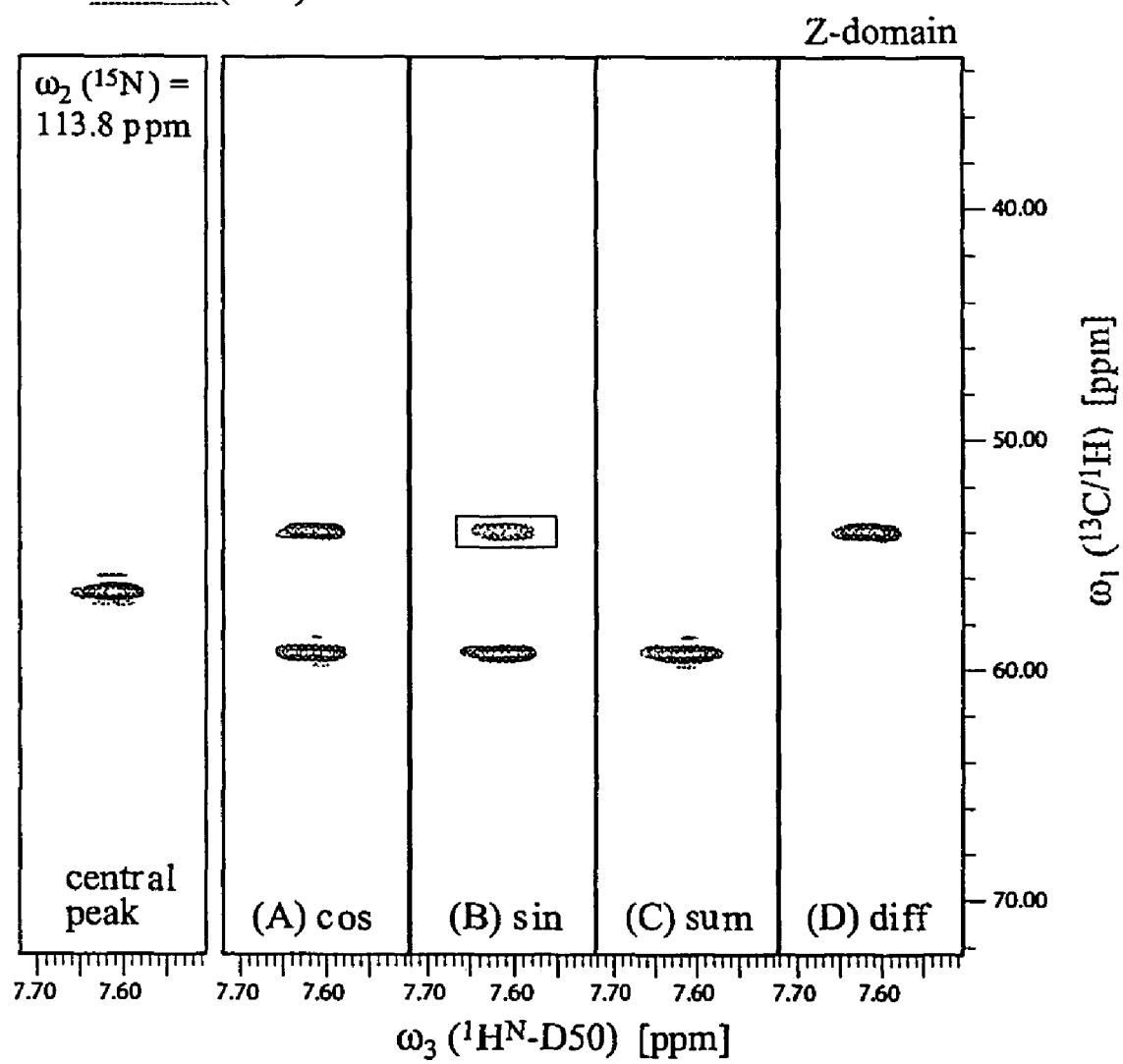

FIG. 5 shows a composite plot of $[\omega_1(^{13}C/^1H),\omega_3(^1H^N)]$-strips taken from 3D HACA(CO)NHN spectrum obtained for Z-domain protein with a total measurement time of 6.7 hours. The 3D NMR data were acquired with $40(t_1) \times 28(t_2) \times 512(t_3)$ complex points and $t_{1max}(^{13}C^\alpha; ^1H^\alpha)=6.5$ ms, $t_{2max}(^{15}N)=20.8$ ms, and $t_{3max}(^1H^N)=73.2$ ms. Data acquisition and processing were performed as shown in FIG. 1. The central peaks were acquired from steady state $^{13}$C magnetization. The strip labeled "central peak" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peak shows opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{15}$N chemical shift (113.8 ppm) of Asp 50 along $\phi_2(^{15}N)$ and centered about the corresponding amide proton shifts detected along $\omega_3(^1H^N)$. $^1$H, $^{13}$C, and $^{15}$N chemical shifts are in ppm relative to 2,2-dimethyl-2-silapentane-5-sulfonate sodium salt (DSS).

Figure 6:
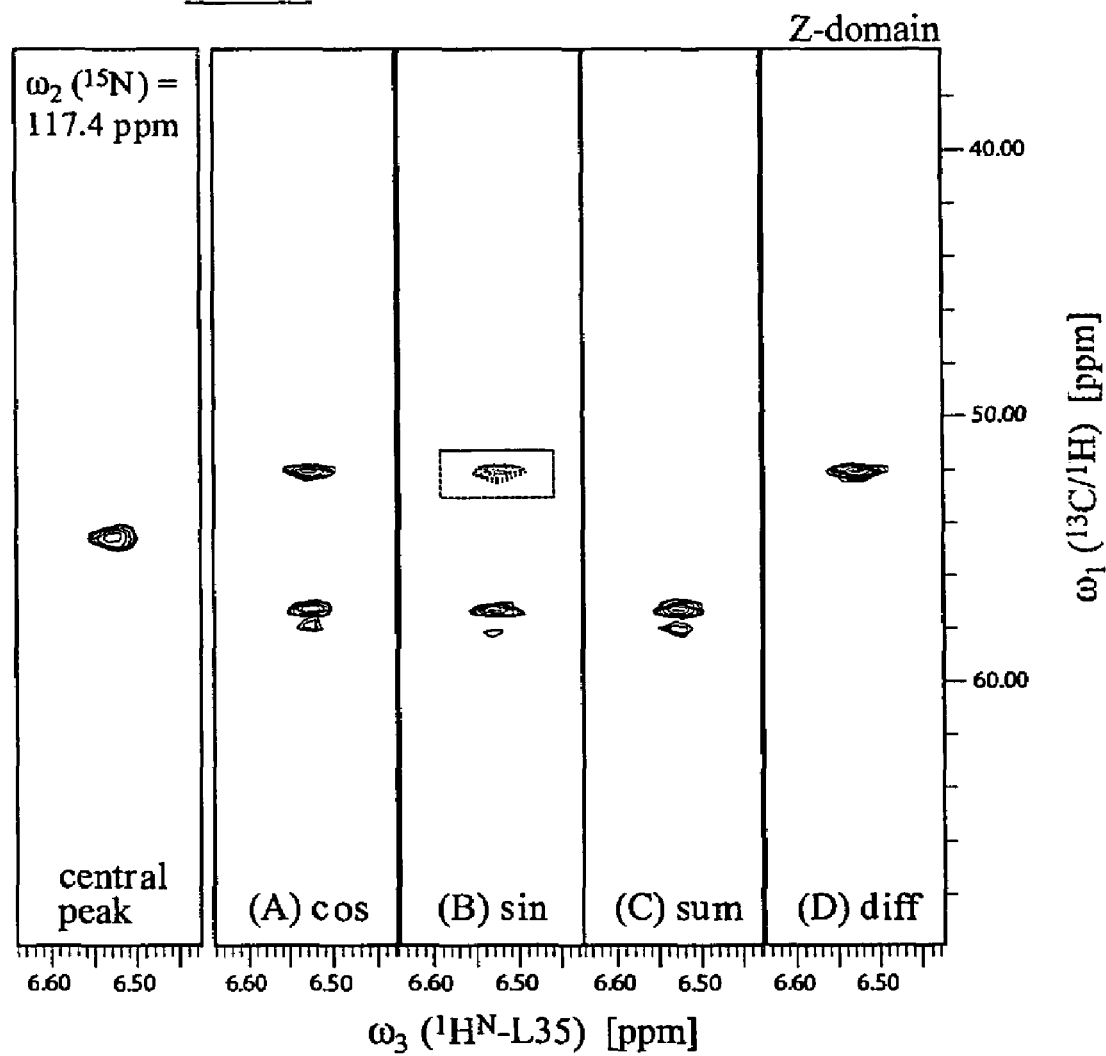

FIG. 6 shows a composite plot of $[\omega_1(^{13}C/^1H),\omega_3(^1H^N)]$-strips taken from 3D HNNCAHA spectrum obtained for Z-domain protein with a total measurement time of 10.7 hours. The 3D NMR data were acquired with $64(t_1) \times 28(t_2) \times 512(t_3)$ complex points and $t_{1max}(^{13}C^\alpha; ^1H^\alpha)=12.1$ ms, $t_{2max}(^{15}N)=20.8$ ms, and $t_{3max}(^1H^N)=73.2$ ms. Data acquisition and processing were performed as shown in FIG. 1. The central peaks were acquired from incomplete INEPT transfer of the $^{13}$C magnetization. The strip labeled "central peak" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peak shows opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{15}$N chemical shift (117.4 ppm) of Leu 35 along $\omega_2(^{15}N)$ and centered about the corresponding amide proton shifts detected along $\omega_3(^1H^N)$. $^1$H, $^{13}$C, and $^{15}$N chemical shifts are in ppm relative to DSS.

Figure 7:
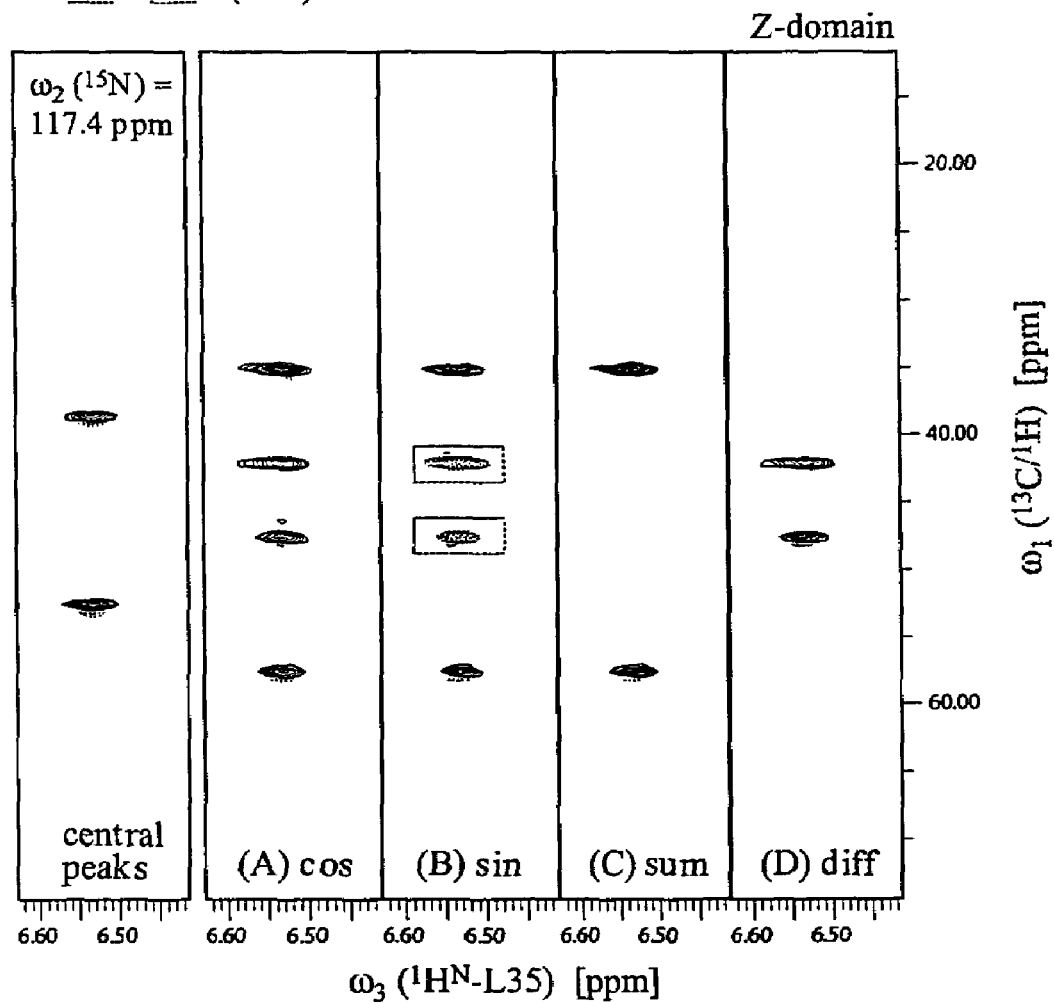

FIG. 7 shows a composite plot of $[\omega_1(^{13}C/^1H),\omega_3(^1H^N)]$-strips taken from 3D $H^{\alpha/\beta}C^{\alpha/\beta}$(CO)NHN spectrum obtained for Z-domain protein with a total measurement time of 12.7 hours. The 3D NMR data were acquired with $76(t_1) \times 28(t_2) \times 512(t_3)$ complex points and $t_{1max}(^{13}C^{\alpha/\beta}; ^1H^{\alpha/\beta})=6.25$ ms, $t_{2max}(^{15}N)=20.8$ ms, and $t_{3max}(^1H^N)=73.2$ ms. Data acquisition and processing were performed as shown in FIG. 1. The central peaks were acquired from steady state $^{13}$C magnetization. The strip labeled "central peaks" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{15}$N chemical shift (117.4 ppm) of Leu 35 along $\omega_2(^{15}N)$ and centered about the corresponding amide proton shifts detected along $\omega_3(^1H^N)$. $^1$H, $^{13}$C, and $^{15}$N chemical shifts are in ppm relative to DSS.

Figure 8:
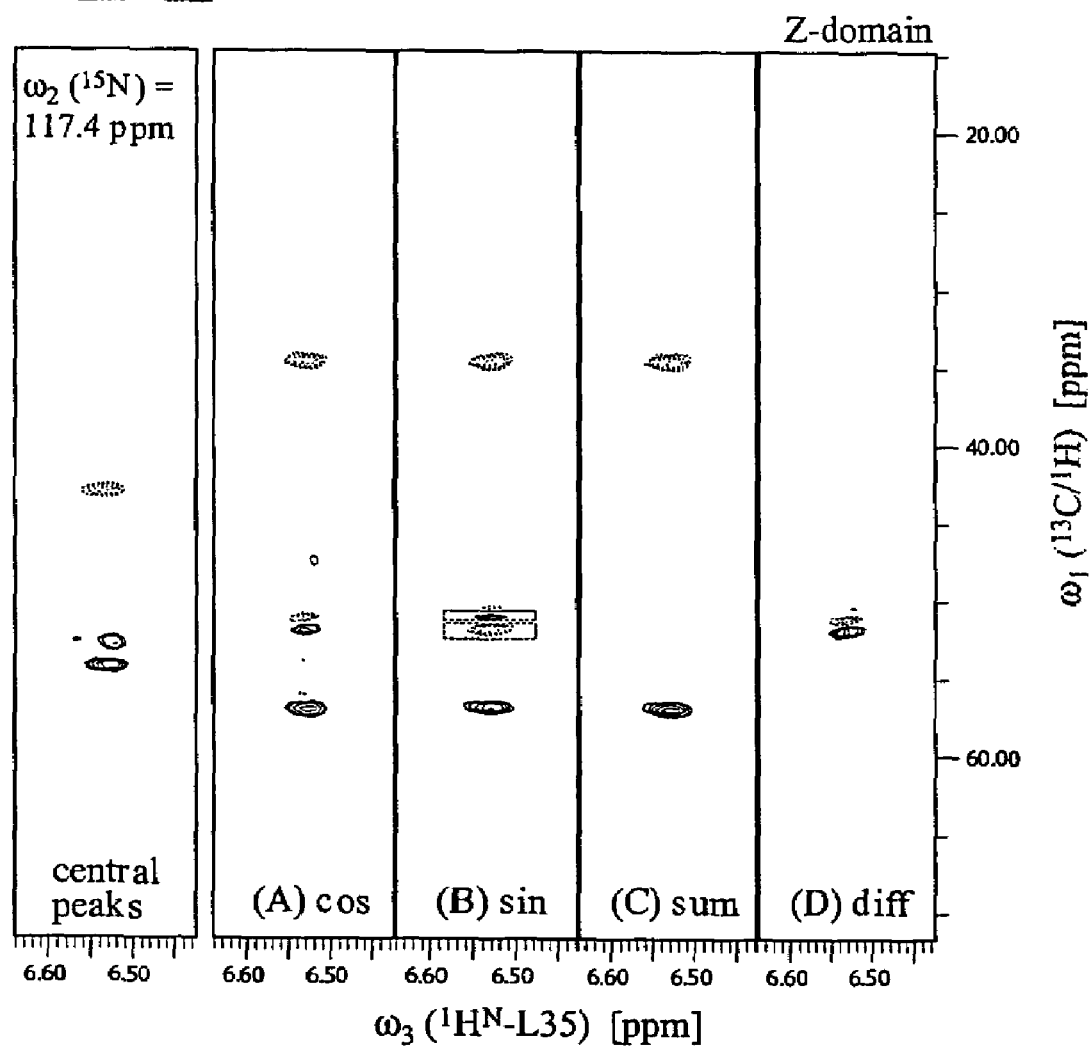

FIG. 8 shows a composite plot of $[\omega_1(^{13}C/^1H),\omega_3(^1H^N)]$-strips taken from 3D $H^{\alpha/\beta}C^{\alpha/\beta}$NHN spectrum obtained for Z-domain protein with a total measurement time of 11.4 hours. The 3D NMR data were acquired with $68(t_1) \times 28(t_2) \times 512(t_3)$ complex points and $t_{1max}(^{13}C^{\alpha/\beta}; ^1H^{\alpha/\beta})=5.6$ ms, $t_{2max}(^{15}N)=20.8$ ms, and $t_{3max}(^1H^N)=73.2$ ms. Data acquisition and processing were performed as shown in FIG. 1. The central peaks were acquired from steady state $^{13}$C magnetization. The strip labeled "central peaks" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{15}$N chemical shift (117.4 ppm) of Leu 35 along $\omega_2(^{15}N)$ and centered about the corresponding amide proton shifts detected along $\omega_3(^1H^N)$. $^1H$, $^{13}C$, and $^{15}N$ chemical shifts are in ppm relative to DSS.

Figure 9:
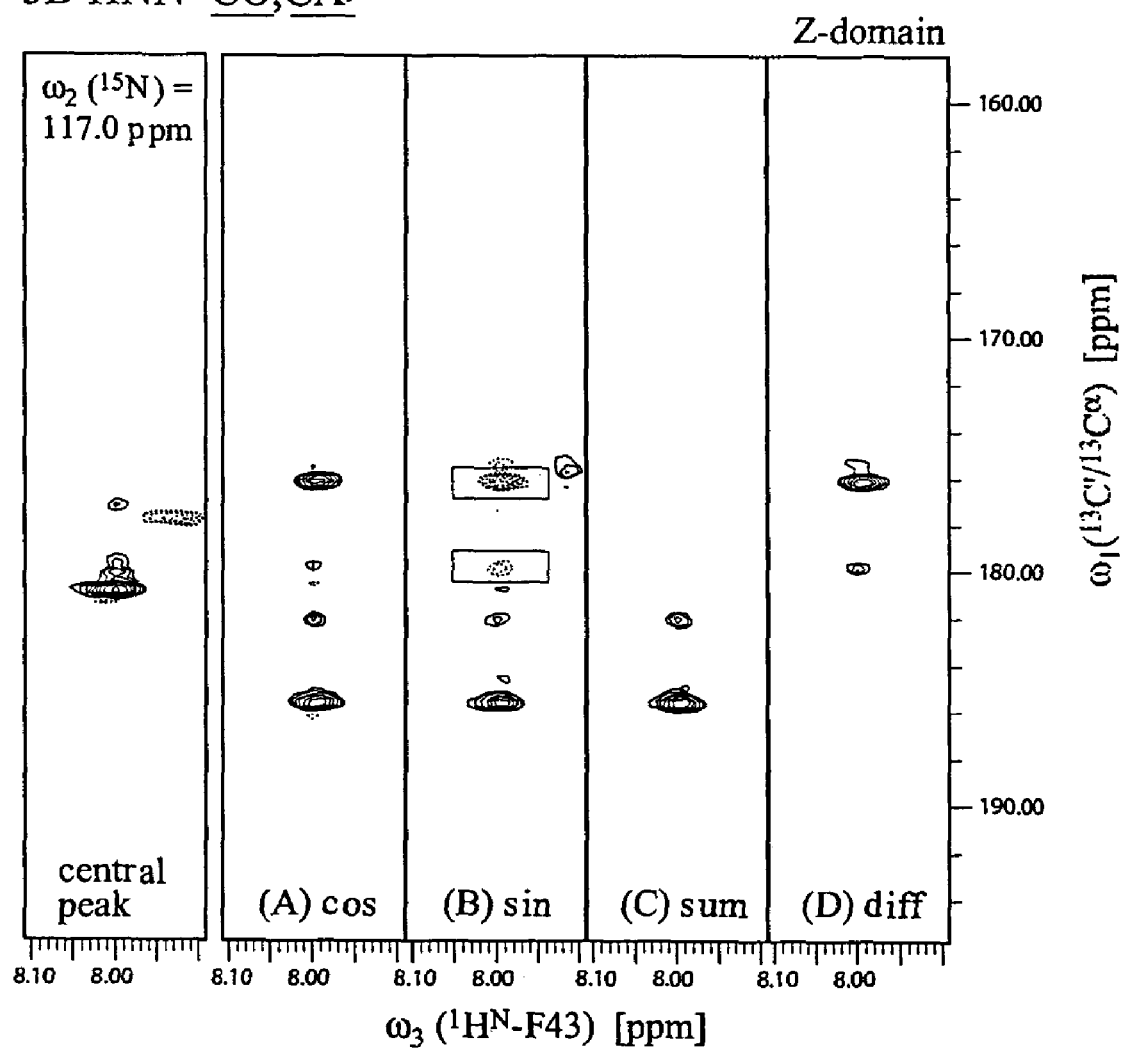

FIG. 9 shows a composite plot of $[\omega_1(^{13}C/^{13}C^\alpha),\omega_3(^1H^N)]$-strips taken from 3D HNN<CO,CA> spectrum obtained for Z-domain protein with a total measurement time of 9.4 hours. The 3D NMR data were acquired with $56(t_1) \times 28(t_2) \times 512(t_3)$ complex points and $t_{1max}(^{13}C; ^{13}C^\alpha) = 6.9$ ms, $t_{2max}(^{15}N) = 20.8$ ms, and $t_{3max}(^1H^N) = 73.2$ ms. Data acquisition and processing were performed as shown in FIG. 1. The central peaks were acquired from steady state $^{13}C$ magnetization. The strip labeled "central peak" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{15}N$ chemical shift (170.0 ppm) of Phe 43 along $\omega_2(^{15}N)$ and centered about the corresponding amide proton shifts detected along $\omega_3(^1H^N)$. $^1H$, $^{13}C$, and $^{15}N$ chemical shifts are in ppm relative to DSS.

Figure 10:
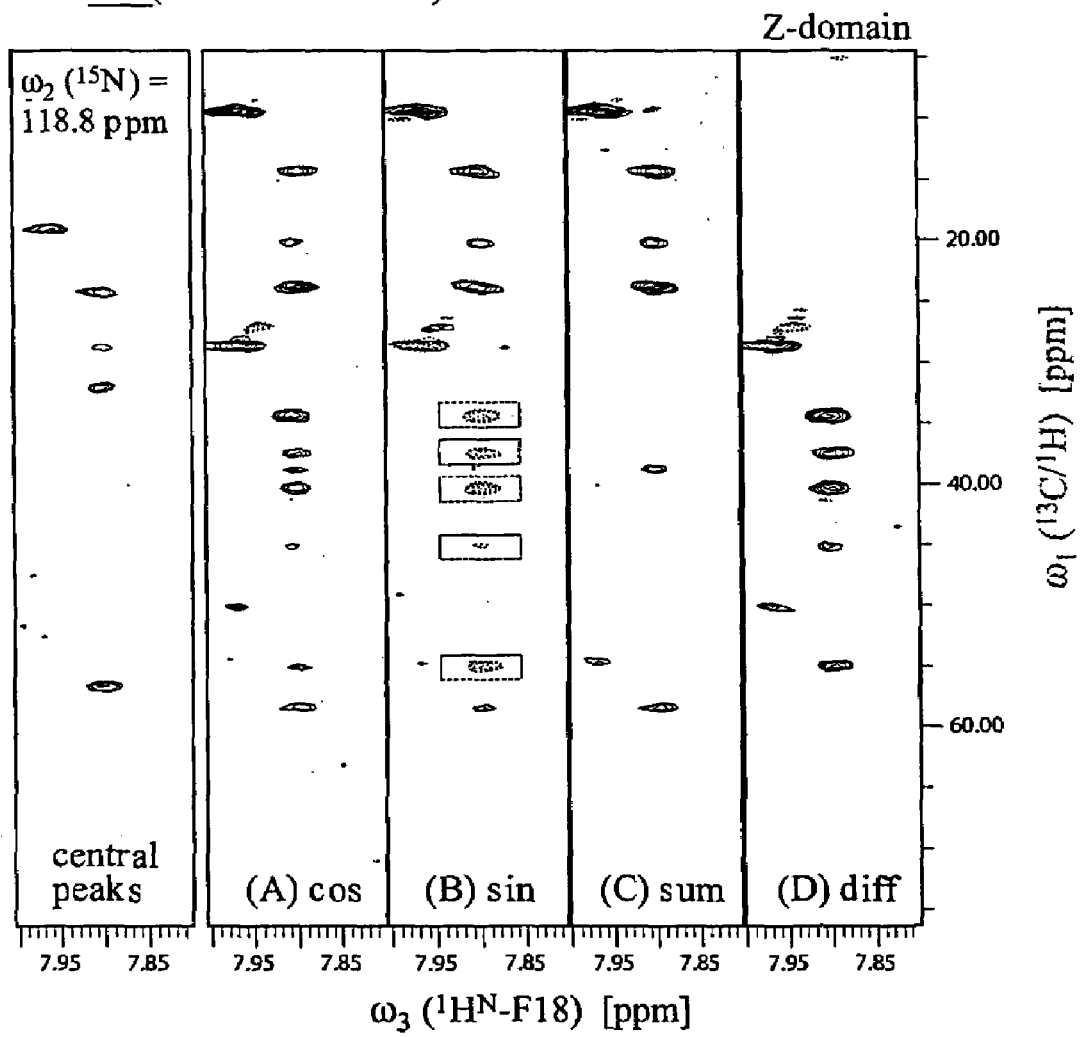

FIG. 10 shows a composite plot of $[\omega_1(^{13}C/^1H), \omega_3(^1H^N)]$-strips taken from 3D HC(C-TOCSY-CO)NHN spectrum obtained for Z-domain protein with a total measurement time of 12.7 hours. The 3D NMR data were acquired with $76(t_1) \times 28(t_2) \times 512(t_3)$ complex points and $t_{1max}(^{13}C; ^1H) = 6.3$ ms, $t_{2max}(^{15}N) = 20.8$ ms, and $t_{3max}(^1H^N) = 73.2$ ms. Data acquisition and processing were performed as shown in FIG. 1. The central peaks were acquired from steady state $^{13}C$ magnetization. The strip labeled "central peaks" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{15}N$ chemical shift (118.8 ppm) of Phe 18 along $\omega_2(^{15}N)$ and centered about the corresponding amide proton shifts detected along $\omega_3(^1H^N)$. $^1H$, $^{13}C$, and $^{15}N$ chemical shifts are in ppm relative to DSS.

Figure 11:
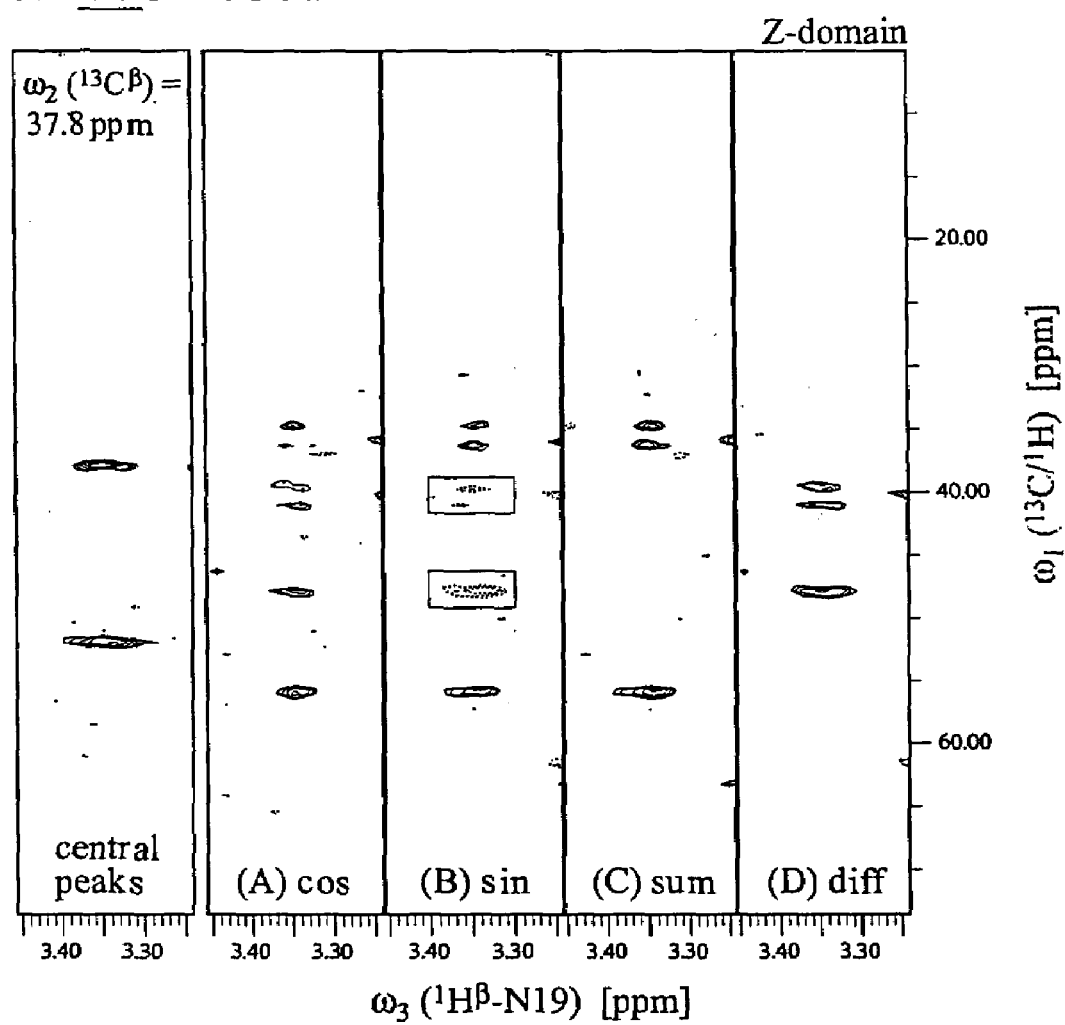

FIG. 11 shows a composite plot of $[\omega_1(^{13}C/^1H),\omega_3(^1H^\beta)]$-strips taken from 3D HCCH-COSY spectrum obtained for Z-domain protein with a total measurement time of 10.8 hours. The 3D NMR data were acquired with $90(t_1) \times 20(t_2) \times 512(t_3)$ complex points and $t_{1max}(^{13}C; ^1H) = 7.4$ ms, $t_{2max}(^{13}C) = 6.1$ ms, and $t_{3max}(^1H) = 73.2$ ms. Data acquisition and processing were performed as shown in FIG. 1. The central peaks were acquired from steady state $^{13}C$ magnetization. The strip labeled "central peaks" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference between the cosine-modulated 3D NMR spectrum and the sine-modulated 3D NMR spectrum. All strips have been taken, respectively, at the $^{13}C^\beta$ chemical shift (37.8 ppm) of Asn 19 along $\omega_2(^{13}C)$ and centered about the corresponding proton $(^1H^\beta)$ shifts detected along $\omega_3(^1H)$. $^1H$ and $^{13}C$ chemical shifts are in ppm relative to DSS.

Figure 12:
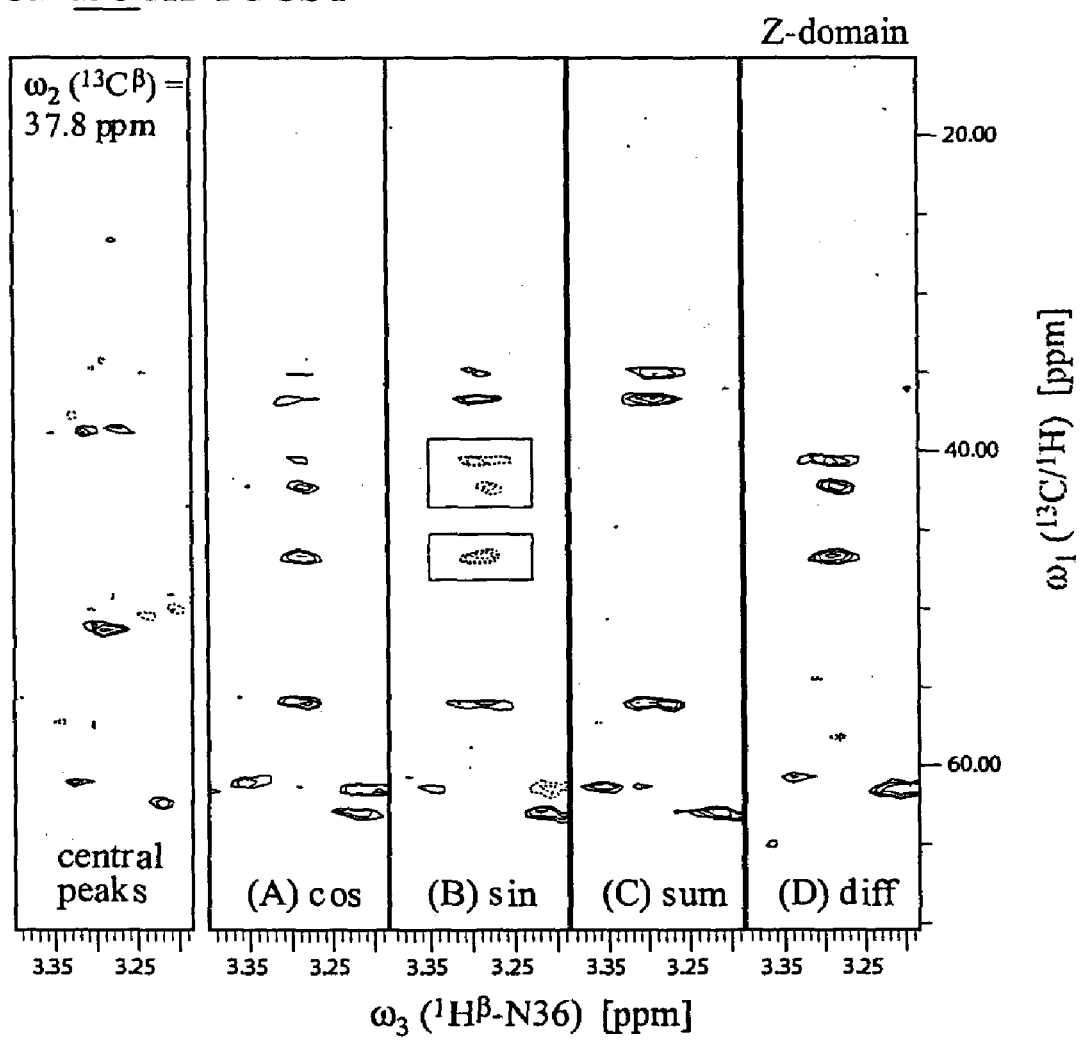

FIG. 12 shows a composite plot of $[\omega_1(^{13}C/^1H),\omega_3(^1H^\beta)]$-strips taken from 3D HCCH-TOCSY spectrum obtained for Z-domain protein with a total measurement time of 11.0 hours. The 3D NMR data were acquired with $80(t_1) \times 20(t_2) \times 512(t_3)$ complex points and $t_{1max}(^{13}C; ^1H) = 6.6$ ms, $t_{2max}(^{13}C) = 6.1$ ms, and $t_{3max}(^1H) = 73.2$ ms. Data acquisition and processing were performed as shown in FIG. 1. The central peaks were acquired from steady state $^{13}C$ magnetization. The strip labeled "central peaks" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference of the cosine-modulated 3D NMR spectrum between the sine-modulated 3D NMR spectrum. All strips have been taken, respectively, at the $^{13}C^\beta$ chemical shift (37.8 ppm) of Asn 36 along $\omega_2(^{13}C)$ and centered about the corresponding proton $(^1H^\beta)$ shifts detected along $\omega_3(^1H)$. $^1H$ and $^{13}C$ chemical shifts are in ppm relative to DSS.

Figure 13:
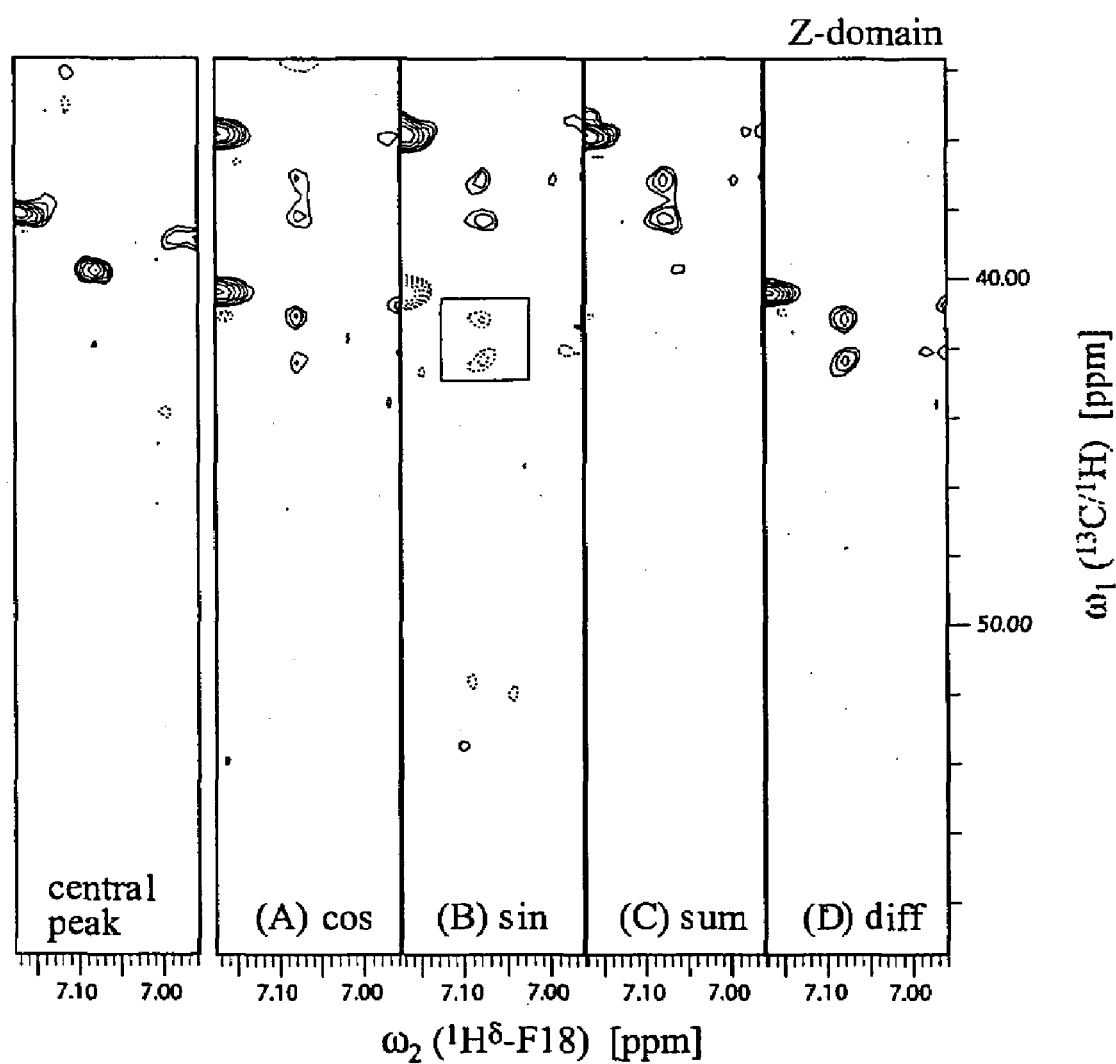

FIG. 13 shows a composite plot of $[\omega_1(^{13}C/^1H),\omega_3(^1H^\delta)]$-strips taken from 2D HBCB(CGCD)HD spectrum obtained for Z-domain protein with a total measurement time of 7.8 hours. The 2D NMR data were acquired with $76(t_1) \times 512(t_2)$ complex points and $t_{1max}(^{13}C; ^1H) = 6.3$ ms and $t_{2max}(^1H) = 73.2$ ms. Data acquisition and processing were performed as shown in FIG. 1. The central peaks were acquired from steady state $^{13}C$ magnetization. The strip labeled "central peak" was taken from the 2D NMR spectrum comprising the central peaks. The strip labeled (A) was taken from the 2D NMR spectrum comprising in-phase peak pairs arising from cosine modulation; strip (B) from the 2D NMR spectrum comprising anti-phase peak pairs arising from sine modulation (the boxed peaks show opposite peak intensity compared to the others); strip (C) from the 2D NMR spectrum comprising the edited, phase-sensitive peak generated from the sum of the cosine-modulated 2D NMR spectrum and the sine-modulated 2D NMR spectrum, and strip (D) from the 2D NMR spectrum comprising the edited, phase-sensitive peak generated from the difference of the cosine-modulated 2D NMR spectrum between the sine-modulated 2D NMR spectrum. All strips have been centered about the aromatic proton $(^1H^\delta)$ shifts of Phe 18 detected along $\omega_2(^1H)$. $^1H$ and $^{13}C$ chemical shifts are in ppm relative to DSS.

Figure 14:
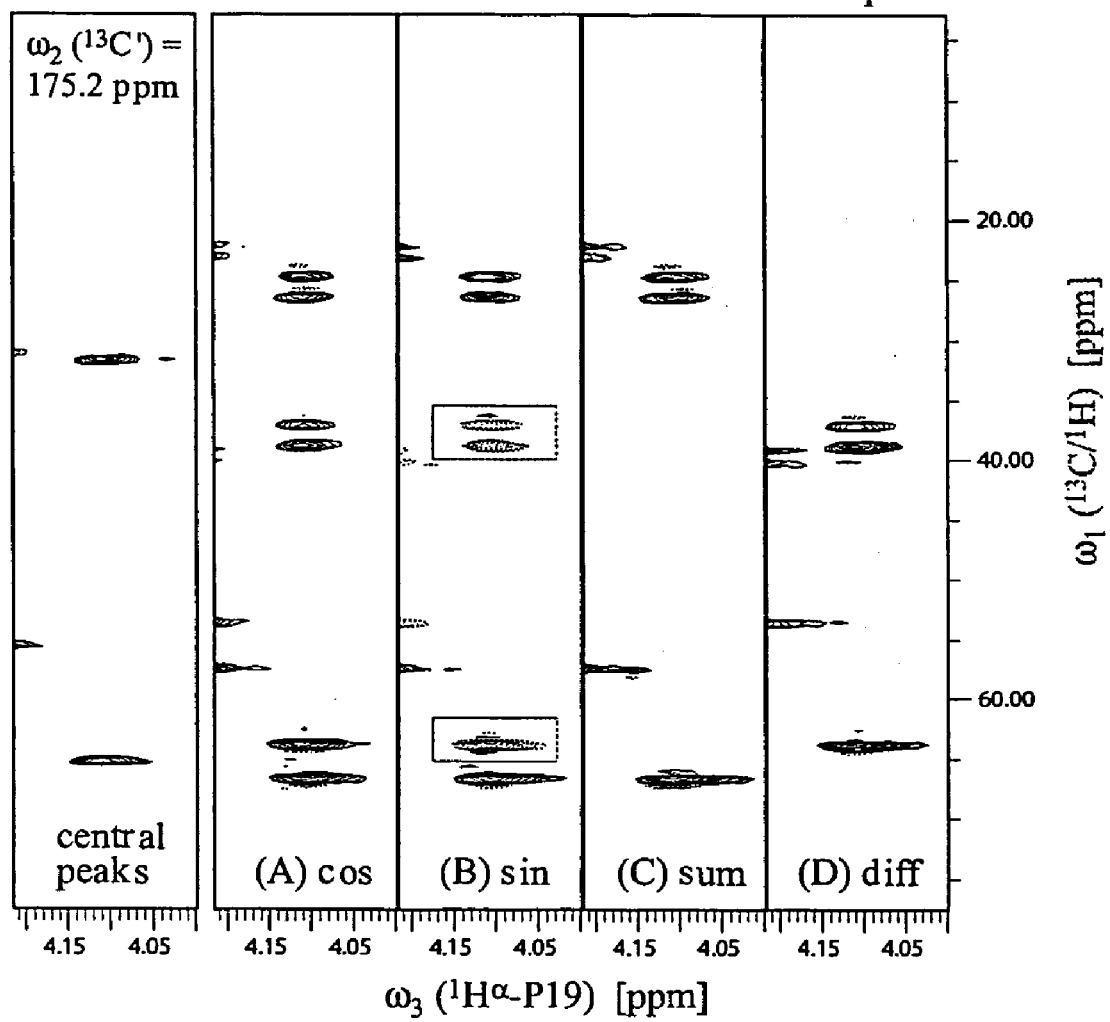

FIG. 14 shows a composite plot of $[\omega_1(^{13}C/^1H),\omega_3(^1H^\alpha)]$-strips taken from 3D $H^{\alpha/\beta}C^{\alpha/\beta}$COHA spectrum obtained for ubiquitin protein with a total measurement time of 12.7 hours.

The 3D NMR data were acquired with 76($t_1$)×32($t_2$)×512($t_3$) complex points and $t_{1max}$($^{13}C^{\alpha/\beta}$; $^1H^{\alpha/\beta}$)=6.3 ms, $t_{2max}$($^{13}C'$)= ms, and $t_{3max}$($^1H^\alpha$)=72.8 ms. Data acquisition and processing were performed as shown in FIG. 1. The central peaks were acquired from the steady state $^{13}C$ magnetization. The strip labeled "central peaks" was taken from the 3D NMR spectrum comprising the central peaks. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference of the cosine-modulated 3D NMR spectrum between the sine-modulated 3D NMR spectrum. All strips have been taken, respectively, at the $^{13}C'$ chemical shift (175.2 ppm) of Pro 19 along $\omega_2$($^{13}C'$) and centered about the corresponding proton shifts detected along $\omega_3$($^1H^\alpha$). $^1H$ and $^{13}C$ chemical shifts are in ppm relative to DSS.

Figure 15:
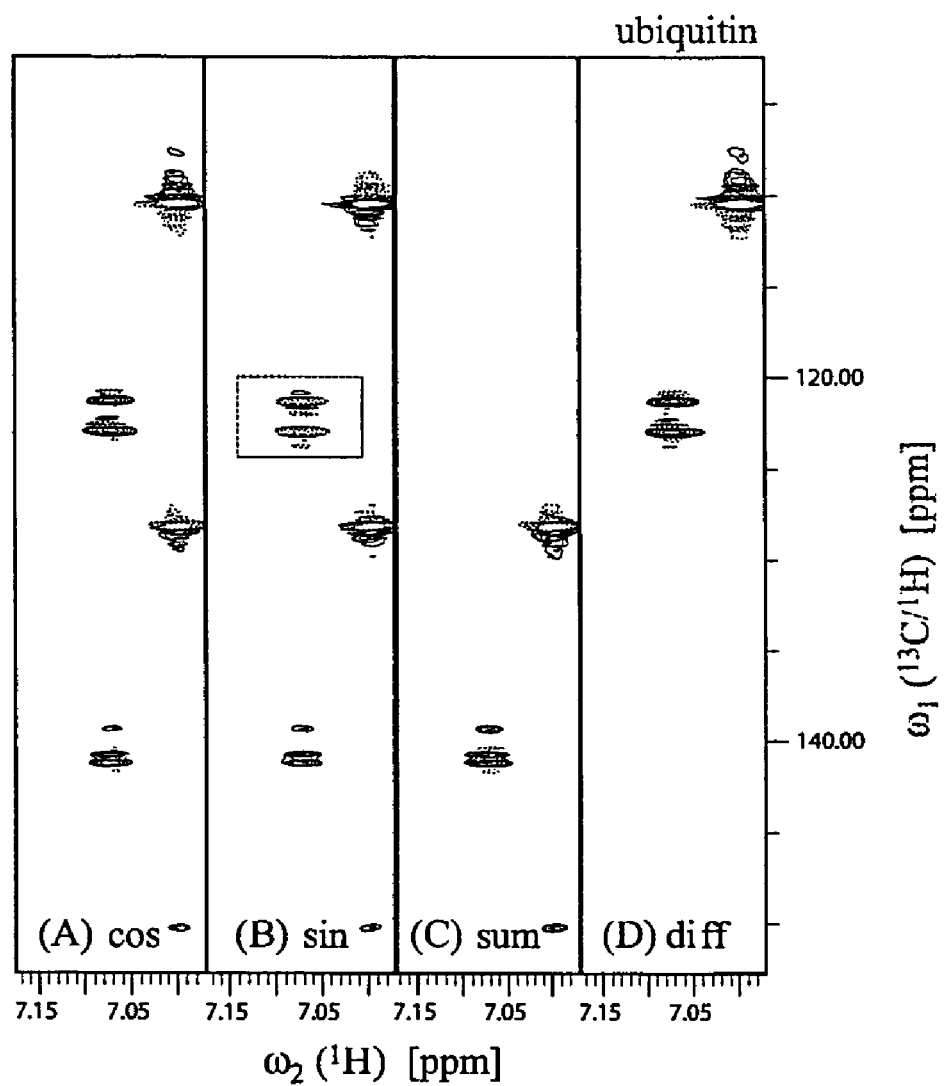

FIG. 15 shows a composite plot of [$\omega_1$($^{13}C/^1H$),$\omega_3$($^1H$)]-strips taken from 2D H-TOCSY-HCH-COSY spectrum obtained for ubiquitin protein with a total measurement time of 1.4 hours. The 2D NMR data were acquired with 100($t_1$)× 512($t_2$) complex points and $t_{1max}$($^{13}C$; $^1H$)=9.9 ms and $t_{2max}$($^1H$)=72.8 ms. Data acquisition and processing were performed as shown in FIG. 1. No central peaks were acquired. The strip labeled (A) was taken from the 3D NMR spectrum comprising in-phase peak pairs arising from cosine modulation; strip (B) from the 3D NMR spectrum comprising anti-phase peak pairs arising from sine modulation (the boxed peaks show opposite peak intensity compared to the others); strip (C) from the 3D NMR spectrum comprising the edited, phase-sensitive peak generated from the sum of the cosine-modulated 3D NMR spectrum and the sine-modulated 3D NMR spectrum, and strip (D) from the 3D NMR spectrum comprising the edited, phase-sensitive peak generated from the difference of the cosine-modulated 3D NMR spectrum between the sine-modulated 3D NMR spectrum. All strips have been centered about the aromatic proton shifts detected along $\omega_1$($^1H$). $^1H$ and $^{13}C$ chemical shifts are in ppm relative to DSS.

DETAILED DESCRIPTION OF THE INVENTION

The present invention discloses eleven RD TR NMR experiments where the chemical shift values encoded in a peak pair of an NMR spectrum are detected in a phase sensitive manner. The present invention also discloses different combinations of those phase-sensitively detected RD NMR experiments which allow one to obtain sequential backbone chemical shift assignments for determining the secondary structure of a protein molecule and nearly complete assignments of chemical shift values for a protein molecule including aliphatic and aromatic sidechain spin systems.

The basic acquisition principle for recording edited, phase sensitive RD NMR spectra is illustrated in FIG. 1 (Brutscher et al., *J. Magn. Reson.*, B 109:238-242 (1995), which is hereby incorporated by reference in its entirety). The joint evolution of two chemical shifts, $\Omega_x$ and $\Omega_y$, can result in four different time domain NMR data sets, (1), (2), (3), and (4), which are generated from all possible combinations of sine modulation and cosine modulation with either of the two chemical shifts (shown on the left-hand side of the equations for data sets (1)-(4)). According to the addition theorems of trigonometric functions, these products of sine and cosine functions are equal to sums of sine and cosine functions of sums and differences of the two chemical shifts (shown on the right-hand side of the equations for data sets (1)-(4)). To obtain an absorptive NMR signal, two out of the four data sets need to be considered as "real" and "imaginary" parts for cosine-modulated RD NMR and sine-modulated RD NMR. Data sets (1) and (2) correspond to real part and imaginary part, respectively, of a cosine-modulated RD NMR experiment, in which $\Omega_y$ is detected in a phase sensitive manner and the evolution of the chemical shift $\Omega_x$ effects a cosine modulation (see (A) in FIG. 1). Data sets (3) and (4) correspond to real part and imaginary part, respectively, of a sine-modulated RD NMR experiment, in which $\Omega_y$ is detected in a phase sensitive manner and the evolution of $\Omega_x$ effects a sine modulation, further enabling the phase sensitive detection of $\Omega_x$ (see (B) in FIG. 1). Thus, the phase-sensitively detected sine-modulated RD NMR spectrum contains all information about $\Omega_x$ and $\Omega_y$ for unambiguous chemical shift assignment. Appropriate linear combination of real and imaginary parts of the cosine-modulated and the sine-modulated RD NMR experiments yields the edited, phase sensitive RD NMR spectra, which also contain all information about $\Omega_x$ and $\Omega_y$ (see (C) and (D) in FIG. 1).

FIG. 2 provides a survey of (i) the names, (ii) the magnetization transfer pathways and (iii) the peak patterns observed in the projected dimension of specific embodiments of the eleven RD NMR experiments disclosed by the present invention. For simplicity, FIG. 2 shows the in-phase peak pattern from the cosine-modulated RD NMR experiments. When acquiring the sine-modulated congeners, anti-phase peak pairs are observed instead (see (B) in FIG. 1). The group comprising the first three experiments are designed to yield "sequential" connectivities via one-bond scalar couplings: 3D $H^{\alpha/\beta}C^{\alpha/\beta}$(CO)NHN (FIG. 2A), 3D HACA(CO)NHN (FIG. 2B), and 3D HC(C-TOCSY-CO)NHN (FIG. 2C). The following three experiments provide "intraresidual" connectivities via one-bond scalar couplings: 3D HNNCAHA (FIG. 2D), 3D $H^{\alpha/\beta}C^{\alpha/\beta}$COHA (FIG. 2E), and 3D $H^{\alpha/\beta}C^{\alpha/\beta}$NHN (FIG. 2F). 3D HNN<CO,CA> (FIG. 2G) offers both intraresidual $^1H^N$-$^{13}C^\alpha$ and sequential $^1H^N$-$^{13}C'$ connectivities. Although 3D HNNCAHA (FIG. 2D), 3D $H^{\alpha/\beta}{}_C{}^{\alpha/\beta}$NHN (FIG. 2F) and 3D HNN<CO,CA> (FIG. 2G) also provide sequential connectivities via two-bond $^{13}C^\alpha_{i-1}$-$^{15}N_i$ scalar couplings, those are usually smaller than the one-bond couplings (Cavanagh et al., *Protein NMR Spectroscopy*, Academic Press, San Diego, (1996), which is hereby incorporated by reference in its entirety), and obtaining complete backbone resonance assignments critically depends on experiments designed to provide sequential connectivities via one-bond couplings (FIGS. 2D-F). 3D HCCH-COSY (FIG. 2H) and 3D HCCH-TOCSY (FIG. 2I) allow one to obtain assignments for the "aliphatic" side chain spin systems, while 2D HBCB(CDCG)HD (FIG. 2J) and 2D $^1$H-TOCSY-relayed HCH-COSY (FIG. 2K) provide the corresponding information for the "aromatic" spin systems.

The RD NMR experiments are grouped accordingly in Table 1, which lists for each experiment (i) the nuclei for which the chemical shifts are measured, (ii) if and how the central peaks are acquired and (iii) additional notable technical features. State-of-the art implementations (Cavanagh et al., *Protein NMR Spectroscopy*, Academic Press, San Diego, (1996); Kay, *J. Am. Chem. Soc.*, 115:2055-2057 (1993); Grzesiek et al., *J. Magn. Reson.*, 99:201-207 (1992); Montelione et al., *J. Am. Chem. Soc.*, 114:10974-10975 (1992); Boucher et al., *J. Biomol. NMR*, 2:631-637 (1992); Yamazaki et al., *J. Am. Chem. Soc.*, 115:11054-11055 (1993); Zerbe et al., *J. Biomol. NMR*, 7:99-106 (1996); Grzesiek et al., *J. Biomol. NMR*, 3:185-204 (1993), which are hereby incorporated by reference in their entirety) making use of pulsed field z-gradients for coherence selection and/or rejection, and sensitivity enhancement (Cavanagh et al., *Protein NMR Spectroscopy*, Academic Press, San Diego, (1996), which is hereby incorporated by reference in its entirety) were chosen, which allow executing these experiments with a single transient per acquired free induction decay (FID). Semi (Grzesiek et al., *J. Biomol. NMR*, 3:185-204 (1993), which is hereby incorporated by reference in its entirety) constant-time (Cavanagh et al., *Protein NMR Spectroscopy*, Academic Press, San Diego, (1996), which is hereby incorporated by reference in its entirety) chemical shift frequency-labeling modules were used throughout in the indirect dimensions in order to minimize losses arising from transverse nuclear spin relaxation. FIGS. 3A-K provide comprehensive descriptions of the RD NMR r.f. pulse sequences used in the eleven RD NMR experiments.

TABLE 1

Phase-Sensitively Detected Reduced Dimensionality NMR Experiments

| Experiment (see FIG. 2) | Nuclei for which the chemical shifts are correlated[a,b] | Acquisition of central peaks[c] |
|---|---|---|
| 3D spectra for sequential backbone connectivities: | | |
| (A) H$^{\alpha/\beta}$C$^{\alpha/\beta}$(CO)NHN | $^1$H$^\beta_{i-1}$, $^{13}$C$^\beta_{i-1}$, $^1$H$^\alpha_{i-1}$, $^{13}$C$^\alpha_{i-1}$, $^{15}$N$_i$, $^1$H$^N_i$ | $^{13}$C |
| (B) HACA(CO)NHN | $^1$H$^\alpha_{i-1}$, $^{13}$C$^\alpha_{i-1}$, $^{15}$N$_i$, $^1$H$^N_i$ | $^{13}$C |
| (C) HC(C-TOCSY - CO)NHN | $^1$H$^{ali}_{i-1}$, $^{13}$C$^{ali}_{i-1}$, $^{15}$N$_i$, $^1$H$^N_i$ | $^{13}$C |
| 3D spectra for intraresidual backbone connectivities: | | |
| (D) HNNCAHA[b,d] | $^1$H$^\alpha_i$, $^{13}$C$^\alpha_i$, $^{15}$N$_i$, $^1$H$^N_i$ | INEPT |
| (E) H$^{\alpha/\beta}$C$^{\alpha/\beta}$COHA | $^1$H$^\beta_i$, $^{13}$C$^\beta_i$, $^1$H$^\alpha_i$, $^{13}$C$^\alpha_i$, $^{13}$C=O$_i$ | $^{13}$C |
| (F) H$^{\alpha/\beta}$C$^{\alpha/\beta}$NH | $^1$H$^\beta_i$, $^{13}$C$^\beta_i$, $^1$H$^\alpha_i$, $^{13}$C$^\alpha_i$, $^{15}$N$_i$, $^1$H$^N_i$ | $^{13}$C |
| 3D spectrum for intra- and sequential backbone connectivities: | | |
| (G) HNN<CO,CA>[b] | $^{13}$C=O$_{i-1}$, $^{13}$C$^\alpha_i$, $^{15}$N$_i$, $^1$H$^N_i$ | INEPT |
| 3D spectra for assignment of aliphatic resonances:[e] | | |
| (H) HCCH-COSY | $^1$H$_m$, $^{13}$C$_m$, $^1$H$_n$, $^{13}$C$_n$ | $^{13}$C |
| (I) HCCH-TOCSY | $^1$H$_m$, $^{13}$C$_m$, $^1$H$_n$, $^{13}$C$_n$, $^1$H$_p$, $^{13}$C$_p$ | $^{13}$C |
| 2D spectra for assignment of aromatic resonances:[e] | | |
| (J) HBCB(CGCD)HD | $^1$H$^\beta$, $^{13}$C$^\beta$, $^1$H$^\delta$ | $^{13}$C |
| (K) $^1$H-TOCSY-HCH-COSY | $^1$H$_m$, $^{13}$C$_m$, $^1$H$_n$ | none[f] |

[a] i-1, i: numbers of two sequentially located amino acid residues.
[b] Sequential connectivities via two-bond $^{13}$C$^\alpha_{i-1}$-$^{15}$N$_i$ scalar couplings are not considered in this table.
[c] approach-1 (Szyperski et al., J.Am.Chem.Soc., 118:8146-8147 (1996), which is hereby incorporated by reference in its entirety): use of incomplete INEPT (rows labeled with "INEPT"); approach-2 (Szyperski et al., J.Am.Chem.Soc. 118:8146-8147 (1996), which is hereby incorporated by reference in its entirety): use of $^{13}$C steady state magnetization (rows labeled with "$^{13}$C").
[d] adiabatic $^{13}$C$^\beta$-decoupling (Kupce et al., J.Mann.Reson., A 115:273-277 (1995); Matsuo et al., J.Magn.Reson. B 113:190-194 (1996), which are hereby incorporated by reference in their entirety) is employed during delays with transverse $^{13}$C$^\alpha$ magnetization.
[e] m, n, p: atom numbers in neighboring CH, CH$_2$ or CH$_3$ groups.
[f] acquisition of central peaks is prevented by the use of spin-lock purge pulses (flanking the total correlation relay) to obtain pure phases.

The 3D H,CA,(CO),N,HN Experiment

The present invention relates to a method of conducting a reduced dimensionality three-dimensional (3D) HA, CA,(CO),N,HN nuclear magnetic resonance (NMR) experiment by measuring the chemical shift values for the following nuclei of a protein molecule having two consecutive amino acid residues, i–1 and i: (1) an α-proton of amino acid residue i–1, $^1$H$^\alpha_{i-1}$; (2) an α-carbon of amino acid residue i–1, $^{13}$C$^\alpha_{i-1}$; (3) a polypeptide backbone amide nitrogen of amino acid residue i, $^{15}$N$_i$; and (4) a polypeptide backbone amide proton of amino acid residue i, $^1$H$^N_i$, where the chemical shift values of $^1$H$^\alpha_{i-1}$ and $^{13}$C$^\alpha_{i-1}$ which are encoded in a peak pair of a 3D NMR spectrum are detected in a phase sensitive manner. The method involves providing a protein sample and applying radiofrequency pulses to the protein sample which effect a nuclear spin polarization transfer where the chemical shift evolutions of $^1$H$^\alpha_{i-1}$ and $^{13}$C$^\alpha_{i-1}$ of amino acid residue i–1 are connected to the chemical shift evolutions of $^{15}$N$_i$ and $^1$H$^N_i$ of amino acid residue i, under conditions effective (1) to generate NMR signals encoding the chemical shift values of $^{13}$C$^\alpha_{i-1}$ and $^{15}$N$_i$ in a phase sensitive manner in two indirect time domain dimensions, $t_1$($^{13}$C$^\alpha$) and $t_2$($^{15}$N), respectively, and the chemical shift value of $^1$H$^N_i$ in a direct time domain dimension, $t_3$($^1$H$^N$), and (2) to sine modulate the $^{13}$C$^\alpha_{i-1}$ chemical shift evolution in $t_1$($^{13}$C$^\alpha$) with the chemical shift evolution of $^1$H$^\alpha_{i-1}$. Then, the NMR signals are processed to generate a sine-modulated 3D NMR spectrum with an anti-phase peak pair derived from the sine modulating, where (1) the chemical shift values of $^{15}$N$_i$ and $^1$H$^N_i$ are measured in two frequency domain dimensions, $\omega_2$($^{15}$N) and $\omega_3$($^1$H$^N$), respectively, and (2) the chemical shift values of $^1$H$^\alpha_{i-1}$ and $^{13}$C$^\alpha_{i-1}$ are measured in a frequency domain dimension, $\omega_1$($^{13}$C$^\alpha$), by the frequency difference between the two peaks forming the anti-phase peak pair and the frequency at the center of the two peaks, respectively, where the sine-modulated 3D NMR spectrum enables detection of the chemical shift value of $^1$H$^\alpha_{i-1}$ in a phase sensitive manner.

In addition, the method of conducting a RD 3D HA, CA,(CO),N,HN NMR experiment can involve applying radiofrequency pulses under conditions effective (1) to generate additional NMR signals encoding the chemical shift values of $^{13}$C$^\alpha_{i-1}$ and $^{15}$N$_i$ in a phase sensitive manner in $t_1$($^{13}$C$^\alpha$) and $t_2$($^{15}$N), respectively, and the chemical shift value of $^1$H$^N_i$ in $t_3$($^1$H$^N$) and (2) to cosine modulate the $^{13}$C$^\alpha_{i-1}$ chemical shift evolution in $t_1$($^{13}$C$^\alpha$) with the chemical shift evolution of $^1$H$^\alpha_{i-1}$ for the additional NMR signals. Then, the NMR signals and the additional NMR signals are processed to further generate a cosine-modulated 3D NMR spectrum with an in-phase peak pair derived from the cosine modulating, a sum 3D NMR spectrum generated by adding the sine-modulated 3D NMR spectrum and the cosine-modulated 3D NMR spectrum, and a difference 3D NMR spectrum generated by subtracting the cosine-modulated 3D NMR spectrum from the sine-modulated 3D NMR spectrum. The combined use of the sum 3D NMR spectrum and the difference 3D NMR spectrum enables placement of the two peaks forming the peak pairs into separate spectra, thereby allowing phase-sensitive editing of the two peaks forming the peak pairs.

In addition, the method of conducting a RD 3D HA, CA,(CO),N,HN NMR experiment can involve applying radiofrequency pulses under conditions effective (1) to generate additional NMR signals encoding the chemical shift values of $^{13}$C$^\alpha_{i-1}$ and $^{15}$N$_i$ in a phase sensitive manner in $t_1$($^{13}$C$^\alpha$) and $t_2$($^{15}$N) and the chemical shift value of $^1$H$^N_i$ in $t_3$($^1$H$^N$), and (2) to avoid sine modulating the $^{13}$C$^\alpha_{i-1}$ chemical shift evolution in $t_1$($^{13}$C$^\alpha$) with the chemical shift evolution of $^1H^{\alpha}_{i-1}$ for the additional NMR signals. Then, the NMR signals and the additional NMR signals are processed to generate a 3D NMR spectrum with an additional peak located centrally between two peaks forming the primary peak pair which measures the chemical shift value of $^{13}C^{\alpha}_{i-1}$ along $\omega_1(^{13}C^{\alpha})$. That additional peak can be derived from $^{13}C^{\alpha}$ nuclear spin polarization. One specific embodiment (3D HACA(CO)NHN) of this method is illustrated in FIG. 2B, where the applying radiofrequency pulses effects a nuclear spin polarization transfer where a radiofrequency pulse is used to create transverse $^1H^{\alpha}_{i-1}$ magnetization, which is transferred to $^{13}C^{\alpha}_{i-1}$, to $^{15}N_i$, and to $^1H^N_i$, to generate the NMR signal. Another specific embodiment of this method involves applying radiofrequency pulses by (1) applying a first set of radiofrequency pulses according to the scheme shown in FIG. 3B to generate a first NMR signal, and (2) applying a second set of radiofrequency pulses according to the scheme shown in FIG. 3B, where phase $\phi_1$ of the first $^1H$ pulse is altered by 180° to generate a second NMR signal. Then, prior to the processing, the first NMR signal and the second NMR signal are added and subtracted whereby the NMR signals are processed to generate a first NMR subspectrum derived from the subtracting which contains the primary peak pair and a second NMR subspectrum derived from the adding which contains the additional peak located centrally between the two peaks forming the primary peak pair.

In an alternate embodiment, the RD 3D HA,CA,(CO),N,HN NMR experiment can be modified to a $\overline{\text{RD}}$ $\overline{\text{2D}}$ HA,CA,(CO,N),HN NMR experiment which involves applying radiofrequency pulses so that the chemical shift evolution of $^{15}N_i$ does not occur. Then, the NMR signals are processed to generate a two dimensional (2D) NMR spectrum with a peak pair where (1) the chemical shift value of $^1H^N_i$ is measured in a frequency domain dimension, $\omega_2(^1H^N)$, and (2) the chemical shift values of $^1H^{\alpha}_{i-1}$ and $^{13}C^{\alpha}_{i-1}$ are measured in a frequency domain dimension, $\omega_1(^{13}C^{\alpha})$, by the frequency difference between the two peaks forming the peak pair and the frequency at the center of the two peaks, respectively.

In an alternate embodiment, the RD 3D HA,CA,(CO),N,HN NMR experiment can be modified to a $\overline{\text{RD}}$ $\overline{\text{4D}}$ HA,CA,CO,N,HN NMR experiment which involves applying radiofrequency pulses so that the chemical shift evolution of a polypeptide backbone carbonyl carbon of amino acid residue i–1, $^{13}C'_{i-1}$, occurs under conditions effective to generate NMR signals encoding the chemical shift value of $^{13}C'_{i-1}$ in a phase sensitive manner in an indirect time domain dimension, $t_4(^{13}C')$. Then, the NMR signals are processed to generate a four dimensional (4D) NMR spectrum with a peak pair where (1) the chemical shift values of $^{15}N_i$, $^1H^N_i$, and $^{13}C'_{i-1}$ are measured in three frequency domain dimensions, $\omega_2(^{15}N)$, $\omega^3(^1H^N)$, and $\omega_4(^{13}C')$, respectively, and (2) the chemical shift values of $^1H^{\alpha}_{i-1}$ and $^{13}C^{\alpha}_{i-1}$ are measured in a frequency domain dimension, $\omega_1(^{13}C^{\alpha})$, by the frequency difference between the two peaks forming the peak pair and the frequency at the center of the two peaks, respectively.

The 3D H,C,(C-TOCSY-CO),N,HN Experiment

The present invention also relates to a method of conducting a reduced dimensionality three-dimensional (3D) H,C,(C-TOCSY-CO),N,HN nuclear magnetic resonance (NMR) experiment by measuring the chemical shift values for the following nuclei of a protein molecule having two consecutive amino acid residues, i–1 and i: (1) aliphatic protons of amino acid residue i–1, $^1H^{ali}_{i-1}$; (2) aliphatic carbons of amino acid residue i–1, $^{13}C^{ali}_{i-1}$; (3) a polypeptide backbone amide nitrogen of amino acid residue i, $^{15}N_i$; and (4) a polypeptide backbone amide proton of amino acid residue i, $^1H^N_i$, where the chemical shift values of $^1H^{ali}_{i-1}$ and $^{13}C^{ali}_{i-1}$ which are encoded in peak pairs of a 3D NMR spectrum are detected in a phase sensitive manner. The method involves providing a protein sample and applying radiofrequency pulses to the protein sample which effect a nuclear spin polarization transfer where the chemical shift evolutions of $^1H^{ali}_{i-1}$ and $^{13}C^{ali}_{i-1}$ of amino acid residue i–1 are connected to the chemical shift evolutions of $^{15}N_i$ and $^1H^N_i$ of amino acid residue i, under conditions effective (1) to generate a NMR signal encoding the chemical shifts of $^{13}C^{ali}_{i-1}$ and $^{15}N_i$ in a phase sensitive manner in two indirect time domain dimensions, $t_1(^{13}C^{ali})$ and $t_2(^{15}N)$, respectively, and the chemical shift of $^1H^N_i$ in a direct time domain dimension, $t_3(^1H^N)$, and (2) to sine modulate the chemical shift evolutions of $^{13}C^{ali}_{i-1}$ in $t_1(^{13}C^{ali})$ with the chemical shift evolutions of $^1H^{ali}_{i-1}$. Then, the NMR signals are processed to generate a sine-modulated 3D NMR spectrum with anti-phase peak pairs derived from the sine modulating where (1) the chemical shift values of $^{15}N_i$ and $^1H^N_i$ are measured in two frequency domain dimensions, $\omega_2(^{15}N)$ and $\omega_3(^1H^N)$, respectively, and (2) the chemical shift values of $^1H^{ali}_{i-1}$ and $^{13}C^{ali}_{i-1}$ are measured in a frequency domain dimension, $\omega_1(^{13}C^{ali})$, by the frequency differences between each of the two peaks forming each of the anti-phase peak pairs and the frequencies at the center of the two peaks, respectively, where the sine-modulated 3D NMR spectrum enables detection of the chemical shift value of $^1H^{ali}_{i-1}$ in a phase sensitive manner.

In addition, the method of conducting a RD 3D H,C,(C-TOCSY-CO),N,HN NMR experiment can involve applying radiofrequency pulses under conditions effective (1) to generate additional NMR signals encoding the chemical shift values of $^{13}C^{ali}_{i-1}$ and $^{15}N_i$ in a phase sensitive manner in $t_1(^{13}C^{ali})$ and $t_2(^{15}N)$, respectively, and the chemical shift value of $^1H^N_i$ in $t_3(^1H^N)$ and (2) to cosine modulate the chemical shift evolutions of $^{13}C^{ali}_{i-1}$ in $t_1(^{13}C^{ali})$ with the chemical shift evolutions of $^1H^{ali}_{i-1}$ for the additional NMR signals. Then, the NMR signals and the additional NMR signals are processed to further generate a cosine-modulated 3D NMR spectrum with in-phase peak pairs derived from the cosine modulating, a sum 3D NMR spectrum generated by adding the sine-modulated 3D NMR spectrum and the cosine-modulated 3D NMR spectrum, and a difference 3D NMR spectrum generated by subtracting the cosine-modulated 3D NMR spectrum from the sine-modulated 3D NMR spectrum. The combined use of the sum 3D NMR spectrum and the difference 3D NMR spectrum enables placement of the two peaks forming the peak pairs into separate spectra, thereby allowing phase-sensitive editing of the two peaks forming the peak pairs.

In addition, the method of conducting a RD 3D H,C,(C-TOCSY-CO),N,HN NMR experiment can involve applying radiofrequency pulses under conditions effective (1) to generate additional NMR signals encoding the chemical shift values of $^{13}C^{ali}_{i-1}$ and $^{15}N_i$ in a phase sensitive manner in $t_1(^{13}C^{ali})$ and $t_2(^{15}N)$ and the chemical shift value of $^1H^N_i$ in $t_3(^1H^N)$, and (2) to avoid sine modulating the chemical shift evolutions of $^{13}C^{ali}_{i-1}$ in $t_1(^{13}C^{ali})$ with the chemical shift evolution of $^1H^{\alpha}_{i-1}$ for the additional NMR signals. Then, the NMR signals and the additional NMR signals are processed to generate a 3D NMR spectrum with additional peaks located centrally between two peaks forming the peak pairs which measure the chemical shift values of $^{13}C^{ali}_{i-1}$ along $\omega_1(^{13}C^{ali})$. Those additional peaks can be derived from $^{13}C^{ali}$ nuclear spin polarization. One specific embodiment (3D HC-(C-TOCSY-CO)NHN) of this method is illustrated in FIG. 2C, where the applying radiofrequency pulses effects a nuclear spin polarization transfer, where a radiofrequency pulse is used to create transverse $^1H^{ali}_{i-1}$ magnetization, and $^1H^{ali}_{i-1}$ magnetization is transferred to $^{13}C^{ali}_{i-1}$, to $^{13}C^{\alpha}_{i-1}$, to $^{13}C'_{i-1}$, to $^{15}N_i$, and to $^1H^N_i$, where the NMR signal is detected. Another specific embodiment of this method involves applying radiofrequency pulses by (1) applying a first set of radiofrequency pulses according to the scheme shown in FIG. 3C to generate a first NMR signal, and (2) applying a second set of radiofrequency pulses according to the scheme shown in FIG. 3C, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D H,C,(C-TOCSY-CO),N,HN NMR experiment can be modified to a RD 2D H,C,(C-TOCSY-CO,N),HN NMR experiment, which involves applying radiofrequency pulses so that the chemical shift evolution of $^{15}N_i$ does not occur. Then, the NMR signals are processed to generate a two dimensional (2D) NMR spectrum with peak pairs where (1) the chemical shift value of $^1H^N_i$ is measured in a frequency domain dimension, $\omega_2(^1H^N)$, and (2) the chemical shift values of $^1H^{ali}_{i-1}$ and $^{13}C^{ali}_{i-1}$ are measured in a frequency domain dimension, $\omega_1(^{13}C^{ali})$, by the frequency differences between the two peaks forming the peak pairs and the frequencies at the center of the two peaks, respectively.

In an alternate embodiment, the RD 3D H,C,(C-TOCSY-CO),N,HN NMR experiment can be modified to a RD 4D H,C,(C-TOCSY),CO,N,HN NMR experiment which involves applying radio-frequency pulses so that the chemical shift evolution of a polypeptide backbone carbonyl carbon of amino acid residue i−1, $^{13}C'_{i-1}$, occurs under conditions effective to generate NMR signals encoding the chemical shift value of $^{13}C'_{i-1}$ in a phase sensitive manner in an indirect time domain dimension, $t_4(^{13}C')$. Then, the NMR signals are processed to generate a four dimensional (4D) NMR spectrum with variant peak pairs where (1) the chemical shift values of $^{15}N_i$, $^1H^N_i$ and $^{13}C'_{i-1}$ are measured in three frequency domain dimensions, $\omega_2(^{15}N)$, $\omega_3(^1H^N)$, and $\omega_4(^{13}C')$, respectively, and (2) the chemical shift values of $^1H^{ali}_{i-1}$ and $^{13}C^{ali}_{i-1}$ are measured in a frequency domain dimension, $\omega_1(^{13}C^{ali})$, by the frequency differences between the two peaks forming the variant peak pairs and the frequencies at the center of the two peaks, respectively.

The 3D H$^{\alpha/\beta}$,C$^{\alpha/\beta}$,CO,HA Experiment

Another aspect of the present invention relates to a method of conducting a reduced dimensionality three-dimensional (3D) H$^{\alpha/\beta}$,C$^{\alpha/\beta}$,CO,HA nuclear magnetic resonance (NMR) experiment by measuring the chemical shift values for the following nuclei of a protein molecule having an amino acid residue, i: (1) a β-proton of amino acid residue i, $^1H^\beta_i$; (2) a β-carbon of amino acid residue i, $^{13}C^\beta_i$; (3) an α-proton of amino acid residue i, $^1H^\alpha_i$; (4) an α-carbon of amino acid residue i, $^{13}C^\alpha_i$; and (5) a polypeptide backbone carbonyl carbon of amino acid residue i, $^{13}C'_i$, where the chemical shift values of $^1H^\alpha_i/^{13}C^\alpha_i$ and $^1H^\beta_i/^{13}C^\beta_i$ which are encoded in peak pairs of a 3D NMR spectrum are detected in a phase sensitive manner. The method involves providing a protein sample and applying radiofrequency pulses to the protein sample which effect a nuclear spin polarization transfer where the chemical shift evolutions of $^1H^\alpha_i$, $^1H^\beta_i$, $^{13}C^\alpha_i$, and $^{13}C^\beta_i$ are connected to the chemical shift evolution of $^{13}C'_i$, under conditions effective (1) to generate NMR signals encoding the chemical shift values of $^{13}C^\alpha_i$, $^{13}C^\beta_i$ and $^{13}C'_i$ in a phase sensitive manner in two indirect time domain dimensions, $t_1(^{13}C^{\alpha/\beta})$ and $t_2(^{13}C')$, respectively, and the chemical shift value of $^1H^\alpha_i$ in a direct time domain dimension, $t_3(^1H^\alpha)$, and (2) to sine modulate the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$, respectively. Then, the NMR signals are processed to generate a sine-modulated 3D NMR spectrum with anti-phase peak pairs derived from the sine modulating where (1) the chemical shift values of $^{13}C'_i$ and $^1H^\alpha_i$ are measured in two frequency domain dimensions, $\omega_2(^{13}C')$ and $\omega_3(^1H^\alpha)$, respectively, and (2) (i) the chemical shift values of $^1H^\alpha_i$ and $^1H^\beta_i$ are measured in a frequency domain dimension, $\omega_1(^{13}C^{\alpha/\beta})$, by the frequency differences between each of the two peaks forming each of the anti-phase peak pairs, and (ii) the chemical shift values of $^{13}C^\alpha_i$ and $^{13}C^\beta_i$ are measured in a frequency domain dimension, $\omega_1(^{13}C^{\alpha/\beta})$, by the frequencies at the center of the two peaks forming the anti-phase peak pairs, where the sine-modulated 3D NMR spectrum enables detection of the chemical shift values of $^1H^\alpha_i$ and $^1H^\beta_i$ in a phase sensitive manner.

In addition, the method of conducting a RD 3D H$^{\alpha/\beta}$, C$^{\alpha/\beta}$,CO,HA NMR experiment can involve applying radiofrequency pulses under conditions effective (1) to generate additional NMR signals encoding the chemical shift values of $^{13}C^\alpha_i$, $^{13}C^\beta_i$ and $^{13}C'_i$ in a phase sensitive manner in $t_1(^{13}C^{\alpha/\beta})$ and $t_2(^{13}C')$, respectively, and the chemical shift value of $^1H^\alpha_i$ in $t_3(^1H^\alpha)$ and (2) to cosine modulate the $^{13}C^\alpha_i$ and $^{13}C^\beta_i$ chemical shift evolutions in $t_1(^{13}C^{\alpha/\beta})$ with the chemical shift evolutions of $^1H^\alpha_i$ and $^1H^\beta_i$ for the additional NMR signals. Then, the NMR signals and the additional NMR signals are processed to further generate a cosine-modulated 3D NMR spectrum with in-phase peak pairs derived from the cosine modulating, a sum 3D NMR spectrum generated by adding the sine-modulated 3D NMR spectrum and the cosine-modulated 3D NMR spectrum, and a difference 3D NMR spectrum generated by subtracting the cosine-modulated 3D NMR spectrum from the sine-modulated 3D NMR spectrum. The combined use of the sum 3D NMR spectrum and the difference 3D NMR spectrum enables placement of the two peaks forming the peak pairs into separate spectra, thereby allowing phase-sensitive editing of the two peaks forming the peak pairs.

In addition, the method of conducting a RD 3D H$^{\alpha/\beta}$, C$^{\alpha/\beta}$,CO,HA NMR experiment can involve applying radiofrequency pulses under conditions effective (1) to generate additional NMR signals encoding the chemical shift values of $^{13}C^\alpha_i$, $^{13}C^\beta_i$ and $^{15}N_i$ in a phase sensitive manner in $t_1(^{13}C^{\alpha/\beta})$ and $t_2(^{15}N)$ and the chemical shift value of $^1H^\alpha_i$ in $t_3(^1H^\alpha)$, and (2) to avoid cosine modulating the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$ for the additional NMR signals. Then, the NMR signals and the additional NMR signals are processed to generate a 3D NMR spectrum with additional peaks located centrally between two peaks forming the peak pairs which measure the chemical shift values of $^{13}C^\alpha_i$ and $^{13}C^\beta_i$ along $\omega_1(^{13}C^{\alpha/\beta})$. Those additional peaks can be derived from $^{13}C^\alpha$ and $^{13}C^\beta$ nuclear spin polarization. One specific embodiment (3D H$^{\alpha/\beta}$C$^{\alpha/\beta}$COHA) of this method is illustrated in FIG. 2E, where the applying radiofrequency pulses effects a nuclear spin polarization transfer, where a radiofrequency pulse is used to create transverse $^1H^\alpha_i$ and $^1H^\beta_i$ magnetization, and $^1H^\alpha_i$ and $^1H^\beta_i$ polarization is transferred to $^{13}C^\alpha_i$ and $^{13}C^\beta_i$, to $^{13}C'_i$, and back to $^1H^\alpha_i$, where the NMR signal is detected. Another specific embodiment of this method involves applying radiofrequency pulses by (1) applying a first set of radiofrequency pulses according to the scheme shown in FIG. 3E to generate a first NMR signal, and (2) applying a second set of radiofrequency pulses according to the scheme shown in FIG. 3E, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D $H^{\alpha/\beta}, C^{\alpha/\beta}, CO, HA$ NMR experiment can be modified to a RD 2D $H^{\alpha/\beta}, C^{\alpha/\beta}, (CO), HA$ NMR experiment, which involves applying radiofrequency pulses so that the chemical shift evolution of $^{13}C'_i$ does not occur. Then, the NMR signals are processed to generate a two dimensional (2D) NMR spectrum with peak pairs where (1) the chemical shift value of $^1H^\alpha_i$ is measured in a frequency domain dimension, $\omega_2(^1H^\alpha)$, and (2) (i) the chemical shift values of $^1H^\alpha_i$ and $^1H^\beta_i$ are measured in a frequency domain dimension, $\omega_1(^{13}C^{\alpha/\beta})$, by the frequency differences between two peaks forming the peak pairs, respectively, and (ii) the chemical shift values of $^{13}C^\alpha_i$ and $^{13}C^\beta_i$ are measured in a frequency domain dimension, $\omega_1(^{13}C^{\alpha/\beta})$, by the frequencies at the center of the two peaks forming the peak pairs.

The 3D $H^{\alpha/\beta}, C^{\alpha/\beta}, N, HN$ Experiment

A further aspect of the present invention relates to a method of conducting a reduced dimensionality three-dimensional (3D) $H^{\alpha/\beta}, C^{\alpha/\beta}, N, HN$ nuclear magnetic resonance (NMR) experiment by measuring the chemical shift values for the following nuclei of a protein molecule having an amino acid residue, i: (1) a β-proton of amino acid residue i, $^1H^\beta_i$; (2) a β-carbon of amino acid residue i, $^{13}C^\beta_i$; (3) an α-proton of amino acid residue i, $^1H^\alpha_i$; (4) an α-carbon of amino acid residue i, $^{13}C^\alpha_i$; (5) a polypeptide backbone amide nitrogen of amino acid residue i, $^{15}N_i$; and (6) a polypeptide backbone amide proton of amino acid residue i, $^1H^N_i$, where the chemical shift values of $^1H^\alpha_i/^{13}C^\alpha_i$ and $^1H^\beta_i/^{13}C^\beta_i$ which are encoded in peak pairs of a 3D NMR spectrum are detected in a phase sensitive manner. The method involves providing a protein sample and applying radiofrequency pulses to the protein sample which effect a nuclear spin polarization transfer where the chemical shift evolutions of $^1H^\alpha_i$, $^1H^\beta_i$, $^{13}C^\alpha_i$, and $^{13}C^\beta_i$ are connected to the chemical shift evolutions of $^{15}N_i$ and $^1H^N_i$, under conditions effective (1) to generate NMR signals encoding the chemical shift values of $^{13}C^\alpha_i$, $^{13}C^\beta_i$ and $^{15}N_i$ in a phase sensitive manner in two indirect time domain dimensions, $t_1(^{13}C^{\alpha/\beta})$ and $t_2(^{15}N)$, respectively, and the chemical shift value of $^1H^N_i$ in a direct time domain dimension, $t_3(^1H^N)$, and (2) to sine modulate the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$, respectively. Then, the NMR signals are processed to generate a sine-modulated 3D NMR spectrum with anti-phase peak pairs derived from the sine modulating where (1) the chemical shift values of $^{15}N_i$ and $^1H^N_i$ are measured in two frequency domain dimensions, $\omega_2(^{15}N)$ and $\omega_3(^1H^N)$, respectively, and (2) (i) the chemical shift values of $^1H^\alpha_i$ and $^1H^\beta_i$ are measured in a frequency domain dimension, $\omega_1(^{13}C^{\alpha/\beta})$, by the frequency differences between each of the two peaks forming each of the anti-phase peak pairs, and (ii) the chemical shift values of $^{13}C^\alpha_i$ and $^{13}C^\beta_i$ are measured in a frequency domain dimension, $\omega_1(^{13}C^{\alpha/\beta})$, by the frequencies at the center of the two peaks forming the anti-phase peak pairs, where the sine-modulated 3D NMR spectrum enables detection of the chemical shift values of $^1H^\alpha_i$ and $^1H^\beta_i$ in a phase sensitive manner.

In addition, the method of conducting a RD 3D $H^{\alpha/\beta}, C^{\alpha/\beta}, N, HN$ NMR experiment can involve applying radiofrequency pulses under conditions effective (1) to generate additional NMR signals encoding the chemical shift values of $^{13}C^\alpha_i$, $^{13}C^\beta_i$ and $^{15}N_i$ in a phase sensitive manner in $t_1(^{13}C^{\alpha/\beta})$ and $t_2(^{15}N)$, respectively, and the chemical shift value of $^1H^N_i$ in $t_3(^1H^N)$ and (2) to cosine modulate the $^{13}C^\alpha_i$ and $^{13}C^\beta_i$ chemical shift evolutions in $t_1(^{13}C^{\alpha/\beta})$ with the chemical shift evolutions of $^1H^\alpha_i$ and $^1H^\beta_i$ for the additional NMR signals. Then, the NMR signals and the additional NMR signals are processed to further generate a cosine-modulated 3D NMR spectrum with in-phase peak pairs derived from the cosine modulating, a sum 3D NMR spectrum generated by adding the sine-modulated 3D NMR spectrum and the cosine-modulated 3D NMR spectrum, and a difference 3D NMR spectrum generated by subtracting the cosine-modulated 3D NMR spectrum from the sine-modulated 3D NMR spectrum. The combined use of the sum 3D NMR spectrum and the difference 3D NMR spectrum enables placement of the two peaks forming the peak pairs into separate spectra, thereby allowing phase-sensitive editing of the two peaks forming the peak pairs.

In addition, the method of conducting a RD 3D $H^{\alpha/\beta}, C^{\alpha/\beta}, N, HN$ NMR experiment can involve applying radiofrequency pulses under conditions effective (1) to generate additional NMR signals encoding the chemical shift values of $^{13}C^\alpha_i$, $^{13}C^\beta_i$ and $^{15}N_i$ in a phase sensitive manner in $t_1(^{13}C^{\alpha/\beta})$ and $t_2(^{15}N)$ and the chemical shift value of $^1H^N_i$ in $t_3(^1H^N)$, and (2) to avoid cosine modulating the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$ for the additional NMR signals. Then, the NMR signals and the additional NMR signals are processed to generate a 3D NMR spectrum with additional peaks located centrally between two peaks forming the peak pairs which measure the chemical shift values of $^{13}C^\alpha_i$ and $^{13}C^\beta_i$ along $\omega_1(^{13}C^{\alpha/\beta})$. Those additional peaks can be derived from $^{13}C^\alpha$ and $^{13}C^\beta$ nuclear spin polarization. One specific embodiment (3D $H^{\alpha/\beta}C^{\alpha/\beta}NHN$) of this method is illustrated in FIG. 2F, where the applying radiofrequency pulses effects a nuclear spin polarization transfer where a radiofrequency pulse is used to create transverse $^1H^\alpha_i$ and $^1H^\beta_i$ magnetization, and $^1H^\alpha_i$ and $^1H^\beta_i$ magnetization is transferred to $^{13}C^\alpha_i$ and $^{13}C^\beta_i$, to $^{15}N_i$, and to $^1H^N_i$, where the NMR signal is detected. Another specific embodiment of this method involves applying radiofrequency pulses by (1) applying a first set of radiofrequency pulses according to the scheme shown in FIG. 3F to generate a first NMR signal, and (2) applying a second set of radiofrequency pulses according to the scheme shown in FIG. 3F, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D $H^{\alpha/\beta}, C^{\alpha/\beta}, N, HN$ NMR experiment can be modified to a RD 2D $H^{\alpha/\beta}, C^{\alpha/\beta}, (N), HN$ NMR experiment which involves applying radiofrequency pulses so that the chemical shift evolution of $^{15}N_i$ does not occur. Then, the NMR signals are processed to generate a two dimensional (2D) NMR spectrum with peak pairs where (1) the chemical shift value of $^1H^N_i$ is measured in a frequency domain dimension, $\omega_2(^1H^N)$, and (2) (i) the chemical shift values of $^1H^\alpha_i$ and $^1H^\beta_i$ are measured in a frequency domain dimension, $\omega_1(^{13}C^{\alpha/\beta})$, by the frequency differences between the two peaks forming the peak pairs, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

The 3D H,C,C,H-COSY Experiment

The present invention also relates to a method of conducting a reduced dimensionality three-dimensional (3D) H, C,C,H-COSY nuclear magnetic resonance (NMR) experiment by measuring the chemical shift values for $^1H^m$, $^{13}C^m$, $^1H^n$, and $^{13}C^n$ of a protein molecule where m and n indicate atom numbers of two CH, CH$_2$ or CH$_3$ groups that are linked by a single covalent carbon-carbon bond in an amino acid residue, where the chemical shift values of $^1H^m$ and $^{13}C^m$ which are encoded in a peak pair of a 3D NMR spectrum are detected in a phase sensitive manner. The method involves providing a protein sample and applying radiofrequency pulses to the protein sample which effects a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, respectively, and the chemical shift value of $^1H^n$ in a direct time domain dimension, $t_3(^1H^n)$, and (2) to sine modulate the chemical shift evolution of $^{13}C^m$ in $t_1(^{13}C^m)$ with the chemical shift evolution of $^1H_m$. Then, the NMR signals are processed to generate a sine-modulated 3D NMR spectrum with anti-phase peak pairs derived from the sine modulating where (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between each of the two peaks forming each of the anti-phase peak pairs and the frequencies at the center of the two peaks, respectively, where the sine-modulated 3D NMR spectrum enables detection of the chemical shift value of $^1H^m$ in a phase sensitive manner.

In addition, the method of conducting a RD 3D H, C,C,H-COSY NMR experiment can involve applying radiofrequency pulses under conditions effective (1) to generate additional NMR signals encoding the chemical shift values of $^{13}C^m$ and $^{13}C^n$ in a phase sensitive manner in $t_1(^{13}C^m)$ and $t_2(^{13}C^n)$, respectively, and the chemical shift value of $^1H^n$ in $t_3(^1H^n)$, and (2) to cosine modulate the $^{13}C^m$ chemical shift evolution in $t_1(^{13}C^m)$ with the chemical shift evolution of $^1H^m$ for the additional NMR signals. Then, the NMR signals and the additional NMR signals are processed to further generate a cosine-modulated 3D NMR spectrum with in-phase peak pairs derived from the cosine modulating, a sum 3D NMR spectrum generated by adding the sine-modulated 3D NMR spectrum and the cosine-modulated 3D NMR spectrum, and a difference 3D NMR spectrum generated by subtracting the cosine-modulated 3D NMR spectrum from the sine-modulated 3D NMR spectrum. The combined use of the sum 3D NMR spectrum and the difference 3D NMR spectrum enables placement of the two peaks forming the peak pairs into separate spectra, thereby allowing phase-sensitive editing of the two peaks forming the peak pairs.

In addition, the method of conducting a RD 3D H, C,C,H-COSY NMR experiment can involve applying radiofrequency pulses under conditions effective (1) to generate additional NMR signals encoding the chemical shift values of $^{13}C^m$ and $^{13}C^n$ in a phase sensitive manner in $t_1(^{13}C^m)$ and $t_2(^{13}C^n)$ and the chemical shift value of $^1H^n$ in $t_3(^1H)$, and (2) to avoid cosine modulating the chemical shift evolution of $^{13}C^m$ in $t_1(^{13}C^m)$ with the chemical shift evolution of $^1H^m$ for the additional NMR signals. Then, the NMR signals and the additional NMR signals are processed to generate a 3D NMR spectrum with additional peaks located centrally between two peaks forming the peak pairs which measure the chemical shift value of $^{13}C^m$ along $\omega_1(^{13}C^m)$. Those additional peaks can be derived from $^{13}C^m$ nuclear spin polarization. One specific embodiment (3D HCCH-COSY) of this method is illustrated in FIG. 2H, where the applying radiofrequency pulses effects a nuclear spin polarization transfer, where a radiofrequency pulse is used to create transverse $^1H^m$ magnetization, and $^1H^m$ magnetization is transferred to $^{13}C^m$, to $^{13}C^n$, and to $^1H^n$, where the NMR signal is detected. Another specific embodiment of this method involves applying radiofrequency pulses by (1) applying a first set of radiofrequency pulses according to the scheme shown in FIG. 3H to generate a first NMR signal, and (2) applying a second set of radiofrequency pulses according to the scheme shown in FIG. 3H, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D H,C,C,H-COSY NMR experiment can be modified to a RD 2D H, C,(C),H-COSY NMR experiment which involves applying radiofrequency pulses so that the chemical shift evolution of $^{13}C^n$ does not occur. Then, the NMR signals are processed to generate a two dimensional (2D) NMR spectrum with peak pairs where (1) the chemical shift value of $^1H^n$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

The 3D H,C,C,H-TOCSY Experiment

Another aspect of the present invention relates to a method of conducting a reduced dimensionality three-dimensional (3D) H,C,C,H-TOCSY nuclear magnetic resonance (NMR) experiment by measuring the chemical shift values for $^1H^m$, $^{13}C^m$, $^1H^n$, and $^{13}C^n$ of a protein molecule where m and n indicate atom numbers of two CH, CH$_2$ or CH$_3$ groups that may or may not be directly linked by a single covalent carbon-carbon bond in an amino acid residue, where the chemical shift values of $^1H^m$ and $^{13}C^m$ which are encoded in a peak pair of a 3D NMR spectrum are detected in a phase sensitive manner. The method involves providing a protein sample and applying radiofrequency pulses to the protein sample which effect a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, and the chemical shift value of $^1H''$ in a direct time domain dimension, $t_3(^1H'')$, and (2) to sine modulate the chemical shift evolution of $^{13}C^m$ in $\omega_1(^{13}C^m)$ with the chemical shift evolution of $^1H'''$. Then, the NMR signals are processed to generate a sine-modulated 3D NMR spectrum with anti-phase peak pairs derived from the sine modulating where (1) the chemical shift values of $^{13}C^n$ and $^1H''$ are measured in two frequency domain dimensions, $\omega_2(^{13}C^n)$ and $\omega_3(^1H'')$, respectively, and (2) the chemical shift values of $^1H'''$ and $^{13}C^m$ are measured in a frequency domain dimension, $\omega_1(^{13}C^m)$, by the frequency differences between each of the two peaks forming each of the anti-phase peak pairs and the frequencies at the center of the two peaks, respectively, where the sine-modulated 3D NMR spectrum enables detection of the chemical shift value of $^1H'''$ in a phase sensitive manner.

In addition, the method of conducting a RD 3D H,C,C,H-TOCSY NMR can involve applying radiofrequency pulses under conditions effective (1) to generate additional NMR signals encoding the chemical shift values of $^{13}C^m$ and $^{13}C^n$ in a phase sensitive manner in $t_1(^{13}C^m)$ and $t_2(^{13}C^n)$, respectively, and the chemical shift value of $^1H''$ in $t_3(^1H'')$ and (2) to cosine modulate the $^{13}C^m$ chemical shift evolution in $t_1(^{13}C^m)$ with the chemical shift evolution of $^1H_m$ for the additional NMR signals. Then, the NMR signals and the additional NMR signals are processed to further generate a cosine-modulated 3D NMR spectrum with in-phase peak pairs derived from the cosine modulating, a sum 3D NMR spectrum generated by adding the sine-modulated 3D NMR spectrum and the cosine-modulated 3D NMR spectrum, and a difference 3D NMR spectrum generated by subtracting the cosine-modulated 3D NMR spectrum from the sine-modulated 3D NMR spectrum. The combined use of the sum 3D NMR spectrum and the difference 3D NMR spectrum enables placement of the two peaks forming the peak pairs into separate spectra, thereby allowing phase-sensitive editing of the two peaks forming the peak pairs.

In addition, the method of conducting a RD 3D H,C,C,H-TOCSY NMR can involve applying radiofrequency pulses under conditions effective (1) to generate additional NMR signals encoding the chemical shift values of $^{13}C^m$ and $^{13}C^n$ in a phase sensitive manner in $t_1(^{13}C^m)$ and $t_2(^{13}C^n)$ and the chemical shift value of $^1H''$ in $t_3(^1H'')$, and (2) to avoid cosine modulating the chemical shift evolution of $^{13}C^m$ in $t_1(^{13}C^m)$ with the chemical shift evolution of $^1H'''$ for the additional NMR signals. Then, the NMR signals and the additional NMR signals are processed to generate a 3D NMR spectrum with additional peaks located centrally between two peaks forming the peak pairs which measure the chemical shift value of $^{13}C^m$ along $\omega_1(^{13}C^m)$. Those additional peaks can be derived from $^{13}C^m$ nuclear spin polarization. One specific embodiment (3D HCCH-TOCSY) of this method is illustrated in FIG. 2I, where the applying radiofrequency pulses effects a nuclear spin polarization transfer where a radiofrequency pulse is used to create transverse $^1H'''$ magnetization, and $^1H'''$ magnetization is transferred to $^{13}C^m$, to $^{13}C^n$, and to $^1H''$, where the NMR signal is detected. Another specific embodiment of this method involves applying radiofrequency pulses by (1) applying a first set of radiofrequency pulses according to the scheme shown in FIG. 3I to generate a first NMR signal, and (2) applying a second set of radiofrequency pulses according to the scheme shown in FIG. 3I, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D H,C,C,H-TOCSY NMR experiment can be modified to a RD 2D H,C,(C),H-TOCSY NMR experiment which involves applying radiofrequency pulses so that the chemical shift evolution of $^{13}C^n$ does not occur. Then, the NMR signals are processed to generate a two dimensional (2D) NMR spectrum with peak pairs where (1) the chemical shift value of $^1H''$ is measured in a frequency domain dimension, $\omega_2(^1H'')$, and (2) the chemical shift values of $^1H'''$ and $^{13}C^m$ are measured in a frequency domain dimension, $\omega_1(^{13}C^m)$, by the frequency differences between the two peaks forming the peak pairs and the frequencies at the center of the two peaks, respectively.

The 2D HB,CB,(CG,CD),HD Experiment

A further aspect of the present invention relates to a method of conducting a reduced dimensionality two-dimensional (2D) HB,CB,(CG,CD),HD nuclear magnetic resonance (NMR) experiment by measuring the chemical shift values for the following nuclei of a protein molecule: (1) a β-proton of an amino acid residue with an aromatic side chain, $^1H^\beta$; (2) a β-carbon of an amino acid residue with an aromatic side chain, $^{13}C^\beta$; and (3) a δ-proton of an amino acid residue with an aromatic side chain, $^1H^\delta$, where the chemical shift values of $^1H^\beta$ and $^{13}C^\beta$ which are encoded in a peak pair of a 2D NMR spectrum are detected in a phase sensitive manner. The method involves providing a protein sample and applying radiofrequency pulses to the protein sample which effect a nuclear spin polarization transfer where the chemical shift evolutions of $^1H^\beta$ and $^{13}C^\beta$ are connected to the chemical shift evolution of $^1H^\delta$, under conditions effective (1) to generate NMR signals encoding the chemical shift value of $^{13}C^\beta$ in a phase sensitive manner in an indirect time domain dimension, $t_1(^{13}C^\beta)$, and the chemical shift value of $^1H^\delta$ in a direct time domain dimension, $t_2(^1H^\delta)$, and (2) to sine modulate the chemical shift evolution of $^{13}C^\beta$ in $t_1(^{13}C^\beta)$ with the chemical shift evolution of $^1H^\beta$. Then, the NMR signals are processed to generate a sine-modulated 2D NMR spectrum with an anti-phase peak pair derived from the sine modulating where (1) the chemical shift value of $^1H^\delta$ is measured in a frequency domain dimension, $\omega_2(^1H^\delta)$, and (2) the chemical shift values of $^1H^\beta$ and $^{13}C^\beta$ are measured in a frequency domain dimension, $\omega_1(^{13}C^\beta)$, by the frequency difference between the two peaks forming the anti-phase peak pair and the frequency at the center of the two peaks, respectively, where the sine-modulated 2D NMR spectrum enables detection of the chemical shift value of $^1H^\beta$ in a phase sensitive manner.

In addition, the method of conducting a RD 2D HB,CB,(CG,CD),HD NMR experiment can involve applying radio-frequency pulses under conditions effective (1) to generate additional NMR signals encoding the chemical shift value of $^{13}C^\beta$ in a phase sensitive manner in $t_1(^{13}C^\beta)$ and the chemical shift value of $^1H^\delta$ in $t_2(^1H^\delta)$ and (2) to cosine modulate the $^{13}C^\beta$ chemical shift evolution in $t_1(^{13}C^\beta)$ with the chemical shift evolution of $^1H^\beta$ for the additional NMR signals. Then, the NMR signals and the additional NMR signals are processed to further generate a cosine-modulated 2D NMR spectrum with an in-phase peak pair derived from the cosine modulating, a sum 2D NMR spectrum generated by adding the sine-modulated 2D NMR spectrum and the cosine-modulated 2D NMR spectrum, and a difference 2D NMR spectrum generated by subtracting the cosine-modulated 2D NMR spectrum from the sine-modulated 2D NMR spectrum. The combined use of the sum 2D NMR spectrum and the difference 2D NMR spectrum enables placement of the two peaks forming the peak pairs into separate spectra, thereby allowing phase-sensitive editing of the two peaks forming the peak pairs.

In addition, the method of conducting a RD 2D HB,CB,(CG,CD),HD NMR experiment can involve applying radio-frequency pulses under conditions effective (1) to generate additional NMR signals encoding the chemical shift value of $^{13}C^\beta$ in a phase sensitive manner in $t_1(^{13}C^\beta)$ and the chemical shift value of $^1H^\delta$ in $t_2(^1H^\delta)$, and (2) to avoid cosine modulating the chemical shift evolution of $^{13}C^\beta$ in $t_1(^{13}C^\beta)$ with the chemical shift evolution of $^1H^\beta$ for the additional NMR signals. Then, the NMR signals and the additional NMR signals are processed to generate a 2D NMR spectrum with an additional peak located centrally between the two peaks forming the peak pair which measure the chemical shift value of $^{13}C^\beta$ along $\omega_1(^{13}C)$. That additional peak can be derived from $^{13}C^\beta$ nuclear spin polarization. One specific embodiment (2D HBCB(CGCD)HD) of this method is illustrated in FIG. 2J, where the applying radiofrequency pulses effects a nuclear spin polarization transfer where a radiofrequency pulse is used to create transverse $^1H^\beta$ magnetization, and $^1H^\beta$ magnetization is transferred to $^{13}C^\beta$, to $^{13}C^\delta$, and to $^1H^\delta$, where the NMR signal is detected. Another specific embodiment of this method involves applying radiofrequency pulses by (1) applying a first set of radiofrequency pulses according to the scheme shown in FIG. 3J to generate a first NMR signal, and (2) applying a second set of radiofrequency pulses according to the scheme shown in FIG. 3J, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pair, and a second NMR subspectrum derived from the adding which contains the additional peak located centrally between the two peaks forming the peak pair.

In an alternate embodiment, the RD 2D HB,CB,(CG,CD),HD NMR experiment can be modified to a RD 3D HB,CB(CG),CD,HD NMR experiment which involves applying radiofrequency pulses so that the chemical shift evolution of a δ-carbon of an amino acid residue with an aromatic side chain, $^{13}C^\delta$ occurs under conditions effective to generate NMR signals encoding the chemical shift value of $^{13}C^\delta$ in a phase sensitive manner in an indirect time domain dimension, $t_3(^{13}C^\delta)$. Then, the NMR signals are processed to generate a three dimensional (3D) NMR spectrum with a peak pair where (1) the chemical shift values of $^1H^\delta$ and $^{13}C^\delta$ are measured in two frequency domain dimensions, $\omega_2(^1H^\delta)$ and $\omega_3(^{13}C^\delta)$, respectively, and (2) the chemical shift values of $^1H^\beta$ and $^{13}C^\beta$ are measured in a frequency domain dimension, $\omega_1(^{13}C^\beta)$, by the frequency difference between the two peaks forming the peak pair and the frequency at the center of the two peaks, respectively.

In an alternate embodiment, the RD 2D HB,CB,(CG,CD),HD NMR experiment can be modified to a RD 3D HB,CB,CG,(CD),HD NMR experiment which involves applying radiofrequency pulses so that the chemical shift evolution of a γ-carbon of an amino acid residue with an aromatic side chain, $^{13}C^\gamma$ occurs under conditions effective to generate NMR signals encoding the chemical shift value of $^{13}C^\delta$ in a phase sensitive manner in an indirect time domain dimension, $t_3(^{13}C^\gamma)$, and said processing the NMR signals generates a three dimensional (3D) NMR spectrum with a peak pair wherein (1) the chemical shift values of $^1H^\delta$ and $^{13}C^\gamma$ are measured in two frequency domain dimensions, $\omega_2(^1H^\delta)$ and $\omega_3(^{13}C^\gamma)$, respectively, and (2) the chemical shift values of $^1H^\beta$ and $^{13}C^\beta$ are measured in a frequency domain dimension, $\omega_1(^{13}C^\beta)$, by the frequency difference between the two peaks forming said peak pair and the frequency at the center of the two peaks, respectively.

The 2D H,C,C,H-COSY Experiment

The present invention also relates to a method of conducting a reduced dimensionality two-dimensional (2D)H,C,H-COSY nuclear magnetic resonance (NMR) experiment by measuring the chemical shift values for $^1H^m$, $^{13}C^m$, and $^1H^n$ of a protein molecule where m and n indicate atom numbers of two CH, $CH_2$ or $CH_3$ groups in an amino acid residue, where the chemical shift values of $^1H^m$ and $^{13}C^m$ which are encoded in a peak pair of a 2D NMR spectrum are detected in a phase sensitive manner. The method involves providing a protein sample and applying radiofrequency pulses to the protein sample which effect a nuclear spin polarization transfer where the chemical shift evolutions of $^1H^m$ and $^{13}C^m$ are connected to the chemical shift evolution of $^1H^n$, under conditions effective (1) to generate NMR signals encoding the chemical shift value of $^{13}C^m$ in a phase sensitive manner in an indirect time domain dimension, $t_1(^{13}C^m)$, and the chemical shift value of $^1H^n$ in a direct time domain dimension, $t_2(^1H^n)$, and (2) to sine modulate the chemical shift evolution of $^{13}C^m$ in $t_1(^{13}C^m)$ with the chemical shift evolution of $^1H^m$. Then, the NMR signals are processed to generate a sine-modulated 2D NMR spectrum with anti-phase peak pairs derived from the sine modulating where (1) the chemical shift value of $^1H^m$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between each of the two peaks forming each of the anti-phase peak pairs and the frequencies at the center of the two peaks, respectively, where the sine-modulated 2D NMR spectrum enables detection of the chemical shift value of $^1H^m$ in a phase sensitive manner.

In addition, the method of conducting a RD 2D H,C,H-COSY NMR experiment can involve applying radiofrequency pulses under conditions effective (1) to generate additional NMR signals encoding the chemical shift value of $^{13}C^m$ in a phase sensitive manner in $t_1(^{13}C^m)$ and the chemical shift value of $^1H^n$ in $t_2(^1H^n)$ and (2) to cosine modulate the $^{13}C^m$ chemical shift evolution in $t_1(^{13}C^m)$ with the chemical shift evolution of $^1H^m$ for the additional NMR signals. Then, the NMR signals and the additional NMR signals are processed to further generate a cosine-modulated 2D NMR spectrum with in-phase peak pairs derived from the cosine modulating, a sum 2D NMR spectrum generated by adding the sine-modulated 2D NMR spectrum and the cosine-modulated 2D NMR spectrum, and a difference 2D NMR spectrum generated by subtracting the cosine-modulated 2D NMR spectrum from the sine-modulated 2D NMR spectrum. The combined use of the sum 2D NMR spectrum and the difference 2D NMR spectrum enables placement of the two peaks forming the peak pairs into separate spectra, thereby allowing phase-sensitive editing of the two peaks forming the peak pairs.

One specific embodiment (2D $^1$H-TOCSY-HCH-COSY) of this method is illustrated in FIG. 2K, where the applying radiofrequency pulses effects a nuclear spin polarization transfer where a radiofrequency pulse is used to create transverse $^1H^m$ magnetization, and $^1H^m$ polarization is transferred to $^{13}C^m$, to $^1H^m$, and to $^1H^n$, where the NMR signal is detected. Although the specific embodiment illustrated in FIG. 2K shows this method applied to an amino acid residue with an aromatic side chain, this method also applies to amino acid residues with aliphatic side chains. Another specific embodiment of this method involves applying radiofrequency pulses according to the scheme shown in FIG. 3K.

FIG. 4 outlines which chemical shifts are correlated in the various NMR experiments described above.

Combinations of RD NMR Experiments

Accordingly, a suite of multidimensional RD NMR experiments enables one to devise strategies for RD NMR-based HTP resonance assignment of proteins.

Thus, another aspect of the present invention relates to a method for sequentially assigning chemical shift values of an α-proton, $^1H^\alpha$, an α-carbon, $^{13}C^\alpha$, a polypeptide backbone amide nitrogen, $^{15}N$, and a polypeptide backbone amide proton, $^1H^N$ of a protein molecule. The method involves providing a protein sample and conducting a set of reduced dimensionality (RD) nuclear magnetic resonance (NMR) experiments on the protein sample, where the chemical shift values of $^1H^\alpha$ and $^{13}C^\alpha$ which are encoded in a peak pair of a 3D NMR spectrum are detected in a phase sensitive manner, including: (1) a RD 3D HA,CA,(CO),N,HN NMR experiment to measure and connect chemical shift values of the α-proton of amino acid residue i−1, $^1H^\alpha_{i-1}$, the α-carbon of amino acid residue i−1, $^{13}C^\alpha_{i-1}$, the polypeptide backbone amide nitrogen of amino acid residue i, $^{15}N_i$, and the polypeptide backbone amide proton of amino acid residue i, $^1H^N_i$, and (2) a RD 3D HNNCAHA NMR experiment to measure and connect the chemical shift values of the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^\alpha$, $^{13}C^\alpha$, $^{15}N$, and $^1H^N$ are obtained by (i) matching the chemical shift values of $^1H^\alpha_{i-1}$ and $^{13}C^\alpha_{i-1}$ with the chemical shift values of $^1H^\alpha_i$ and $^{13}C^\alpha_i$, (ii) using the chemical shift values of $^1H^\alpha_{i-1}$ and $^{13}C^\alpha_{i-1}$ to identify the type of amino acid residue i−1 (Wüthrich, *NMR of Proteins and Nucleic Acids*, Wiley, New York (1986); Grzesiek et al., *J. Biomol. NMR*, 3: 185-204 (1993), which are hereby incorporated by reference in their entirety), and (iii) mapping sets of sequentially connected chemical shift values to the amino acid sequence of the polypeptide chain and using the chemical shift values to locate secondary structure elements (such as α-helices and β-sheets) within the polypeptide chain (Spera et al., *J. Am. Chem. Soc.*, 113:5490-5492 (1991); Wishart et al., Biochemistry, 31:1647-1651 (1992), which are hereby incorporated by reference in their entirety).

In one embodiment, the protein sample could, in addition to the RD 3D HA,CA,(CO),N,HN NMR experiment and the RD 3D HNNCAHA NMR experiment, be further subjected to a RD 3D HNN<CO,CA> NMR experiment to measure and connect the chemical shift values of a polypeptide backbone carbonyl carbon of amino acid residue i−1, $^{13}C'_{i-1}$, $^{13}C^\alpha_i$, $^{15}N_i$, and $^1H^N_i$. Then, sequential assignments of the chemical shift value of $^{13}C'_{i-1}$ are obtained by matching the chemical shift value of $^{13}C^\alpha_i$ measured by the RD 3D HNN<CO,CA> NMR experiment with the sequentially assigned chemical shift values of $^{13}C^\alpha$, $^{15}N$, and $^1H^N$ measured by the RD 3D HA,CA,(CO),N,HN NMR experiment and the RD 3D HNNCAHA NMR experiment.

In another embodiment, the protein sample could, in addition to the RD 3D HA,CA,(CO),N,HN NMR experiment and the RD 3D HNNCAHA NMR experiment, be further subjected to (i) a RD 3D $H^{\alpha/\beta},C^{\alpha/\beta}$,CO,HA NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\alpha_i$, the α-carbon of amino acid residue i, $^{13}C^\alpha_i$, and a polypeptide backbone carbonyl carbon of amino acid residue i, $^{13}C'_i$, and (ii) a RD 3D HNN<CO,CA> NMR experiment to measure and connect the chemical shift values of $^{13}C'_i$, the α-carbon of amino acid residue i+1, $^{13}C^\alpha_{i+1}$, the polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$ measured by the RD 3D HNN<CO,CA> NMR experiment with the chemical shift value of $^{13}C'_i$ measured by the RD 3D $H^{\alpha/\beta},C^{\alpha/\beta}$,CO,HA NMR experiment.

In another embodiment, the protein sample could, in addition to the RD 3D HA,CA,(CO),N,HN NMR experiment and the RD 3D HNNCAHA NMR experiment, be further subjected to a RD 3D H,C,(C-TOCSY-CO),N,HN NMR experiment to measure and connect the chemical shift values of aliphatic protons (including α-, β-, and γ-protons) of amino acid residue i−1, $^1H^{ali}_{i-1}$, aliphatic carbons (including α-, β-, and γ-carbons) of amino acid residue i−1, $^{13}C^{ali}_{i-1}$, $^{15}N_i$, and $^1H^N_i$. Then, sequential assignments of the chemical shift values of $^1H^{ali}_{i-1}$ and $^{13}C^{ali}_{i-1}$ for amino acid residues i having unique pairs of $^{15}N_i$ and $^1H^N_i$ chemical shift values are obtained by matching the chemical shift values of $^1H^\alpha$ and $^{13}C^\alpha$ measured by said RD 3D HNNCAHA NMR experiment and RD 3D HA,CA,(CO),N,HN NMR experiment with the chemical shift values of $^1H^\alpha_{i-1}$ and $^{13}C^\alpha_{i-1}$ measured by said RD 3D H,C,(C-TOCSY-CO),N,HN NMR experiment and using the $^1H^{ali}_{i-1}$ and $^{13}C^{ali}_{i-1}$ chemical shift values to identify the type of amino acid residue i−1.

In another embodiment, the protein sample could, in addition to the RD 3D HA,CA,(CO),N,HN NMR experiment and the RD 3D HNNCAHA NMR experiment, be further subjected to a RD 3D H,C,C,H-COSY NMR experiment or a RD 3D H,C,C,H-TOCSY NMR experiment to measure and connect the chemical shift values of $^1H^{ali}_i$ and $^{13}C^{ali}_i$ of amino acid residue i. Then, sequential assignments of the chemical shift values of $^1H^{ali}_i$ and $^{13}C^{ali}_i$, the chemical shift values of a γ-proton, $^1H^\gamma_i$, and a γ-carbon, $^{13}C^\gamma_i$, in particular, are obtained by (i) matching the chemical shift values of $^1H^\alpha_i$ and $^{13}C^\alpha_i$ measured using the RD 3D H,C,C,H-COSY NMR experiment or the RD 3D H,C,C,H-TOCSY RD NMR experiment with the chemical shift values of $^1H^\alpha_i$ and $^{13}C^\beta_i$ measured by the RD 3D HA,CA,(CO),N,HN NMR experiment, the RD 3D HNNCAHA NMR experiment, and the RD 3D $H^{\alpha/\beta}C^{\alpha/\beta}$(CO)NHN NMR experiment and (ii) using the chemical shift values of $^1H^{ali}$ and $^{13}C^{ali}$, including the chemical shift values of $^1H^\gamma_i$ and $^{13}C^\gamma_i$, to identify the type of amino acid residue i.

In yet another embodiment, this method involves, in addition to the RD 3D HA,CA,(CO),N,HN NMR experiment and the RD 3D HNNCAHA NMR experiment, further subjecting the protein sample to a RD 3D $H^{\alpha/\beta}C^{\alpha/\beta}$(CO)NHN NMR experiment to measure and connect the chemical shift values of the β-proton of amino acid residue i−1, $^1H^\beta_{i-1}$, the β-carbon of amino acid residue i−1, $^{13}C^\beta_{i-1}$, $^1H^\alpha_{i-1}$, $^{13}C^\alpha_{i-1}$, $^{15}N_i$, and $^1H^N_i$. Then, sequential assignments of the chemical shift values of $^1H^\beta$ and $^{13}C^\beta$ are obtained by using the chemical shift values of $^1H^\beta_{i-1}$ and $^{13}C^\beta_{i-1}$ to identify the type of amino acid residue i−1.

In another embodiment, the protein sample could, in addition to the RD 3D HA,CA,(CO),N,HN NMR experiment, the RD 3D HNNCAHA NMR experiment, and the RD 3D $H^{\alpha/\beta}C^{\alpha/\beta}$(CO)NHN NMR experiment, be further subjected to a RD 3D $H^{\alpha/\beta},C^{\alpha/\beta}$,CO,HA NMR experiment to measure and connect the chemical shift values of the β-proton of amino acid residue i, $^1H^\beta_i$, the β-carbon of amino acid residue i, $^{13}C^\beta_i$, $^1H^\alpha_i$, $^{13}C^\alpha_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^\beta_i$, $^{13}C^\beta_i$, $^1H^\alpha_i$, and $^{13}C^\alpha_i$ measured by the RD 3D $\underline{H^{\alpha/\beta},C^{\alpha/\beta}}$,CO,HA NMR experiment with the sequentially assigned chemical shift values of $^1H^\beta$, $^{13}C^\beta$, $^1H^\alpha$, $^{13}C^\alpha$, $^{15}N$, and $^1H^N$ measured by the RD 3D HA,CA,(CO),N,HN NMR experiment, the RD 3D HNN$\overline{CAHA}$ NMR experiment, and the RD 3D $\underline{H^{\alpha/\beta}}$ $C^{\alpha/\beta}\overline{(CO)NHN}$ NMR experiment.

In another embodiment, the protein sample could, in addition to the RD 3D HA,CA,(CO),N,HN NMR experiment, the RD 3D HNNCAHA NMR experiment, and the RD 3D $H^{\alpha/\beta}$ $C^{\alpha/\beta}$(CO)NHN NMR experiment, be further subjected to a RD 3D $\underline{H^{\alpha/\beta},C^{\alpha/\beta}}$,N,HN NMR experiment to measure and connect the chemical shift values of $^1H^\beta_i$, $^{13}C^\beta_i$, $^1H^\alpha_i$, $^{13}C^\alpha_i$, $^{15}N_i$, and $^1H^N_i$. Then, sequential assignments are obtained by matching the chemical shift values of $^1H^\beta_i$, $^{13}C^\beta_i$, $^1H^\alpha_i$, and $^{13}C^\alpha_i$ with the chemical shift values of $^1H^\beta_{i-1}$, $^{13}C^\beta_{i-1}$, $^1H^\alpha_{i-1}$, and $^{13}C^\alpha_{i-1}$ measured by the RD $\underline{H^{\alpha/\beta}}$ $C^{\alpha/\beta}$(CO)NHN NMR experiment.

In another embodiment, the protein sample could, in addition to the RD 3D HA,CA,(CO),N,HN NMR experiment, the RD 3D HNNCAHA NMR experiment, and the RD 3D $H^{\alpha/\beta}$ $C^{\alpha/\beta}$(CO)NHN NMR experiment, be further subjected to a 3D HNNCACB NMR experiment to measure and connect the chemical shift value of $^{13}C^\beta_i$, $^{13}C^\alpha_i$, $^{15}N_i$, and $^1H^N_i$. Then, sequential assignments are obtained by matching the chemical shift values of $^{13}C^\beta_i$ and $^{13}C^\alpha_i$ measured by said 3D HNNCACB NMR experiment with the chemical shift values of $^{13}C^\beta_{i-1}$ and $^{13}C^\alpha_{i-1}$ measured by the RD 3D $\underline{H^{\alpha/\beta}}$ $C^{\alpha/\beta}$(CO)NHN NMR experiment.

In another embodiment, the protein sample could, in addition to the RD 3D HA,CA,(CO),N,HN NMR experiment, the RD 3D HNNCAHA NMR experiment, and the RD 3D $H^{\alpha/\beta}$ $C^{\alpha/\beta}$(CO)NHN NMR experiment, be further subjected to a RD 2D HB,CB,(CG,CD),HD NMR experiment to measure and connect the chemical shift values of $^1H^\beta_{i-1}$, $^{13}C^\beta_{i-1}$, and a δ-proton of amino acid residue I-1 with an aromatic side chain, $^1H^\delta_{i-1}$. Then, sequential assignments are obtained by matching (i) the chemical shift values of $^1H^\beta_{i-1}$ and $^{13}C^\beta_{i-1}$ measured by said RD 2D HB,CB,(CG,CD),HD NMR experiment with the chemical shift values of $^1H^\beta$ and $^{13}C^\beta$ measured by the RD 3D $H^{\alpha/\beta}C^{\alpha/\beta}$(CO)NHN NMR experiment, (ii) using the chemical shift values to identify amino acid residue i as having an aromatic side chain, and (iii) mapping sets of sequentially connected chemical shift values to the amino acid sequence of the polypeptide chain and locating amino acid residues with aromatic side chains along the polypeptide chain.

In another embodiment, the protein sample could, in addition to the RD 3D HA,CA,(CO),N,HN NMR experiment, the RD 3D HNNCAHA NMR experiment, and the RD 3D $H^{\alpha/\beta}$ $C^{\alpha/\beta}$(CO)NHN NMR experiment, be further subjected to a RD 3D H,C,C,H-COSY NMR experiment or a RD 3D H, C,C,H-TOCSY NMR experiment to measure and connect the chemical shift values of aliphatic protons (including α-, β-, and δ-protons) of amino acid residue i, $^1H^\alpha_i$, and aliphatic carbons (including α-, β-, and δ-carbons) of amino acid residue i, $^{13}C^{ali}_i$, of amino acid residue i. Then, sequential assignments of the chemical shift values of $^1H^{ali}_i$ and $^{13}C^{ali}_i$, the chemical shift values of a γ-proton, $^1H^\gamma$, and a γ-carbon, $^{13}C^\gamma$, in particular, are obtained by (i) matching the chemical shift values of $^1H^\beta_i$, $^{13}C^\beta_i$, $^1H^\alpha_i$, and $^{13}C^\alpha_i$ measured using the RD 3D H,C,C,H-COSY NMR experiment or the RD 3D H, C,C,$\overline{H}$-TOCSY RD NMR experiment with the chemical shift values of $^1H^\beta_i$, $^{13}C^\beta_i$, $^1H^\alpha_i$, and $^{13}C^\alpha_i$ measured by the RD 3D HA,CA,(CO),N,HN NMR experiment, the RD 3D HNN$\overline{CAHA}$ NMR experiment, and the RD 3D $H^{\alpha/\beta}$ $\overline{C^{\alpha/\beta}(CO)}$NHN NMR experiment and (ii) using the chemical shift values of $^1H^{ali}$ and $^{13}C^{ali}$, including the chemical shift values of $^1H^\delta$ and $^{13}C^\gamma$, to identify the type of amino acid residue i.

Yet another aspect of the present invention relates to a method for sequentially assigning chemical shift values of a β-proton, $^1H^\beta$, a β-carbon, $^{13}C^\beta$, an α-proton, $^1H^\alpha$, an α-carbon, $^{13}C^\alpha$, a polypeptide backbone amide nitrogen, $^{15}N$, and a polypeptide backbone amide proton, $^1H^N_i$, of a protein molecule. The method involves providing a protein sample and conducting a set of reduced dimensionality (RD) nuclear magnetic resonance (NMR) experiments on the protein sample, where the chemical shift values of $^1H^{\alpha/\beta}$ and $^{13}C^{\alpha/\beta}$ which are encoded in peak pairs of a 3D NMR spectrum are detected in a phase sensitive manner, including: (1) a RD 3D $H^{\alpha/\beta}C^{\alpha/\beta}$(CO)NHN NMR experiment to measure and connect the chemical shift values of the β-proton of amino acid residue i-1, $^1H^\beta_{i-1}$, the β-carbon of amino acid residue i-1, $^{13}C^\beta_{i-1}$, the α-proton of amino acid residue i-1, $^1H^\alpha_{i-1}$, the α-carbon of amino acid residue i-1, $^{13}C^\alpha_{i-1}$, the polypeptide backbone amide nitrogen of amino acid residue i, $^{15}N_i$, and the polypeptide backbone amide proton of amino acid residue i, $^1H^N_i$, and (2) a RD 3D $H^{\alpha/\beta},C^{\alpha/\beta}$,N,HN NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\beta_i$, the β-carbon of amino acid residue i, $^{13}C^\alpha_i$, $^{15}N_i$, and $^1H^N_i$. Then, sequential assignments of the chemical shift values of $^1H^\beta$, $^{13}C^\beta$, $^1H^\alpha$, $^{13}C^\alpha$, $^{15}N$, and $1H^N$ are obtained by (i) matching the chemical shift values of the α- and β-protons of amino acid residue i-1, $^1H^{\alpha/\beta}_{i-1}$, and the chemical shift values of the α- and β-carbons of amino acid residue i-1, $^{13}C^{\alpha/\beta}_{i-1}$, with $^1H^{\alpha/\beta}_i$ and $^{13}C^{\alpha/\beta}_i$, (ii) using $^1H^{\alpha/\beta}_{i-1}$ and $^{13}C^{\alpha/\beta}_{i-1}$ to identify the type of amino acid residue i-1 (Wüthrich, *NMR of Proteins and Nucleic Acids*, Wiley, New York (1986); Grzesiek et al., *J. Biomol. NMR*, 3: 185-204 (1993), which are hereby incorporated by reference in their entirety), (iii) mapping sets of sequentially connected chemical shift values to the amino acid sequence of the polypeptide chain and using the chemical shift values to locate secondary structure elements within the polypeptide chain (Spera et al., *J. Am. Chem. Soc.*, 113: 5490-5492(1991); Wishart et al., Biochemistry, 31:1647-1651(1992), which are hereby incorporated by reference in their entirety).

In one embodiment, the protein sample could, in addition to the RD 3D $H^{\alpha/\beta}C^{\alpha/\beta}$(CO)NHN NMR experiment and the RD 3D $\underline{H^{\alpha/\beta}},\overline{C^{\alpha/\beta}},\overline{N}$,HN NMR experiment, be further subjected to a RD 3D HA,CA,(CO),N,HN NMR experiment (i) to measure and connect chemical shift values of $^1H^\alpha_{i-1}$, $^{13}C^\alpha_{i-1}$, $^{15}N_i$, and $^1H^N_i$ and (ii) to distinguish between NMR signals for $^1H^\alpha/^{13}C^\alpha$ and $^1H^\beta/^{13}C^\beta$ measured in the RD 3D $H^{\alpha/\beta}C^{\alpha/\beta}$(CO)NHN NMR experiment and the RD 3D $\underline{H^{\alpha/\beta}}$, $\overline{C^{\alpha/\beta}},\overline{N}$,HN NMR experiment.

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta}},\overline{N}$,HN NMR experiment, be further subjected to a RD 3D $H^{\alpha/\beta},C^{\alpha/\beta}$,CO,HA NMR experiment to measure and connect the chemical shift values of $^1H^\beta_i$, $^{13}C^\beta_i$, $^1H^\alpha_i$, $^{13}C^\alpha_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^\beta_i$, $^{13}C^\beta_i$, $^1H^\alpha_i$, and $^{13}C^\alpha_i$ measured by the RD 3D $H^{\alpha/\beta},C^{\alpha/\beta}$,CO,HA NMR experiment with the sequentially assigned chemical shift values of $^1H^\beta$, $^{13}C^\beta$, $^1H^\alpha$, $^{13}C^\alpha$, $^{15}N$, and $^1H^N$ measured by the RD 3D $H^{\alpha/\beta}$,$C^{\alpha/\beta}$(CO)NHN NMR experiment and the RD 3D $H^{\alpha/\beta}$,$\overline{C^{\alpha/\beta},N,HN}$ NMR experiment.

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, be further subjected to a RD 3D HNN<CO,CA> NMR experiment to measure and connect the chemical shift values of a polypeptide backbone carbonyl carbon of amino acid residue i–1, $^{13}C'_{i-1}$, $^{13}C^\alpha_i$, $^{15}N_i$, and $^1H^N_i$. Then, sequential assignments of the chemical shift value of $^{13}C'_{i-1}$ are obtained by matching the chemical shift value of $^{13}C^\alpha_i$ measured by the RD 3D HNN<CO,CA> NMR experiment with the sequentially assigned chemical shift values of $^{13}C^\alpha$, $^{15}N$, and $^1H^N$ measured by the RD 3D $H^{\alpha/\beta}C^{\alpha/\beta}$(CO)NHN NMR experiment and RD 3D $H^{\alpha/\beta},C^{\alpha/\beta},\overline{N,HN}$ NMR experiment.

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, be further subjected to (i) a RD 3D $H^{\alpha/\beta},C^{\alpha/\beta}$,CO,HA NMR experiment to measure and connect the chemical shift values of $^1H^\beta_i$, $^{13}C^\beta_i$, $^1H^\alpha_i$, $^{13}C^\alpha_i$, and a polypeptide backbone carbonyl carbon of amino acid residue i, $^{13}C'_i$ and (ii) a RD 3D HNN<CO,CA> NMR experiment to measure and connect the chemical shift values of $^{13}C'_i$, the α-carbon of amino acid residue i+1, $^{13}C^\alpha_{i-1}$, the polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$ measured by said RD 3D HNN<CO,CA> NMR experiment with the chemical shift value of $^{13}C'_i$ measured by the RD 3D $H^{\alpha/\beta},C^{\alpha/\beta}$,CO,HA NMR experiment.

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, be further subjected to a RD 3D H,C,(C-TOCSY-CO),N,HN experiment to measure and connect the chemical shift values of $^1H^{ali}_{i-1}$, $^{13}C^{ali}_{i-1}$, $^{15}N_i$, and $^1H^N_i$. Then, sequential assignments of the chemical shift values of $^1H^{ali}_{i-1}$ and $^{13}C^{ali}_{i-1}$, for amino acid residues i having unique pairs of $^{15}N_i$ and $^1H^N_i$ chemical shift values are obtained by matching the chemical shift values of $^1H^\beta$, $^{13}C^\beta$, $^1H^\alpha$, and $^{13}C^\alpha$ measured by the RD 3D $H^{\alpha/\beta}C^{\alpha/\beta}$(CO)NHN NMR experiment and RD 3D $H^{\alpha/\beta}$,$C^{\alpha/\beta},\overline{N,HN}$ NMR experiment with the chemical shift values of $^1H^\beta_{i-1}$, $^{13}C^\beta_{i-1}$, $^1H^\alpha_{i-1}$, and $^{13}C^\alpha_{i-1}$ measured by the RD 3D H,C,(C-TOCSY-CO),N,HN NMR experiment and using the $^1H^{ali}_{i-1}$ and $^{13}C^{ali}_{i-1}$ chemical shift values to identify the type of amino acid residue i–1.

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, be further subjected to a 3D HNNCACB NMR experiment to measure and connect the chemical shift value of $^{13}C^\beta_i$, $^{13}C^\alpha_i$, $^{15}N_i$, and $^1H^N_i$. Then, sequential assignments are obtained by matching the chemical shift values of $^{13}C^\beta_i$ and $^{13}C^\alpha_i$ measured by said 3D HNNCACB NMR experiment with the chemical shift values of $^{13}C^\beta_{i-1}$ and $^{13}C^\alpha_{i-1}$ measured by the RD 3D $H^{\alpha/\beta}$,$C^{\alpha/\beta}$(CO)NHN NMR experiment.

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, be further subjected to a RD 2D HB,CB,(CG,CD),HD NMR experiment to measure and connect the chemical shift values of $^1H^\beta_i$, $^{13}C^\beta_i$, and a δ-proton of amino acid residue i with an aromatic side chain, $^1H^\delta_i$. Then, sequential assignments are obtained by (i) matching the chemical shift values of $^1H^\beta_i$ and $^{13}C^\beta_i$ measured by said RD 2D HB,CB(CG,CD),HD NMR experiment with the chemical shift values of $^1H^\beta$ and $^{13}C^\beta$ measured by the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, (ii) using the chemical shift values to identify amino acid residue i as having an aromatic side chain, and (iii) mapping sets of sequentially connected chemical shift values to the amino acid sequence of the polypeptide chain and locating amino acid residues with aromatic side chains along the polypeptide chain (Spera et al., *J. Am. Chem. Soc.*, 113:5490-5492 (1991); Wishart et al., Biochemistry, 31:1647-1651 (1992), which are hereby incorporated by reference in their entirety).

In another embodiment, the protein sample could, in addition to the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, be further subjected to a RD 3D H,C,C,H-COSY NMR experiment or a RD 3D H,C,C,H-TOCSY NMR experiment to measure and connect the chemical shift values of aliphatic protons of amino acid residue i, $^1H^{ali}_i$, and aliphatic carbons of amino acid residue i, $^{13}C^{ali}_i$, of amino acid residue i. Then, sequential assignments of the chemical shift values of $^1H^\alpha_i$ and $^{13}C^{ali}_i$, the chemical shift values of a γ-proton, $^1H^\gamma_i$, and a γ-carbon, $^{13}C^\gamma_i$, in particular, are obtained by (i) matching the chemical shift values of $^1H^\beta_i$, $^{13}C^\beta_i$, $^1H^\alpha_i$, and $^{13}C^\alpha_i$ measured using the RD 3D H,C,C,H-COSY NMR experiment or the RD 3D H,C,C,H-TOCSY RD NMR experiment with the chemical shift values of $^1H^\beta$, $^{13}C^\beta$, $^1H^\alpha$, and $^{13}C^\alpha$ measured by the RD 3D $H^{\alpha/\beta}C^{\alpha/\beta}$(CO)NHN NMR experiment and the RD 3D $H^{\alpha/\beta},\overline{C^{\alpha/\beta},N},HN$ NMR experiment, and (ii) using the chemical shift values of $^1H^{ali}_i$ and $^{13}C^{ali}_i$, including the chemical shift values of $H^\gamma_i$ and $^{13}C^\gamma_i$, to identify the type of amino acid residue i.

A further aspect of the present invention involves a method for sequentially assigning the chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$ of a protein molecule. The method involves providing a protein sample and conducting a set of reduced dimensionality (RD) nuclear magnetic resonance (NMR) experiments on the protein sample, where the chemical shift values of $^1H^{ali}$ and $^{13}C^{ali}$ which are encoded in peak pairs of a 3D NMR spectrum are detected in a phase sensitive manner, including: (1) a RD 3D H,C,(C-TOCSY-CO),N,HN NMR experiment to measure and connect the chemical shift values of the aliphatic protons of amino acid residue i–1, $^1H^{ali}_{i-1}$, the aliphatic carbons of amino acid residue i–1, $^{13}C^{ali}_{i-1}$, the polypeptide backbone amide nitrogen of amino acid residue i, $^{15}N_i$, and the polypeptide backbone amide proton of amino acid residue i, $^1H^N_i$, and (2) a RD 3D $H^{\alpha/\beta}$,$C^{\alpha/\beta},N,HN$ NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\alpha_i$, the α-carbon of amino acid residue i, $^{13}C^\alpha$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α- and β-protons of amino acid residue i–1, $^1H^{\alpha/\beta}_{i-1}$ and the α- and β-carbons of amino acid residue i–1, $^{13}C^{\alpha/\beta}_{i-1}$ with the chemical shift values of $H^{\alpha/\beta}_i$ and $^{13}C^{\alpha/\beta}_i$ of amino acid residue i, (ii) using the chemical shift values of $^1H^{ali}_{i-1}$ and $^{13}C^{ali}_{i-1}$ to identify the type of amino acid residue i–1 (Wüthrich, *NMR of Proteins and Nucleic Acids*, Wiley, New York (1986); Grzesiek et al., *J. Biomol. NMR*, 3: 185-204 (1993), which are hereby incorporated by reference in their entirety), and (iii) mapping sets of sequentially connected chemical shift values to the amino acid sequence of the polypeptide chain and using the chemical shift values to locate secondary structure elements within the polypeptide chain (Spera et al., *J. Am. Chem. Soc.*, 113:5490-5492 (1991); Wishart et al., Biochemistry, 31:1647-1651 (1992), which are hereby incorporated by reference in their entirety).

In one embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to a RD 3D $H^{\alpha/\beta},C^{\alpha/\beta}$,CO,HA NMR experiment to measure and connect the chemical shift values of $^1H^\beta_i$, $^{13}C^\beta_i$, $^1H^\alpha_i$, $^{13}C^\alpha_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^\beta_i$, $^{13}C^\beta_i$, $^1H^\alpha_i$, and $^{13}C^\alpha_i$ measured by the RD 3D $H^{\alpha/\beta},C^{\alpha/\beta}$,CO,HA NMR experiment with the sequentially assigned chemical shift values of $^1H^\beta$, $^{13}C^\beta$, $^1H^\alpha$, $^{13}C^\alpha$, $^{15}N$, and $^1H^N$ measured by the RD 3D H,C,(C-TOCSY-CO),N,HN NMR experiment and the RD 3D $\underline{H}^{\alpha/\beta},C^{\alpha/\beta}$,N,HN NMR experiment.

In another embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to a RD 3D HNN<CO,CA> NMR experiment to measure and connect the chemical shift values of a polypeptide backbone carbonyl carbon of amino acid residue i−1, $^{13}C'_{i-1}$, $^{13}C^\alpha_i$, $^{15}N_i$, and $^1H^N_i$. Then, sequential assignments of the chemical shift value of $^{13}C'_{i-1}$ are obtained by matching the chemical shift value of $^{13}C^\alpha_i$ measured by the RD 3D HNN<CO,CA> NMR experiment with the sequentially assigned chemical shift values of $^{13}C^\alpha$, $^{15}N$, and $^1H^N$ measured by the RD 3D H,C,(C-TOCSY-CO),N,HN NMR experiment and the RD 3D $\underline{H}^{\alpha/\beta},C^{\alpha/\beta}$,N,HN NMR experiment.

In another embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to (i) a RD 3D $H^{\alpha/\beta},C^{\alpha/\beta}$,CO,HA NMR experiment to measure and connect the chemical shift values of $^1H^\beta_i$, $^{13}C^\beta_i$, $^1H^\alpha_i$, $^{13}C^\alpha_i$, and a polypeptide backbone carbonyl carbon of amino acid residue i, $^{13}C'_i$, and (ii) a RD 3D HNN<CO,CA> NMR experiment to measure and connect the chemical shift values of $^{13}C'_i$, the α-carbon of amino acid residue i+1, $^{13}C^\alpha_{i+1}$, the polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$ measured by the RD 3D HNN<CO,CA> NMR experiment with the chemical shift value of $^{13}C'_i$ measured by the RD 3D $\underline{H}^{\alpha/\beta},C^{\alpha/\beta}$,CO,HA NMR experiment.

In another embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to a RD 3D $H^{\alpha/\beta}C^{\alpha/\beta}$(CO)NHN NMR experiment (i) to measure and connect the chemical shift values of $^1H^{\alpha/\beta}_{i-1}$, $^{13}C^{\alpha/\beta}_{i-1}$, $^{15}N_i$, and $^1H^N_i$, and (ii) to identify NMR signals for $^1H^{\alpha/\beta}_{i-1}$, $^{13}C^{\alpha/\beta}_{i-1}$, $^{15}N_i$, and $^1H^N_i$ in the RD 3D H,C,(C-TOCSY-CO),N,HN NMR experiment.

In another embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to a RD 3D HA,CA,(CO),N,HN NMR experiment (i) to measure and connect chemical shift values of $^1H^\alpha_{i-1}$, $^{13}C^\alpha_{i-1}$, $^{15}N^i$, and $^1H^N$ and (ii) to identify NMR signals for $^1H^\alpha$ and $^{13}C^\alpha$ in the RD 3D H,C,(C-TOCSY-CO),N,HN NMR experiment and the RD 3D $\underline{H}^{\alpha/\beta},C^{\alpha/\beta}$,N,HN NMR experiment.

In another embodiment, the protein sample could, in addition to the RD 3D $\underline{H,C}$,(C-TOCSY-CO),N,HN NMR experiment and the RD 3D $H^{\alpha/\beta},C^{\alpha/\beta}$,N,HN NMR experiment, be further subjected to a 3D HNNCACB NMR experiment to measure and connect the chemical shift value of $^{13}C^\beta_i$, $^{13}C^\alpha_i$, $^{15}N_i$, and $^1H^N_i$. Then, sequential assignments are obtained by matching the chemical shift values of $^{13}C^\beta_i$ and $^{13}C^\alpha_i$ measured by said 3D HNNCACB NMR experiment with the chemical shift values of $^{13}C^\beta_{i-1}$ and $^{13}C^\alpha_{i-1}$ measured by the RD 3D H,C,(C-TOCSY-CO),N,HN NMR experiment.

In another embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to a RD 2D HB,CB,(CG,CD),HD NMR experiment to measure and connect the chemical shift values of $^1H^\beta_i$, $^{13}C^\beta_i$, and a δ-proton of amino acid residue i with an aromatic side chain, $^1H^\delta_i$. Then, sequential assignments are obtained by matching the chemical shift values of $^1H^\beta_i$ and $^{13}C^\beta_i$ measured by said RD 2D HB,CB,(CG,CD)ND NMR experiment with the chemical shift values of $^1H^\beta$ and $^{13}C^\beta$ measured by the RD 3D $H^{\alpha/\beta},C^{\alpha/\beta}$,N,HN NMR experiment and the RD 3D H,C,(C-TOCSY-CO),N,HN NMR experiment, using the chemical shift values to identify amino acid residue i as having an aromatic side chain, and mapping sets of sequentially connected chemical shift values to the amino acid sequence of the polypeptide chain and locating amino acid residues with aromatic side chains along the polypeptide chain.

In another embodiment, the protein sample could, in addition to the RD 3D H,C,(C-TOCSY-CO),N,HN NMR experiment and the RD 3D $\underline{H}^{\alpha/\beta},C^{\alpha/\beta}$,N,HN NMR experiment, be further subjected to a RD 3D $\underline{H,C,C}$,H-COSY NMR experiment or a RD 3D $\underline{H,C,C}$,H-TOCSY NMR experiment to measure and connect the chemical shift values of aliphatic protons of amino acid residue i, $^1H^{ali}_i$, and aliphatic carbons of amino acid residue i, $^{13}C^{ali}_i$. Then, sequential assignments of the chemical shift values of $^1H^{ali}$ and $^{13}C^{ali}$, the chemical shift values of a γ-proton, $^1H^\delta_i$, and a γ-carbon, $^{13}C^\gamma_i$, in particular, are obtained by (i) matching the chemical shift values of $^1H^{ali}_i$ and $^{13}C^{ali}_i$ measured using the RD 3D $\underline{H,C,C}$,H-COSY NMR experiment or the RD 3D $\underline{H,C,C}$,H-TOCSY NMR experiment with the chemical shift values of $^1H^{ali}$ and $^{13}C^{ali}$ measured by the RD 3D H,C,(C-TOCSY-CO),N,HN NMR experiment and RD 3D $H^{\alpha/\beta},C^{\alpha/\beta}$,N,HN NMR experiment, and (ii) using the chemical shift values of $H^{ali}_i$ and $^{13}C^{ali}_i$, including the chemical shift values of $^1H^\gamma_i$ and $^{13}C^\gamma_i$, to identify the type of amino acid residue i.

The present invention also relates to a method for sequentially assigning chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample, where the chemical shift values of $^1H^{ali}$ and $^{13}C^{ali}$ which are encoded in peak pairs of a 3D NMR spectrum are detected in a phase sensitive manner, including: (1) a RD 3D $\underline{H,C}$,(C-TOCSY-CO),N,HN NMR experiment to measure and connect the chemical shift values of the aliphatic protons of amino acid residue i−1, $^1H^{ali}_{i-1}$, the aliphatic carbons of amino acid residue i−1, $^{13}C^{ali}_{i-1}$, the polypeptide backbone amide nitrogen of amino acid residue i, $^{15}N_i$, and the polypeptide backbone amide proton of amino acid residue i, $^1H^N_i$ and (2) a RD 3D HNNCAHA NMR experiment to measure and connect the chemical shift values of the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α-proton of amino acid residue i−1, $^1H^\alpha_{i-1}$ and the α-carbon of amino acid residue i−1, $^{13}C^\alpha_{i-1}$ with the chemical shift values of $^1H^\alpha_i$ and $^{13}C^\alpha_i$, (ii) using the chemical shift values of $^1H^{ali}_{i-1}$ and $^{13}C^{ali}_{i-1}$ to identify the type of amino acid residue i−1 (Wüthrich, *NMR of Proteins and Nucleic Acids*, Wiley, New York (1986); Grzesiek et al., *J. Biomol. NMR*, 3: 185-204 (1993), which are hereby incorporated by reference in their entirety), and (iii) mapping sets of sequentially connected chemical shift values to the amino acid sequence of the polypeptide chain and using the chemical shift values to locate secondary structure elements within the polypeptide chain (Spera et al., *J. Am. Chem. Soc.*, 113:5490-5492 (1991); Wishart et al., Biochemistry, 31:1647-1651 (1992), which are hereby incorporated by reference in their entirety).

In one embodiment, the protein sample could, in addition to the RD 3D H,C,(C-TOCSY-CO),N,HN NMR experiment and the RD 3D HNNCAHA NMR experiment, be further subjected to a RD 3D $H^{\alpha/\beta},C^{\alpha/\beta}$,CO,HA NMR experiment to measure and connect the chemical shift values of a β-proton of amino acid residue i, $^1H^\beta_i$, a β-carbon of amino acid residue i, $^{13}C^\beta_i$, $^1H^\alpha_i$, $^{13}C^\alpha_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^\beta_i$, $^{13}C^\beta_i$, $^1H^\alpha_i$, and $^{13}C^\alpha_i$ measured by the RD 3D $H^{\alpha/\beta},C^{\alpha/\beta}$,CO,HA NMR experiment with the sequentially assigned chemical shift values of $^1H^\beta$, $^{13}C^\beta$, $^1H^\alpha$, $^{13}C^\alpha$, $^{15}N$, and $^1H^N$ measured by the RD 3D H,C,(C-TOCSY-CO),N,HN NMR experiment and the RD 3D HNNCAHA NMR experiment.

In another embodiment, the protein sample could, in addition to the RD 3D H,C,(C-TOCSY-CO),N,HN NMR experiment and the RD 3D HNNCAHA NMR experiment, be further subjected to a RD 3D HNN<CO,CA> NMR experiment to measure and connect the chemical shift values of a polypeptide backbone carbonyl carbon of amino acid residue i−1, $^{13}C'_{i-1}$, $^{13}C^\alpha_i$, $^{15}N_i$, and $^1H^N_i$. Then, sequential assignments of the chemical shift value of $^{13}C'_{i-1}$ are obtained by matching the chemical shift value of $^{13}C^\alpha_i$ measured by the RD 3D HNN<CO,CA> NMR experiment with the sequentially assigned chemical shift values of $^{13}C^\alpha$, $^{15}N$, and $^1H^N$ measured by the RD 3D H,C,(C-TOCSY-CO),N,HN NMR experiment and the RD 3D HNNCAHA NMR experiment.

In another embodiment, the protein sample could, in addition to the RD 3D H,C,(C-TOCSY-CO),N,HN NMR experiment and the RD 3D HNNCAHA NMR experiment, be further subjected to (i) a RD 3D $H^{\alpha/\beta},C^{\alpha/\beta}$,CO,HA NMR experiment to measure and connect the chemical shift values of a β-proton of amino acid residue i, $^1H^\beta_i$, a β-carbon of amino acid residue i, $^{13}C^\beta_i$, the α-proton of amino acid residue i, $^1H^\alpha_i$, the α-carbon of amino acid residue i, $^{13}C^\alpha_i$, and a polypeptide backbone carbonyl carbon of amino acid residue i, $^{13}C'_i$, and (ii) a RD 3D HNN<CO,CA> NMR experiment to measure and connect the chemical shift values of $^{13}C'_i$, an α-carbon of amino acid residue i+1, $^{13}C^\alpha_{i+1}$, a polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$ measured by the RD 3D HNN<CO,CA> NMR experiment with the chemical shift value of $^{13}C'_i$ measured by the RD 3D $H^{\alpha/\beta},C^{\alpha/\beta}$,CO,HA NMR experiment.

In another embodiment, the protein sample could, in addition to the RD 3D H,C,(C-TOCSY-CO),N,HN NMR experiment and the RD 3D HNNCAHA NMR experiment, be further subjected to a RD 3D $H^{\alpha/\beta}C^{\alpha/\beta}$(CO)NHN NMR experiment (i) to measure and connect the chemical shift values of the α- and β-protons of amino acid residue i−1, $^1H^{\alpha/\beta}_{i-1}$, the α- and β-carbons of amino acid residue i−1, $^{13}C^{\alpha/\beta}_{i-1}$, $^{15}N_i$, and $^1H^N_i$, and (ii) to distinguish NMR signals for the chemical shift values of $^1H^\beta_{i-1}$, $^{13}C^\beta_{i-1}$, $^1H^\alpha_{i-1}$, and $^{13}C^\alpha_{i-1}$ measured by the RD 3D $H^{\alpha/\beta}C^{\alpha/\beta}$(CO)NHN NMR experiment from NMR signals for the chemical shift values of $^1H^{ali}_{i-1}$ and $^{13}C^{ali}_{i-1}$ other than $^1H^{\alpha/\beta}_{i-1}$ and $^{13}C^{\alpha/\beta}_{i-1}$ measured by the RD 3D H,C,(C-TOCSY-CO),N,HN NMR experiment.

In another embodiment, the protein sample could, in addition to the RD 3D H,C,(C-TOCSY-CO),N,HN NMR experiment and the RD 3D HNNCAHA NMR experiment, be further subjected to a RD 3D $H^{\alpha/\beta},C^{\alpha/\beta}$,N,HN NMR experiment to measure and connect the chemical shift values of $^1H^\beta_i$, $^{13}C^\beta_i$, $^1H^\alpha_i$, $^{13}C^\alpha_i$, $^{15}N_i$, and $^1H^N_i$. Then, sequential assignments are obtained by matching the chemical shift values of $^1H^\beta_i$, $^{13}C^\beta_i$, $^1H^\alpha_i$, and $^{13}C^\alpha_i$ measured by said RD 3D $H^{\alpha/\beta}$, $C^{\beta/\alpha}$,N,HN NMR experiment with the chemical shift values of $^1H^\beta_{i-1}$, $^{13}C^\beta_{i-1}$, $^1H^\alpha_{i-1}$, and $^{13}C^\alpha_{i-1}$ measured by the RD 3D H,C,(C-TOCSY-CO),N,HN NMR experiment.

In another embodiment, the protein sample could, in addition to the RD 3D H,C,(C-TOCSY-CO),N,HN NMR experiment and the RD 3D HNNCAHA NMR experiment, be further subjected to a 3D HNNCACB NMR experiment to measure and connect the chemical shift values of $^{13}C^\beta_i$, $^{13}C^\alpha_i$, $^{15}N_i$, and $^1H^N_i$. Then, sequential assignments are obtained by matching the chemical shift values of $^{13}C^\beta_i$ and $^{13}C^\alpha_i$ measured by said 3D HNNCACB NMR experiment with the chemical shift values of $^{13}C^\beta_{i-1}$ and $^{13}C^\alpha_{i-1}$ measured by the RD 3D H,C,(C-TOCSY-CO),N,HN NMR experiment.

In another embodiment, the protein sample could, in addition to the RD 3D H,C,(C-TOCSY-CO),N,HN NMR experiment and the RD 3D HNNCAHA NMR experiment, be further subjected to a RD 2D HB,CB,(CG,CD),HD NMR experiment to measure and connect the chemical shift values of $^1H^\beta_i$, $^{13}C^\beta_i$, and a δ-proton of amino acid residue i with an aromatic side chain, $^1H^\delta_i$. Then, sequential assignments are obtained by matching the chemical shift values of $^1H^\beta_i$ and $^{13}C^\beta_i$ measured by said RD 2D HB,CB,(CG,CD),HD NMR experiment with the chemical shift values of $^1H^\beta$ and $^{13}C^\beta$ measured by the RD 3D H,C,(C-TOCSY-CO),N,HN NMR experiment, using the chemical shift values to identify amino acid residue i as having an aromatic side chain, and mapping sets of sequentially connected chemical shift values to the amino acid sequence of the polypeptide chain and by locating amino acid residues with aromatic side chains along the polypeptide chain.

In another embodiment, the protein sample could, in addition to the RD 3D H,C,(C-TOCSY-CO),N,HN NMR experiment and the RD 3D HNNCAHA NMR experiment, be further subjected to a RD 3D H,C,C,H-COSY NMR experiment or a RD 3D H,C,C,H-TOCSY NMR experiment to measure and connect the chemical shift values of aliphatic protons of amino acid residue i, $^1H^{ali}_i$, and aliphatic carbons of amino acid residue i, $^{13}C^{ali}_i$. Then, sequential assignments of the chemical shift values of $^1H^{ali}_i$ and $^{13}C^{ali}_i$, the chemical shift values of a γ-proton, $^1H^\gamma_i$, and a γ-carbon, $^{13}C^\gamma_i$, in particular, are obtained by (i) matching the chemical shift values of $^1H^{ali}$ and $^{13}C^{ali}$ measured using the RD 3D H,C,C,H-COSY NMR experiment or the RD 3D H,C,C,H-TOCSY NMR experiment with the chemical shift values of $^1H^\beta_i$, $^{13}C^\beta_i$, $^1H^\alpha_i$, and $^{13}C^\alpha_i$ measured by the RD 3D H,C,(C-TOCSY-CO),N,HN NMR experiment and the RD 3D HNNCAHA NMR experiment, and (ii) using the chemical shift values of $^1H^{ali}_i$ and $^{13}C^{ali}_i$, including the chemical shift values of $^1H^\gamma_i$ and $^{13}C^\gamma_i$, to identify the type of amino acid residue i.

Another aspect of the present invention involves a method for obtaining nearly complete assignments of chemical shift values of $^1H$, $^{13}C$ and $^{15}N$ of a protein molecule (excluding only chemical shift values of $^{13}C^\delta$ and $^{15}N^{\epsilon 2}$ of glutamines, of $^{13}C^\gamma$ and $^{15}N^{\delta 2}$ of asparagines, of $^{13}C^{\epsilon 3}$, $^1H^{\epsilon 3}$, $^{13}C^{\zeta 2}$, $^1H^{\zeta 2}$, $^{13}C^{\zeta 3}$, $^1H^{\zeta 3}$, $^{13}C^{\eta 2}$, and $^1H^{\eta 2}$ groups of tryptophans, of $^{13}C^\epsilon$ and $^1H^\epsilon$ of methionines, and of labile sidechain protons that exchange rapidly with the protons of the solvent water) (Yamazaki et al., *J. Am. Chem. Soc.*, 115:11054-11055 (1993), which is hereby incorporated by reference in its entirety), which are required for the determination of the tertiary structure of a protein in solution (Wüthrich, *NMR of Proteins and Nucleic Acids*, Wiley, New York (1986), which is hereby incorporated by reference in its entirety). The method involves providing a protein sample and conducting four reduced dimensionality (RD) nuclear magnetic resonance (NMR) experiments on the protein sample, where the chemical shift values of $^1H$ and $^{13}C$ which are encoded in peak pairs of a 3D NMR spectrum are detected in a phase sensitive manner and (1) a first experiment is selected from a RD three-dimensional (3D) $H^{\alpha/\beta}C^{\alpha/\beta}$(CO)NHN NMR experiment, a RD 3D HA,CA,(CO),N,HN NMR experiment, or a RD 3D H,C,(C-TOCSY-CO),N,HN NMR experiment for obtaining sequential correlations of chemical shift values; (2) a second experiment is selected from a RD 3D HNNCAHA NMR experiment, a RD 3D $H^{\alpha/\beta}$,$C^{\alpha/\beta}$,N,HN NMR experiment, or a RD 3D HNN<CO,CA> NMR experiment for obtaining intraresidue correlations of chemical shift values; (3) a third experiment is a RD 3D H,C,C,H-COSY NMR experiment for obtaining assignments of aliphatic and aromatic sidechain chemical shift values; and (4) a fourth experiment is a RD 2D HB,CB,(CG,CD),HD NMR experiment for obtaining assignments of aromatic sidechain chemical shift values.

In one embodiment of this method, the protein sample could be further subjected to a RD 2D H,C,H-COSY NMR experiment for obtaining assignments of aliphatic and aromatic sidechain chemical shift values.

In another embodiment of this method, the first experiment is the RD 3D $H^{\alpha/\beta}C^{\alpha/\beta}$(CO)NHN NMR experiment and the second experiment is the RD 3D HNNCAHA NMR experiment.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB,(CG,CD),HD NMR experiment, be further subjected to a RD 3D HA,CA,(CO),N,HN NMR experiment to distinguish between NMR signals for $^1H^\alpha/^{13}C^\alpha$ and $^1H^\beta/^{13}C^\beta$ from the RD 3D $H^{\alpha/\beta}C^{\alpha/\beta}$(CO)NHN NMR experiment.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB,(CG,CD),HD NMR experiment, be further subjected to a RD 3D H,C,(C-TOCSY-CO),N,HN NMR experiment to obtain assignments of chemical shift values of $^1H^{ali}$ and $^{13}C^{ali}$.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB,(CG,CD),HD NMR experiment, be further subjected to a RD 3D $H^{\alpha/\beta}$,$C^{\alpha/\beta}$,N,HN NMR experiment to obtain assignments of chemical shift values of $^1H^\beta$ and $^{13}C^\beta$.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB(CG,CD),HD NMR experiment, be further subjected to a RD 3D HNN<CO,CA> NMR experiment to obtain assignments of chemical shift values of polypeptide backbone carbonyl carbons, $^{13}C'$.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB,(CG,CD),HD NMR experiment, be further subjected to a RD 3D $H^{\alpha/\beta}$,$C^{\alpha/\beta}$,CO,HA NMR experiment to obtain assignments of chemical shift values of polypeptide backbone carbonyl carbons, $^{13}C'$.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,CC,H-COSY NMR experiment, and RD 2D HB,CB,(CG,CD),HD NMR experiment, be further subjected to a RD 3D HNN<CO,CA> NMR experiment and a RD 3D $H^{\alpha/\beta}$,$C^{\alpha/\beta}$,CO,HA NMR experiment to obtain assignments of chemical shift values of $^{13}C'$.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB(CG,CD),HD NMR experiment, be further subjected to a RD 3D H, C,C,H-TOCSY NMR experiment to obtain assignments of chemical shift values of $^1H$ and $^{13}C$ of aliphatic sidechains.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB,(CG,CD),HD NMR experiment, be further subjected to a RD 3D H, C,C,H-TOCSY NMR experiment to obtain assignments of chemical shift values of $^1H$ and $^{13}C$ of aromatic sidechains.

In another embodiment, the protein sample could, in addition to the RD 3D $H^{\alpha/\beta}C^{\alpha/\beta}$(CO)NHN NMR experiment, RD 3D HNNCAHA NMR experiment, RD 3D H,C,C,H-COSY NMR experiment, and RD 2D HB,CB,(CG,CD),HD NMR experiment, be further subjected to a 3D HNNCACB NMR experiment to obtain assignments of chemical shift values of $^{13}C^\beta$.

In yet another embodiment of this method, the first experiment is the RD 3D H,C,(C-TOCSY-CO),N,HN NMR experiment and the second experiment is the RD 3D HNNCAHA NMR experiment.

In another embodiment, the protein sample could, in addition to the RD 3D H,C,(C-TOCSY-CO),N,HN NMR experiment, RD 3D HNNCAHA NMR experiment, RD 3D H, C,C,H-COSY NMR experiment, and RD 2D HB, CB,(CG,CD),HD NMR experiment, be further subjected to a RD 3D HA,CA,(CO),N,HN NMR experiment to identify NMR signals for $^1H^\alpha/^{13}C^\alpha$ in the RD 3D H, C,(C-TOCSY-CO),N,HN NMR experiment.

In another embodiment, the protein sample could, in addition to the RD 3D H,C,(C-TOCSY-CO),N,HN NMR experiment, RD 3D HNNCAHA NMR experiment, RD 3D H, C,C,H-COSY NMR experiment, and RD 2D HB, CB,(CG,CD),HD NMR experiment, be further subjected to a RD 3D $H^{\alpha/\beta}$,$C^{\alpha/\beta}$,N,HN NMR experiment to obtain assignments of chemical shift values of $^1H^\beta$ and $^{13}C^\beta$.

In another embodiment, the protein sample could, in addition to the RD 3D H,C,(C-TOCSY-CO),N,HN NMR experiment, RD 3D HNNCAHA NMR experiment, RD 3D H, C,C,H-COSY NMR experiment, and RD 2D HB, CB,(CG,CD),HD NMR experiment, be further subjected to a RD 3D HNN<CO,CA> NMR experiment to obtain assignments of chemical shift values of polypeptide backbone carbonyl carbons, $^{13}C'$.

In another embodiment, the protein sample could, in addition to the RD 3D H,C,(C-TOCSY-CO),N,HN NMR experiment, RD 3D HNNCAHA NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D $H^{\alpha/\beta},C^{\alpha/\beta}$,CO,HA NMR experiment to obtain assignments of chemical shift values of polypeptide backbone carbonyl carbons, $^{13}C'$.

In another embodiment, the protein sample could, in addition to the RD 3D H,C,(C-TOCSY-CO),N,HN NMR experiment, RD 3D HNNCAHA NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D HNN<CO,CA> NMR experiment and a RD 3D $H^{\alpha/\beta}$,$C^{\alpha/\beta}$,CO,HA $\overline{NMR}$ experiment to obtain assignments of chemical shift values of $^{13}C'$.

In another embodiment, the protein sample could, in addition to the RD 3D H,C,(C-TOCSY-CO),N,HN NMR experiment, RD 3D HNNCAHA NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D H,C,C,H-TOCSY NMR experiment to obtain assignments of chemical shift values of $^1H$ and $^{13}C$ of aliphatic sidechains.

In another embodiment, the protein sample could, in addition to the RD 3D H,C,(C-TOCSY-CO),N,HN NMR experiment, RD 3D HNNCAHA NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D H,C,C,H-TOCSY NMR experiment to obtain assignments of chemical shift values of $^1H$ and $^{13}C$ of aromatic sidechains.

In another embodiment, the protein sample could, in addition to the RD 3D H,C,(C-TOCSY-CO),N,HN NMR experiment, RD 3D HNNCAHA NMR experiment, RD 3D H,C,C,H-COSY NMR experiment, and RD 2D $\overline{HB}$,$\overline{CB}$,(CG,CD),HD NMR experiment, be further subjected to a 3D HNNCACB NMR experiment to obtain assignments of chemical shift values of $^{13}C^\beta$.

In yet another embodiment of this method, the first experiment is the RD 3D H,C,(C-TOCSY-CO),N,HN NMR experiment and the second experiment is the RD 3D $\underline{H^{\alpha/\beta}}$,$C^{\alpha/\beta}$,N,HN NMR experiment.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D HA,CA,(CO),N,HN NMR experiment to identify NMR signals for $^1H^\alpha$ and $^{13}C^\beta$ in the RD 3D H,C,(C-TOCSY-CO),N,HN NMR experiment.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D $H^{\alpha/\beta}C^{\alpha/\beta}$(CO)NHN NMR experiment to identify NMR signals for $^1H^{\alpha/\beta}$ and $^{13}C^{\alpha/\beta}$ in the RD 3D H,C,(C-TOCSY-CO),N,HN NMR experiment.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a RD 3D HNN<CO,CA> NMR experiment to obtain assignments of chemical shift values of polypeptide backbone carbonyl carbons, $^{13}C'$.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D $H^{\alpha/\beta},C^{\alpha/\beta}$,CO,HA NMR experiment to obtain assignments of chemical shift values of polypeptide backbone carbonyl carbons, $^{13}C'$.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D HNN<CO,CA> NMR experiment and a RD 3D $H^{\alpha/\beta}$,$C^{\alpha/\beta}$,CO,HA $\overline{NMR}$ experiment to obtain assignments of chemical shift values of $^{13}C'$.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D H,C,C,H-TOCSY NMR experiment to obtain assignments of chemical shift values of $^1H$ and $^{13}C$ of aliphatic sidechains.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D H,C,C,H-TOCSY NMR experiment to obtain assignments of chemical shift values of $^1H$ and $^{13}C$ of aromatic sidechains.

In another embodiment, the protein sample could, in addition to the RD 3D H,C,(C-TOCSY-CO),N,HN NMR experiment, RD 3D $H^{\alpha/\beta},C^{\alpha/\beta}$,N,HN NMR experiment, RD 3D H,C,C,H-COSY NMR experiment, and RD 2D $\overline{HB}$,$\overline{CB}$,(CG,CD),HD NMR experiment, be further subjected to a 3D HNNCACB NMR experiment to obtain assignments of chemical shift values of $^{13}C^\beta$.

In yet another embodiment of this method, the first experiment is the RD 3D H,C,(C-TOCSY-CO),N,HN NMR experiment and the second experiment is the RD 3D HNN<CO,CA> NMR experiment.

In another embodiment, the protein sample could, in addition to the RD 3D H,C,(C-TOCSY-CO),N,HN NMR experiment, RD 3D HNN<CO,CA> NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D HA,CA,(CO),N,HN NMR experiment to identify NMR signals for $^1H^\alpha$ and $^{13}C^\alpha$ in the RD 3D H,C,(C-TOCSY-CO),N,HN NMR experiment.

In another embodiment, the protein sample could, in addition to the RD 3D H,C,(C-TOCSY-CO),N,HN NMR experiment, RD 3D HNN<CO,CA> NMR experiment, RD 3D H,C,C,H-COSY NMR experiment, and RD 2D $\overline{HB}$,$\overline{CB}$,(CG,CD),HD NMR experiment, be further subjected to a $\overline{RD}$ 3D $H^{\alpha/\beta}C^{\alpha/\beta}$(CO)NHN NMR experiment to identify NMR signals for $^1H^{\alpha/\beta}$ and $^{13}C^{\alpha/\beta}$ in the RD 3D H,C,(C-TOCSY-CO),N,HN NMR experiment.

In another embodiment, the protein sample could, in addition to the RD 3D H,C,(C-TOCSY-CO),N,HN NMR experiment, RD 3D HNN<CO,CA> NMR experiment, RD 3D H,C,C,H-COSY NMR experiment, and RD 2D $\overline{HB}$,$\overline{CB}$,(CG,CD),HD NMR experiment, be further subjected to a RD 3D $H^{\alpha/\beta},\underline{C^{\alpha/\beta}},CO,HA$ NMR experiment to obtain assignments of chemical shift values of polypeptide backbone carbonyl carbons, $^{13}C'$.

In another embodiment, the protein sample could, in addition to the RD 3D H,C,(C-TOCSY-CO),N,HN NMR experiment, RD 3D HN$\overline{N<CO,CA>}$ NMR experiment, RD 3D H,C,C,H-COSY NMR experiment, and RD 2D $\overline{HB}$, $\overline{CB},(CG,CD),HD$ NMR experiment, be further subjected to a RD 3D H,C,C,H-TOCSY NMR experiment to obtain assignments of chemical shift values of $^1H$ and $^{13}C$ of aliphatic sidechains.

In another embodiment, the protein sample could, in addition to the RD 3D H,C,(C-TOCSY-CO),N,HN NMR experiment, RD 3D HN$\overline{N<CO,CA>}$ NMR experiment, RD 3D H,C,C,H-COSY NMR experiment, and RD 2D $\overline{HB}$, $\overline{CB},(CG,CD),HD$ NMR experiment, be further subjected to a RD 3D H,C,C,H-TOCSY NMR experiment to obtain assignments of chemical shift values of $^1H$ and $^{13}C$ of aromatic sidechains.

In another embodiment, the protein sample could, in addition to the RD 3D H,C,(C-TOCSY-CO),N,HN NMR experiment, RD 3D HN$\overline{N<CO,CA>}$ NMR experiment, RD 3D H,C,C,H-COSY NMR experiment, and RD 2D $\overline{HB}$, $\overline{CB},(CG,CD),HD$ NMR experiment, be further subjected to a 3D HNNCACB NMR experiment to obtain assignments of chemical shift values of $^{13}C^\beta$.

In addition, the above-described method for obtaining assignments of chemical shift values of $^1H$, $^{13}C$ and $^{15}N$ of a protein molecule can involve further subjecting the protein sample to nuclear Overhauser effect spectroscopy (NOESY) (Wüthrich, *NMR of Proteins and Nucleic Acids*, Wiley, New York (1986), which is hereby incorporated by reference in its entirety), to NMR experiments that measure scalar coupling constants (Eberstadt et al., *Angew. Chem. Int. Ed. Engl.*, 34:1671-1695 (1995); Cordier et al., *J. Am. Chem. Soc.*, 121: 1601-1602 (1999), which are hereby incorporated by reference in their entirety), or to NMR experiments that measure residual dipolar coupling constants (Prestegard, *Nature Struct. Biol.*, 5:517-522 (1998); Tjandra et al., *Science*, 278: 1111-1114 (1997), which are hereby incorporated by reference in their entirety), to deduce the tertiary fold or tertiary structure of the protein molecule.

A standard set of experiments (3D $H^{\alpha/\beta}C^{\alpha/\beta}(CO)NHN$, 3D HNNCAHA, 3D $H^{\alpha/\beta}C^{\alpha/\beta}COHA$, 3D HNNCACB, 3D HN$\overline{N<CO,CA>}$, 3D HCCH-COSY, 3D HCCH-TOCSY, 2D HBCB$\overline{(CDCG)}$HD, and 2D $^1H$-TOCSY-relayed $\overline{HCH\text{-}COSY}$) can be employed for obtaining nearly complete resonance assignments of proteins including aliphatic and aromatic side chain spin systems.

For larger proteins, complementary recording of highly sensitive 3D HACA(CO)NHN promises (i) to yield spin systems which escape detection in $H^{\alpha/\beta}C^{\alpha/\beta}(CO)NHN$, and (ii) to offer the distinction of α- and β-moiety resonances by comparison with $H^{\alpha/\beta}C^{\alpha/\beta}(CO)NHN$. Furthermore, employment of 50% random fractional protein deuteration (LeMaster, *Annu. Rev. Biophys. Bionhys. Chem.*, 19:43-266 (1990); Nietlispach et al., *J. Am. Chem. Soc.*, 118:407-415 (1996); Shan et al., *J. Am. Chem. Soc.*, 118:6570-6579 (1996); Leiting et al., *Anal. Biochem.*, 265:351-355 (1998); Hochuli et al., *J. Biomol. NMR*, 17:33-42 (2000), which are hereby incorporated by reference in their entirety) in combination with the standard suite of NMR experiments (or transverse relaxation-optimized spectroscopy (TROSY) versions thereof) is attractive. The impact of deuteration for recording 4D $H^{\alpha/\beta}C^{\alpha/\beta}(CO)NHN$ for proteins reorienting with correlation times up to around 20 ns (corresponding to a molecular weight around 30 kDa at ambient T) has been demonstrated (Nietlispach et al., *J. Am. Chem. Soc.*, 118:407-415 (1996), which is hereby incorporated by reference in its entirety). Accordingly, 3D $H^{\alpha/\beta}C^{\alpha/\beta}(CO)NHN$ can be expected to maintain its pivotal role for obtaining complete resonance assignments for deuterated proteins at least up to about that size. Furthermore, protein deuteration offers the advantage that HNNCACB, which can be expected to become significantly less sensitive than HNNCAHA for larger non-deuterated systems, (Szyperski et al., *J. Biomol. NMR*, 11:387-405 (1998), which is hereby incorporated by reference in its entirety) can be kept to recruit $^{13}C^\beta$ chemical shifts for sequential assignment (Shan et al., *J. Am. Chem. Soc.*, 118:6570-6579 (1996), which is hereby incorporated by reference in its entirety).

If solely chemical shifts are considered, the unambiguous identification of peak pairs is more involved whenever multiple peak pairs with degenerate chemical shifts in the other dimensions are present. The acquisition of the corresponding central peaks addresses this complication in a conceptually straightforward fashion. However, it is important to note that pairs of peaks generated by a chemical shift splitting have quite similar intensity. In contrast, peak pairs arising from different moieties, possible located in different amino acid residues, most often do not show similar intensity. This is because the nuclear spin relaxation times, which determine the peak intensities, vary within each residue as well as along the polypeptide chain. One may thus speak of a "nuclear spin relaxation time labeling" of peak pairs, which makes their identification an obvious task in most cases.

Using cryogenic probes can reduce NMR measurement times by about a factor of 10 or more (Flynn et al., *J. Am Chem. Soc.*, 122:4823-4824 (2000), which is hereby incorporated by reference in its entirety). The high sensitivity of cryogenic probes shifts even the recording of RD NMR experiments entirely into the sampling limited data acquisition regime. In view of this dramatic reduction in spectrometer time demand, minimally achievable RD NMR measurement times are of keen interest to be able to adapt the NMR measurement times to sensitivity requirements in future HTP endeavours. To further reduce the measurement time, and in view of the aforementioned "spin relaxation time labelling" of peak pairs, one may decide to also discard the use of $^{13}C$-steady state magnetization for central peak detection.

Although RD NMR was proposed in 1993 (Szyperski et al., *J. Biomol. NMR*, 3:127-132 (1993); Szyperski et al., *J. Am. Chem. Soc.*, 115:9307-9308 (1993), which are hereby incorporated by reference in their entirety), its wide-spread use has been delayed by the more demanding spectral analysis when compared to conventional TR NMR. In particular, the necessity to extract chemical shifts from in-phase splittings suggests that strong computer support is key for employment of RD NMR on a routine basis. This can be readily addressed by using automated resonance assignment software for automated analysis of RD TR NMR data.

In conclusion, the joint employment of RD NMR spectroscopy (as well as phase-sensitively detected RD NMR spectroscopy), cryogenic probes, and automated backbone resonance assignment will allow one to determine a protein's backbone resonance assignments and secondary structure in a short time.

EXAMPLES

The following examples are provided to illustrate embodiments of the present invention but are by no means intended to limit its scope.

Example 1

Sample Preparation

NMR measurements were performed using a 1 mM solution of uniformly $^{13}C/^{15}N$ enriched "Z-domain" of the *Staphylococcal* protein A (Tashiro et al., *J. Mol. Biol.*, 272:573-

590 (1997); Lyons et al., *Biochemistry*, 32:7839-7845 (1993), which are hereby incorporated by reference in their entirety) dissolved in 90% $D_2O$/10% $H_2O$ (20 mM K—$PO_4$) at pH=6.5 and a 2 mM solution of $^{15}N/^{13}C$ doubly labeled ubiquitin in 90% $H_2O$/10% $D_2O$ (50 mM K—$PO_4$; pH=5.8).

Example 2

NMR Spectroscopy

Multidimensional NMR experiments (FIG. 2; Table 1) were recorded for a 1 mM solution of the 8.5 kDa Z-domain protein and/or a 2 mM solution of ubiquitin at a temperature of 25° C. The spectra were assigned, and the chemical shifts obtained from RD NMR were in very good agreement with those previously determined at 30° C. using conventional triple resonance (TR) NMR spectroscopy (Tashiro et al., *J. Mol. Biol.*, 272:573-590 (1997); Lyons et al., *Biochemistry*, 32:7839-7845 (1993), which are hereby incorporated by reference in their entirety).

NMR experiments were recorded at a temperature of 25° C. on a Varian Inova 600 spectrometer equipped with a new generation $^1H\{^{13}C,^{15}N\}$ triple resonance probe which exhibits a signal-to-noise ratio of 1200:1 for a standard 0.1% ethylbenzene sample.

Specific embodiments of the 11 RD NMR experiments disclosed by the present invention were implemented for the present study. FIG. 2 provides a survey of (i) the names, (ii) the magnetization transfer pathways and (iii) the peak patterns observed in the projected dimension of each of the 11 RD NMR experiments disclosed by the present invention. For simplicity, FIG. 2 shows the in-phase peak pattern from the cosine-modulated RD NMR experiments. When acquiring the sine-modulated congeners, anti-phase peak pairs were observed instead (see FIG. 1). The group comprising the first three experiments are designed to yield "sequential" connectivities via one-bond scalar couplings: 3D $H^{\alpha/\beta}C^{\alpha/\beta}$(CO)NHN (FIG. 2A), 3D HACA(CO)NHN (FIG. 2B), and 3D HC(C-TOCSY-CO)NHN (FIG. 2C). The following three experiments provide "intraresidual" connectivities via one-bond scalar couplings: 3D HNNCAHA (FIG. 2D), 3D $H^{\alpha/\beta}C^{\alpha/\beta}$COHA (FIG. 2E), and 3D $H^{\alpha/\beta}C^{\alpha/\beta}$NHN (FIG. 2F). 3D HNN<CO,CA> (FIG. 2G) offers both intraresidual $^1H^N$-$^{13}C^\alpha$ and sequential $^1H^N$-$^{13}C'$ connectivities. Although 3D HNNCAHA (FIG. 2D), 3D $H^{\alpha/\beta}C^{\alpha/\beta}$NHN (FIG. 2F) and 3D HNN<CO,CA> (FIG. 2G) also provide sequential connectivities via two-bond $^{13}C^\alpha_{i-1}$-$^{15}N_i$ scalar couplings, those are usually smaller than the one-bond couplings (Cavanagh et al., *Protein NMR Spectroscopy*, Academic Press, San Diego, (1996), which is hereby incorporated by reference in its entirety), and obtaining complete backbone resonance assignments critically depends on experiments designed to provide sequential connectivities via one-bond couplings (FIGS. 2D-F). 3D HCCH-COSY (FIG. 2H) and 3D HCCH-TOCSY (FIG. 2I) allow one to obtain assignments for the "aliphatic" side chain spin systems, while 2D HBCB(CDCG)HD (FIG. 2J) and 2D $^1$H-TOCSY-relayed HCH-COSY (FIG. 2K) provide the corresponding information for the "aromatic" spin systems.

The RD NMR experiments are grouped accordingly in Table 1, which lists for each experiment (i) the nuclei for which the chemical shifts are measured, (ii) if and how the central peaks are acquired and (iii) additional notable technical features. State-of-the art implementations (Cavanagh et al., *Protein NMR Spectroscopy*, Academic Press, San Diego, (1996); Kay, *J. Am. Chem. Soc.*, 115:2055-2057 (1993); Grzesiek et al., *J. Magn. Reson.*, 99:201-207 (1992); Montelione et al., *J. Am. Chem. Soc.*, 114:10974-10975 (1992); Boucher et al., *J. Biomol. NMR*, 2:631-637 (1992); Yamazaki et al., *J. Am. Chem. Soc.*, 115:11054-11055 (1993); Zerbe et al., *J. Biomol. NMR*, 7:99-106 (1996); Grzesiek et al., *J. Biomol. NMR*, 3:185-204 (1993), which are hereby incorporated by reference in their entirety) making use of pulsed field z-gradients for coherence selection and/or rejection, and sensitivity enhancement (Cavanagh et al., *Protein NMR Spectroscopy*, Academic Press, San Diego, (1996), which is hereby incorporated by reference in its entirety) were chosen, which allow executing these experiments with a single transient per acquired free induction decay (FID). Semi (Grzesiek et al., *J. Biomol. NMR*, 3:185-204 (1993), which is hereby incorporated by reference in its entirety) constant-time (Cavanagh et al., *Protein NMR Spectroscopy*, Academic Press, San Diego, (1996), which is hereby incorporated by reference in its entirety) chemical shift frequency-labeling modules were used throughout in the indirect dimensions in order to minimize losses arising from transverse nuclear spin relaxation. FIGS. 3A-K provide comprehensive descriptions of the RD NMR r.f. pulse sequences.

In total, nine RD TR NMR experiments were recorded for the Z-domain protein (Table 2) and eleven RD TR NMR experiments for ubiquitin (Table 3). FIGS. 5-15 show composite plots of $[\omega_1,\omega_3]$- or $[\omega_1,\omega_2]$-strips taken from the recorded phase-sensitively detected RD NMR experiments. Except for 3D HNNCAHA, 3D HNN<CO,CA> and 2D $^1$H-TOCSY-relayed HCH-COSY (FIG. 1), central peaks were derived from $^{13}C$ magnetization (FIG. 2; Table 1). Hence, two subspectra, I and II containing the peak pairs and central peaks respectively, were generated (Szyperski et al., *J. Am. Chem. Soc.*, 118:8146-8147 (1996); Szyperski et al., *J. Biomol. NMR*, 11:387-405 (1998), which are hereby incorporated by reference in their entirety) for eight of the RD NMR experiments (FIG. 2).

TABLE 2

Phase-Sensitively Detected RD NMR Data Sets Recorded for "Z-domain" Protein

| | 3D HACA(CO) NHN | 3D HNNCAHA | 3D $H^{\alpha/\beta}C^{\alpha/\beta}$ (CO)NHN | 3D $H^{\alpha/\beta}C^{\alpha/\beta}$ NHN | 3D HNN<CO, CA> | 3D HC(C-TOCSY-CO)NHN | 3D HCCH-COSY | 3D HCCH-TOCSY | 2D HBCB(CGCD) HD |
|---|---|---|---|---|---|---|---|---|---|
| | | | | | $^1$H Resonance Frequency (MHz) | | | | |
| | 600 | 600 | 600 | 600 | 600 | 600 | 600 | 600 | 600 |
| No. of Points[a] | | | | | | | | | |
| collected | 40,28,512 | 64,28,512 | 76,28,512 | 68,28,512 | 56,28,512 | 76,28,512 | 90,20,12 | 80,20,512 | 76,512 |
| after LP | 80,56,512 | 96,56,512 | 152,56,512 | 136,56,512 | 112,56,512 | 152,56,512 | 180,40,512 | 160,40,512 | 152,512 |

TABLE 2-continued

Phase-Sensitively Detected RD NMR Data Sets Recorded for "Z-domain" Protein

| | 3D HACA(CO)NHN | 3D HNNCAHA | 3D H$^{\alpha/\beta}$C$^{\alpha/\beta}$(CO)NHN | 3D H$^{\alpha/\beta}$C$^{\alpha/\beta}$NHN | 3D HNN<CO, CA> | 3D HC(C-TOCSY-CO)NHN | 3D HCCH-COSY | 3D HCCH-TOCSY | 2D HBCB(CGCD)HD |
|---|---|---|---|---|---|---|---|---|---|
| | \multicolumn{9}{c}{$^1$H Resonance Frequency (MHz)} |
| | 600 | 600 | 600 | 600 | 600 | 600 | 600 | 600 | 600 |
| after zero filling | 256,64,1024 | 256,64,1024 | 256,64,1024 | 256,64,1024 | 256,64,1024 | 256,64,1024 | 256,64,1024 | 256,64,1024 | 512,1024 |
| window functions$^b$ | sin 70/70/90 | sin 70/70/90 | sin 70/70/90 | sin 70/70/90 | sin 70/70/90 | sin 70/70/90 | sin 70/70/90 | sin 70/70/90 | sin 70/90 |
| No. of Transients$^c$ | 2 | 2 | 2 | 2 | 2 | 2 | 2 | 2 | 64 |
| Spectral Width$^d$ ($\omega_1, \omega_2, \omega_3, \omega_4$; Hz) | 6000 (RD), 1300, 6983 | 5200.2 (RD), 1300, 6983 | 12001.2 (RD), 1300, 6983 | 12001.2 (RD), 1300, 6983 | 8000 (RD), 1300, 6983 | 12001.2 (RD), 1300, 6983 | 12001.2 (RD), 3125, 6983 | 12001.2 (RD), 3125, 6983 | 12001.2 (RD), 6983 |
| $t_{max}$ (ms)$^e$ | 6.5, 20.77, 73.18 | 12.11, 20.77, 73.18 | 6.25, 20.77, 73.18 | 5.58, 20.77, 73.18 | 6.88, 20.77, 73.18 | 6.25, 20.77, 73.18 | 7.42, 6.08, 73.18 | 6.58, 6.08, 73.18 | 6.25, 73.18 |
| Carrier Position ($\omega_1, \omega_2, \omega_3, \omega_4$; ppm)$^f$ | 53.05 (3.78), 119.3, 4.78 | 53.05 (3.78), 119.3, 4.78 | 38.05 (3.78), 119.3, 4.78 | 38.05 (3.78), 119.3, 4.78 | 171.07 (53.0), 119.3, 4.78 | 38.05 (3.78), 119.3, 4.78 | 38.05 (3.78), 38.05, 4.78 | 38.05 (3.78), 38.05, 4.78 | 33.04(3.78), 4.78 |
| Recycle Delay (s)$^g$ | 0.67 | 0.67 | 0.67 | 0.67 | 0.67 | 0.67 | 0.67 | 0.77 | 0.72 |
| Collection Time (h)$^h$ | 6.7 | 10.73 | 12.74 | 11.4 | 9.38 | 12.74 | 10.77 | 11.0 | 7.82 |

$^a$"No. of Points" represents the number of complex data points used to sample indirect dimensions. Before Fourier transformation, the time domain points are extended by linear prediction (LP).
$^b$The "Window Function" is a mathematical function multiplied with the FID along each indirect dimension before zero-filling and Fourier transformation.
$^c$"No. of Transients" represents the number of FIDs acquired for each real increment.
$^d$"Spectral Width" is the frequency range covered in each dimension.
$^e$"$t_{max}$" is the maximum chemical shift evolution time.
$^f$"Carrier Position" refers to the frequency (in ppm) of the center point of the spectrum along each dimension.
$^g$"Recycle Delay" denotes the relaxation delay between acquisitions of FIDs.
$^h$"Collection Time" is the total measurement time.

TABLE 3

Phase-Sensitively Detected RD NMR Data Sets Recorded for Ubiquitin

| | 3D HACA(CO)NHN | 3D HNNCAHA | 3D H$^{\alpha/\beta}$C$^{\alpha/\beta}$(CO)NHN | 3D H$^{\alpha/\beta}$C$^{\alpha/\beta}$NHN | 3D HNN <CO, CA> | 3D H$^{\alpha/\beta}$C$^{\alpha/\beta}$COHA |
|---|---|---|---|---|---|---|
| | \multicolumn{6}{c}{$^1$H Resonance Frequency (MHz)} |
| | 600 | 600 | 600 | 600 | 600 | 600 |
| No. of Points$^a$ | | | | | | |
| collected | 40,28,512 | 56,28,512 | 76,28,512 | 68,28,512 | 56,28,512 | 76,32,512 |
| after LP | | | | | | 152,64,512 |
| after zero filling | | | | | | 256,64,1024 |
| window functions$^b$ | | | | | | sin 70/70/90 |
| No. of Transients$^c$ | 2 | 2 | 2 | 2 | 2 | 2 |
| Spectral Width$^d$ ($\omega_1, \omega_2, \omega_3, \omega_4$; Hz) | 6000 (RD), 1337, 7018 | 6000 (RD), 1337, 7018 | 12001.2 (RD), 1337, 7018 | 12001.2 (RD), 1337, 7018 | 8000 (RD), 1337, 7018 | 12001(RD), 1800, 7018 |
| $t_{max}$ (ms)$^e$ | 6.5, 20.2, 72.8 | 9.17, 20.2, 72.8 | 6.25, 20.2, 72.8 | 5.58, 20.2, 72.8 | 6.88, 20.2, 72.8 | 6.25, 17.2, 72.8 |
| Carrier Position ($\omega_1, \omega_2, \omega_3, \omega_4$; ppm)$^f$ | 53.04 (3.78), 119.3, 4.78 | 53.04 (3.78), 119.3, 4.78 | 38.05 (3.78), 119.3, 4.78 | 38.05 (3.78), 119.3, 4.78 | 171.07 (53.0), 119.3, 4.78 | 38.05 (3.78), 172.4, 4.78 |
| Recycle Delay (s)$^g$ | 0.67 | 0.67 | 0.67 | 0.67 | 0.67 | 0.67 |
| Collection Time(h)$^h$ | 6.7 | 9.38 | 12.73 | 11.39 | 9.38 | 14.55 |

TABLE 3-continued

Phase-Sensitively Detected RD NMR Data Sets Recorded for Ubiquitin

| | 3D HC(C-TOCSY-CO)NHN | 3D HCCH-COSY | 3D HCCH-TOCSY | 2D HBCB(CGCD)HD | 2D H-TOCSY-HCH-COSY |
|---|---|---|---|---|---|
| | | | $^1$H Resonance Frequency (MH$_z$) | | |
| | 600 | 600 | 600 | 600 | 600 |
| No. of Points[a] | | | | | |
| collected | 76,28,512 | 90,20,512 | 80,20,512 | 76,512 | 100,512 |
| after LP | | | | 152,512 | 150,512 |
| after zero filling | | | | 512,1024 | 512,1024 |
| window functions[b] | | | | sin 70/90 | sin 70/90 |
| No. of Transients[c] | 2 | 2 | 2 | 32 | 16 |
| Spectral Width[d] ($\omega_1, \omega_2, \omega_3, \omega_4$; Hz) | 12001.2 (RD), 1337, 7018 | 12001.2 (RD), 3125, 7018 | 12001.2 (RD), 3125, 7018 | 12001(RD), 7018 | 10000(RD), 7018 |
| $t_{max}$ (ms)[e] | 6.25, 20.2, 72.8 | 7.42, 6.08, 72.8 | 6.58, 6.08, 72.8 | 6.25, 72.8 | 9.9, 72.8 |
| Carrier Position ($\omega_1, \omega_2, \omega_3, \omega_4$; ppm)[f] | 38.05 (3.78), 119.3, 4.78 | 38.05 (3.78), 38.05, 4.78 | 38.05 (3.78), 38.05, 4.78 | 33.05 (3.78), 4.78 | 120.05 (4.78), 4.78 |
| Recycle Delay (s)[g] | 0.67 | 0.67 | 0.77 | 0.72 | 0.77 |
| Collection Time(h)[h] | 12.73 | 10.77 | 10.99 | 3.91 | 1.37 |

[a]"No. of Points" represents the number of complex data points used to sample indirect dimensions. Before Fourier transformation, the time domain points are extended by linear prediction (LP).
[b]The "Window Function" is a mathematical function multiplied with the FID along each indirect dimension before zero-filling and Fourier transformation.
[c]"No. of Transients" represents the number of FIDs acquired for each real increment.
[d]"Spectral Width" is the frequency range covered in each dimension.
[e]"$t_{max}$" is the maximum chemical shift evolution time.
[f]"Carrier Position" refers to the frequency (in ppm) of the center point of the spectrum along each dimension.
[g]"Recycle Delay" denotes the relaxation delay between acquisitions of FIDs.
[h]"Collection Time" is the total measurement time.

Example 3

HTP Assignment Strategy

The comprehensive analysis of the suite of multidimensional spectra recorded for the present study (Tables 1-3) lays the foundation to devise strategies for RD NMR-based HTP resonance assignment of proteins.

For proteins in the molecular weight range up to about 20 kDa, 3D H$^{\alpha/\beta}$C$^{\alpha/\beta}$(CO)NHN plays a pivotal role. Firstly, the peak patterns observed along $\omega_1(^{13}C^{\alpha/\beta})$ in subspectra I and II enable sequential resonance assignment in combination with HNNCAHA and HNNCACB, respectively, by matching intraresidue and sequential $^1H^\alpha$, $^{13}C^\alpha$ and $^{13}C^\beta$ chemical shifts. (When considering "nuclear spin relaxation time labelling" of peak pairs, subspectrum II derived from $^{13}$C steady state magnetization provides largely redundant information when compared with subspectrum I. However, the observation of the central peaks allows direct matching of peak positions between subspectrum II, essentially a CBCA(CO)NHN spectrum, and HNNCACB.) Moreover, this set of chemical shifts alone provides valuable information for amino acid type identification (Zimmerman et al., *J. Mol. Biol.*, 269:592-610 (1997); Cavanagh et al., *Protein NMR Spectroscopy*, Academic Press, San Diego, (1996); Grzesiek et al., *J. Biomol. NMR*, 3:185-204 (1993), which are hereby incorporated by reference in their entirety). Complementary recording of 3D H$^{\alpha/\beta}$C$^{\alpha/\beta}$COHA and 3D HNN<CO,CA> contributes polypeptide backbone $^{13}$C=O chemical shift measurements for establishing sequential assignments: the intraresidue correlation is obtained by $\omega_1(^{13}C^{\alpha/\beta})$ peak pattern matching with 3D H$^{\alpha/\beta}$C$^{\alpha/\beta}$(CO)NHN, and the sequential correlation is inferred from $^{13}C^\alpha$, $^{15}$N and $^1H^N$ chemical shifts in 3D HNN<CO,CA> (Szyperski et al., *J. Biomol. NMR*, 11:387-405 (1998), which is hereby incorporated by reference in its entirety). Notably, even for medium-sized (non-deuterated) proteins this approach is superior to the use of a low sensitivity HNNCACO-type experiment (e.g., in combination with HNNCOCA), where the magnetization transfer via rapidly relaxing $^{13}C^\alpha$ relies on the rather small $^{15}$N-$^{13}C^\alpha$ one-bond scalar coupling. Secondly, comparison of $\omega_1(^{13}C^{\alpha/\beta})$ peak patterns with 3D HCCH-COSY and TOCSY connects the C$^{\alpha/\beta}$/H$^{\alpha/\beta}$ chemical shifts with those of the aliphatic side chain spin systems (For Z-domain, complete side chain assignments were obtained for all but six residues using 3D HCCH-COSY only.), while comparison of $\omega_1(^{13}C^\beta)$ peaks with 2D HBCB(CDCG)HD and subsequent linking with $^1H^\delta$ chemical shifts detected in 2D $^1$H-TOCSY-relayed HCH-COSY affords assignment of the aromatic spin systems. Since for many amino acid residues the two β-protons exhibit non-degenerate chemical shifts, the connection of H$^{\alpha/\beta}$C$^{\alpha/\beta}$(CO)NHN and HBCB(CDCG)HD or HCCH-COSY/TOCSY may in fact often rely on comparison of three chemical shifts, i.e., δ($^1$H$^{\beta 2}$), δ($^1$H$^{\beta 3}$) and δ($^{13}C^\beta$). This consideration underscores the potential of recruiting β-proton chemical shifts for establishing sequential resonance assignments.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A method for obtaining assignments of chemical shift values of $^1H$, $^{13}C$ and $^{15}N$ of a protein molecule comprising:
providing a $^{15}N/^{13}C$-labeled protein sample; and
conducting four reduced dimensionality (RD) nuclear magnetic resonance (NMR) experiments on the protein sample, wherein the chemical shift values of $^1H$ and $^{13}C$ which are encoded in peak pairs of an NMR spectrum are detected in a phase sensitive manner and (1) a first experiment is selected from the group consisting of a RD three-dimensional (3D) $\underline{H^{\alpha/\beta}C^{\alpha/\beta}}$(CO)NHN NMR experiment, a RD 3D HA,$\overline{CA}$,$(\overline{CO})$,N,HN NMR experiment, and a RD 3D $\underline{H,C,(\overline{C}\text{-TOCSY-CO})}$,N,HN NMR experiment for obtaining sequential correlations of chemical shift values; (2) a second experiment is selected from the group consisting of a RD 3D HNN CAHA NMR experiment, a RD 3D $\underline{H^{\alpha/\beta},C^{\alpha/\beta}}$,N,HN NMR experiment, and a RD 3D HNN$\overline{<CO,CA>}$ NMR experiment for obtaining intraresidue correlations of chemical shift values; (3) a third experiment is a RD 3D $\underline{H,C,C,H}$-COSY NMR experiment for obtaining assignments of sidechain chemical shift values; and (4) a fourth experiment is a RD two-dimensional (2D) HB, CB,(CG,CD),HD NMR experiment for obtaining assignments of aromatic sidechain chemical shift values.

2. The method according to claim 1 further comprising:
subjecting the protein sample to a RD 2D H,C,H-COSY NMR experiment for obtaining assignments of sidechain chemical shift values.

3. The method according to claim 1, wherein the first experiment is the RD 3D $\underline{H^{\alpha/\beta}C^{\alpha/\beta}}$(CO)NHN NMR experiment and the second experiment is the RD 3D HNNCAHA NMR experiment.

4. The method according to claim 3 further comprising:
subjecting the protein sample to a RD 3D HA, CA,(CO),N,HN NMR experiment to distinguish between NMR signals for $^1H^\alpha/^{13}C^\alpha$, and $^1H^\beta/^{13}C^\beta$ from said RD 3D $\underline{H^{\alpha/\beta}C^{\alpha/\beta}}$(CO)NHN NMR experiment.

5. The method according to claim 3 further comprising:
subjecting the protein sample to a RD 3D $\underline{H}$, C,(C-TOCSY-CO),N,HN NMR experiment to obtain assignments of chemical shift values of $^1H^{ali}$ and $^{13}C^{ali}$.

6. The method according to claim 3 further comprising:
subjecting the protein sample to a RD 3D $H^{\alpha/\beta},C^{\alpha/\beta}$,N,HN NMR experiment to obtain assignments of chemical shift values of $^1H^\beta$ and $^{13}C^\beta$.

7. The method according to claim 3 further comprising:
subjecting the protein sample to a RD 3D HNN<CO,CA> NMR experiment to obtain assignments of chemical shift values of polypeptide backbone carbonyl carbons, $^{13}C'$.

8. The method according to claim 3 further comprising:
subjecting the protein sample to a RD 3D $\underline{H^{\alpha/\beta}}$, $C^{\alpha/\beta}$,CO,HA NMR experiment to obtain assignments of chemical shift values of polypeptide backbone carbonyl carbons, $^{13}C'$.

9. The method according to claim 3 further comprising:
subjecting the protein sample to a RD 3D HNN<CO,CA> NMR experiment and a RD 3D $H^{\alpha/\beta},C^{\alpha/\beta}$,CO,$\overline{HA}$ NMR experiment to obtain assignments of chemical shift values of $^{13}C'$.

10. The method according to claim 3 further comprising:
subjecting the protein sample to a RD 3D $\underline{H}$, C,C,H-TOCSY NMR experiment to obtain assignments of chemical shift values of $^1H$ and $^{13}C$ of aliphatic sidechains.

11. The method according to claim 3 further comprising:
subjecting the protein sample to a RD 3D $\underline{H}$, C,C,H-TOCSY NMR experiment to obtain assignments of chemical shift values of $^1H$ and $^{13}C$ of aromatic sidechains.

12. The method according to claim 3 further comprising:
subjecting the protein sample to a 3D HNNCACB NMR experiment to obtain assignments of chemical shift values of $^{13}C^\beta$.

13. The method according to claim 3, wherein the first experiment is the RD 3D $\underline{H,C,(C\text{-TOCSY-CO})}$,N,HN NMR experiment and the second experiment is the RD 3D HNN CAHA NMR experiment.

14. The method according to claim 13 further comprising:
subjecting the protein sample to a RD 3D HA, CA,(CO),N,HN NMR experiment to identify NMR signals for $^1H^\alpha/^{13}C^\alpha$ in said RD 3D $\underline{H}$, C,(C-TOCSY-CO),N,HN NMR experiment.

15. The method according to claim 13 further comprising:
subjecting the protein sample to a RD 3D $H^{\alpha/\beta},C^{\alpha/\beta}$,N,HN NMR experiment to obtain assignments of chemical shift values of $^1H^\beta$ and $^{13}C^\beta$.

16. The method according to claim 13 further comprising:
subjecting the protein sample to a RD 3D HNN<CO, CA>NMR experiment to obtain assignments of chemical shift values of polypeptide backbone carbonyl carbons, $^{13}C'$.

17. The method according to claim 13 further comprising:
subjecting the protein sample to a RD 3D $\underline{H^{\alpha/\beta}}$, $C^{\alpha/\beta}$,CO,HA NMR experiment to obtain assignments of chemical shift values of polypeptide backbone carbonyl carbons, $^{13}C'$.

18. The method according to claim 13 further comprising:
subjecting the protein sample to a RD 3D HNN<CO, CA>NMR experiment and a RD 3D $\underline{H^{\alpha/\beta},C^{\alpha/\beta}}$,CO,$\overline{HA}$ NMR experiment to obtain assignments of chemical shift values of $^{13}C'$.

19. The method according to claim 13 further comprising:
subjecting the protein sample to a RD 3D $\underline{H}$, C,C,H-TOCSY NMR experiment to obtain assignments of chemical shift values of $^1H$ and $^{13}C$ of aliphatic sidechains.

20. The method according to claim 13 further comprising:
subjecting the protein sample to a RD 3D $\underline{H}$, C,C,H-TOCSY NMR experiment to obtain assignments of chemical shift values of $^1H$ and $^{13}C$ of aromatic sidechains.

21. The method according to claim 13 further comprising:
subjecting the protein sample to a 3D HNNCACB NMR experiment to obtain assignments of chemical shift values of $^{13}C^\beta$.

22. The method according to claim 1, wherein the first experiment is the RD 3D H,C,(C-TOCSY-CO),N,HN NMR experiment and the second experiment is the RD 3D $\underline{H^{\alpha/\beta}}$, $C^{\alpha/\beta}$,N,HN NMR experiment.

23. The method according to claim 22 further comprising:
subjecting the protein sample to a RD 3D HA, CA,(CO),N,HN NMR experiment to identify NMR signals for $^1H^\alpha$ and $^{13}C^\alpha$ in said RD 3D $\underline{H}$, C,(C-TOCSY-CO),N,HN NMR experiment.

24. The method according to claim 22 further comprising:
subjecting the protein sample to a RD 3D $\underline{H}^{\alpha/\beta}$, $\underline{C}^{\alpha/\beta}$(CO)NHN NMR experiment to identify NMR signals for $^1H^{\alpha/\beta}$ and $^{13}C^{\alpha/\beta}$ in said RD 3D $\underline{H}$, $\underline{C}$,(C-TOCSY-CO),N,HN NMR experiment.

25. The method according to claim 22 further comprising:
subjecting the protein sample to a RD 3D HNN<$\underline{CO}$, $\underline{CA}$>NMR experiment to obtain assignments of chemical shift values of polypeptide backbone carbonyl carbons, $^{13}C'$.

26. The method according to claim 22 further comprising:
subjecting the protein sample to a RD 3D $\underline{H}^{\alpha/\beta}$, $\underline{C}^{\alpha/\beta}$,CO,HA NMR experiment to obtain assignments of chemical shift values of polypeptide backbone carbonyl carbons, $^{13}C'$.

27. The method according to claim 22 further comprising:
subjecting the protein sample to a RD 3D HNN<$\underline{CO}$, $\underline{CA}$>NMR experiment and a RD 3D $H^{\alpha/\beta}$,$C^{\alpha/\beta}$,CO,$\underline{HA}$ NMR experiment to obtain assignments of chemical shift values of $^{13}C'$.

28. The method according to claim 22 further comprising:
subjecting the protein sample to a RD 3D $\underline{H}$, $\underline{C}$,C,H-TOCSY NMR experiment to obtain assignments of chemical shift values of $^1H$ and $^{13}C$ of aliphatic sidechains.

29. The method according to claim 22 further comprising:
subjecting the protein sample to a RD 3D $\underline{H}$, $\underline{C}$,C,H-TOCSY NMR experiment to obtain assignments of chemical shift values of $^1H$ and $^{13}C$ of aromatic sidechains.

30. The method according to claim 22 further comprising:
subjecting the protein sample to a 3D HNNCACB NMR experiment to obtain assignments of chemical shift values of $^{13}C^{\beta}$.

31. The method according to claim 1, wherein the first experiment is the RD 3$\underline{H}$,$\underline{C}$,(C-TOSY-CO),N,HN NMR experiment and the second experiment is the RD 3D HNN<$\underline{CO}$,$\underline{CA}$,>NMR experiment.

32. The method according to claim 31 further comprising:
subjecting the protein sample to a RD 3D $\underline{HA}$, $\underline{CA}$,(CO),N,HN NMR experiment to identify NMR signals for $^1H^{\alpha}$ in said RD 3D $\underline{H}$,$\underline{C}$,(C-TOCSY-CO),N,HN NMR experiment.

33. The method according to claim 31 further comprising:
subjecting the protein sample to a RD 3D $\underline{H}^{\alpha/\beta}$ $\underline{C}^{\alpha/\beta}$(CO)NHN NMR experiment to identify NMR signals for $^1H^{\alpha/\beta}$ and $^{13}C^{\alpha/\beta}$ in said RD 3D $\underline{H}$, H(C-TOCS$\underline{Y}$-CO),N,HN $\underline{N}$MR experiment.

34. The method according to claim 31 further comprising:
subjecting the protein sample to a RD 3D $\underline{H}^{\alpha/\beta}$, $\underline{C}^{\alpha/\beta}$,CO,HA NMR experiment to obtain assignments of chemical shift values of polypeptide backbone carbonyl carbons, $^{13}C'$.

35. The method according to claim 31, further comprising:
subjecting the protein sample to a RD 3D $\underline{H}$, $\underline{C}$,C,H-TOCSY NMR experiment to obtain assignments of chemical shift values of $^1H$ and $^{13}C$ of aliphatic sidechains.

36. The method according to claim 31 further comprising:
subjecting the protein sample to a RD 3D $\underline{H}$, $\underline{C}$,C,H-TOCSY NMR experiment to obtain assignments of chemical shift values of $^1H$ and $^{13}C$ of aliphatic sidechains.

37. The method according to claim 31 further comprising:
subjecting the protein sample to a RD 3D HNNCACB NMR experiment to obtain assignments of chemical shift values of $^{13}C^{\beta}$.

38. The method according to claim 31 further comprising:
subjecting the protein sample to a nuclear Overhauser effect spectroscopy (NOESY) to deduce the tertiary structure of the protein molecule.

39. The method according to claim 31 further comprising:
subjecting the protein sample to NMR experiments that measure scalar coupling constants to deduce the tertiary structure of the protein molecule.

40. The method according to claim 22 further comprising:
subjecting the protein sample to a 3D HNNCACB NMR experiment to obtain assignments of chemical shift values of $^{13}C^{\beta}$.

* * * * *